(12) United States Patent
Moriyama et al.

(10) Patent No.: US 10,854,627 B1
(45) Date of Patent: Dec. 1, 2020

(54) THREE-DIMENSIONAL MEMORY DEVICE CONTAINING A CAPPED INSULATING SOURCE LINE CORE AND METHOD OF MAKING THE SAME

(71) Applicant: SANDISK TECHNOLOGIES LLC, Addison, TX (US)

(72) Inventors: Takumi Moriyama, Yokkaichi (JP); Satoshi Shimizu, Yokkaichi (JP); Kiyohiko Sakakibara, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 124 days.

(21) Appl. No.: 16/023,035

(22) Filed: Jun. 29, 2018

(51) Int. Cl.
| | |
|---|---|
| H01L 27/11582 | (2017.01) |
| H01L 27/11524 | (2017.01) |
| H01L 21/762 | (2006.01) |
| H01L 27/1157 | (2017.01) |
| H01L 29/06 | (2006.01) |
| H01L 27/11556 | (2017.01) |

(52) U.S. Cl.
CPC .. *H01L 27/11582* (2013.01); *H01L 21/76227* (2013.01); *H01L 27/1157* (2013.01); *H01L 27/11524* (2013.01); *H01L 27/11556* (2013.01); *H01L 29/0649* (2013.01)

(58) Field of Classification Search
None
See application file for complete search history.

(56) References Cited

U.S. PATENT DOCUMENTS

| | | | |
|---|---|---|---|
| 5,915,167 A | 6/1999 | Leedy | |
| 8,338,882 B2 * | 12/2012 | Tanaka | H01L 27/11575 257/324 |
| 9,362,298 B2 * | 6/2016 | Akutsu | H01L 21/76889 |
| 9,799,670 B2 | 10/2017 | Nishikawa et al. | |
| 9,824,966 B1 | 11/2017 | Kanakamedala et al. | |
| 9,831,266 B2 | 11/2017 | Kai et al. | |

(Continued)

OTHER PUBLICATIONS

Endoh et al., "Novel Ultra High Density Memory with a Stacked-Surrounding Gate Transistor (S-SGT) Structured Cell," IEDM Proc. pp. 33-36, (2001).

(Continued)

*Primary Examiner* — Lex H Malsawma
(74) *Attorney, Agent, or Firm* — The Marbury Law Group PLLC

(57) ABSTRACT

In-process source-level material layers including a source-level sacrificial layer are formed over a substrate, and an alternating stack of insulating layers and spacer material layers and memory stack structures are formed over the in-process source-level layers. A backside trench is formed through the alternating stack, and a source cavity is formed by removing the source-level sacrificial layer employing an etchant provided through the backside trench. A source contact layer including a doped semiconductor material is formed on vertical semiconductor channels of the memory stack structures within the source cavity. The source contact layer includes an unfilled cavity, which is subsequently filled with a silicon nitride liner, a silicon oxide fill material and a semiconductor cap. A semiconductor oxide structure can be formed by filling voids in the silicon oxide fill material by oxidizing the semiconductor cap into a thermal semiconductor oxide material portion.

10 Claims, 52 Drawing Sheets

(56) References Cited

U.S. PATENT DOCUMENTS

| | | |
|---|---|---|
| 9,917,100 B2 | 3/2018 | Zhang et al. |
| 9,985,098 B2 | 5/2018 | Matsumoto et al. |
| 2012/0068253 A1* | 3/2012 | Oota ................. H01L 27/11578 |
| | | 257/324 |
| 2013/0009235 A1* | 1/2013 | Yoo ................... H01L 21/76237 |
| | | 257/329 |
| 2013/0126957 A1* | 5/2013 | Higashitani ....... H01L 27/11565 |
| | | 257/314 |
| 2017/0148800 A1 | 5/2017 | Nishikawa et al. |
| 2017/0373080 A1* | 12/2017 | Akutsu ................ H02K 7/1823 |
| 2018/0122905 A1 | 5/2018 | Ogawa et al. |
| 2018/0122906 A1 | 5/2018 | Yu et al. |
| 2018/0130814 A1* | 5/2018 | Lee ................... H01L 27/11568 |

OTHER PUBLICATIONS

U.S. Appl. No. 15/626,444, filed Jun. 19, 2017, SanDisk Technologies LLC.

U.S. Appl. No. 15/633,131, filed Jun. 26, 2017, SanDisk Technologies LLC.

U.S. Appl. No. 15/997,194, filed Jun. 4, 2018, SanDisk Technologies LLC.

* cited by examiner

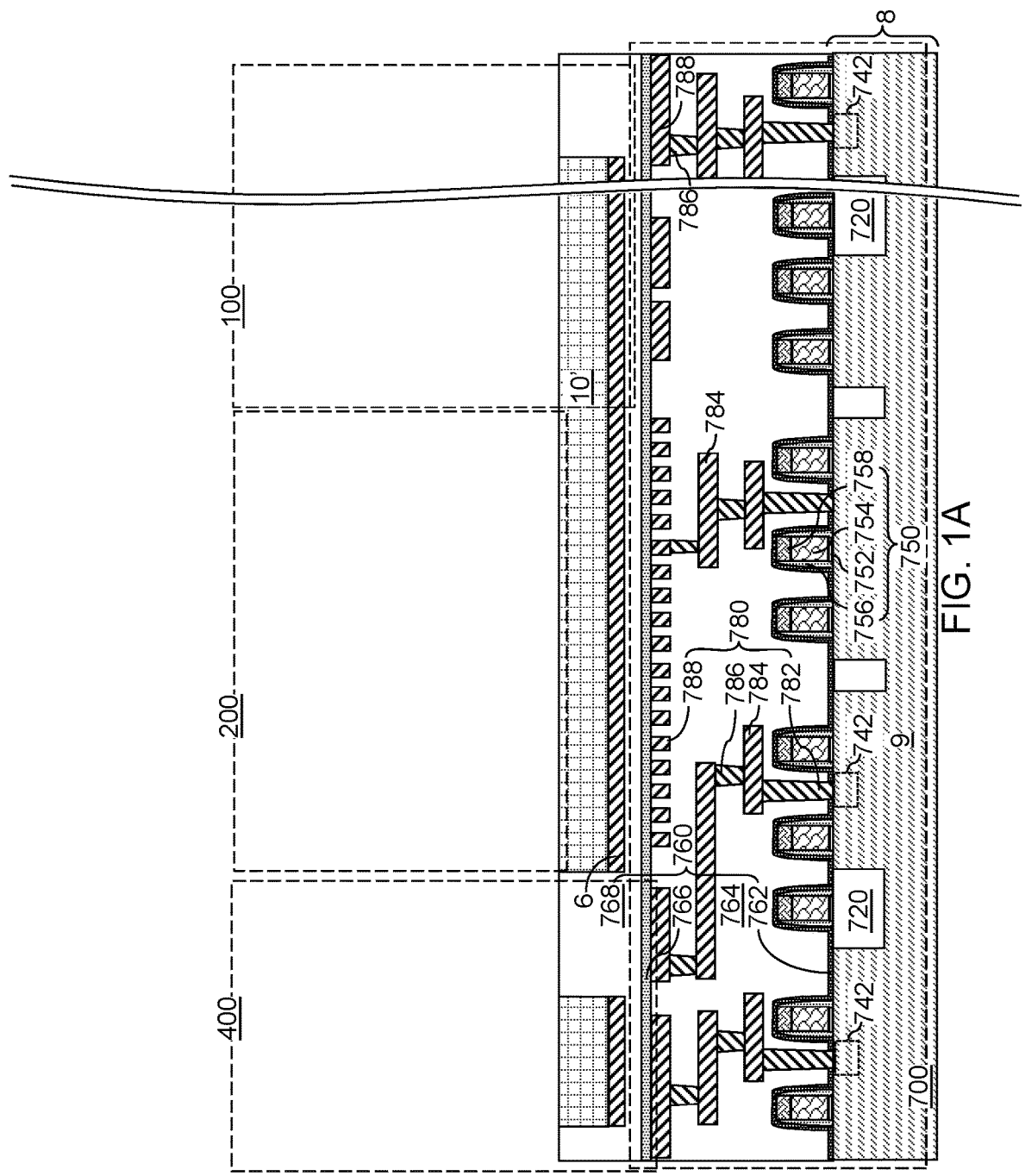

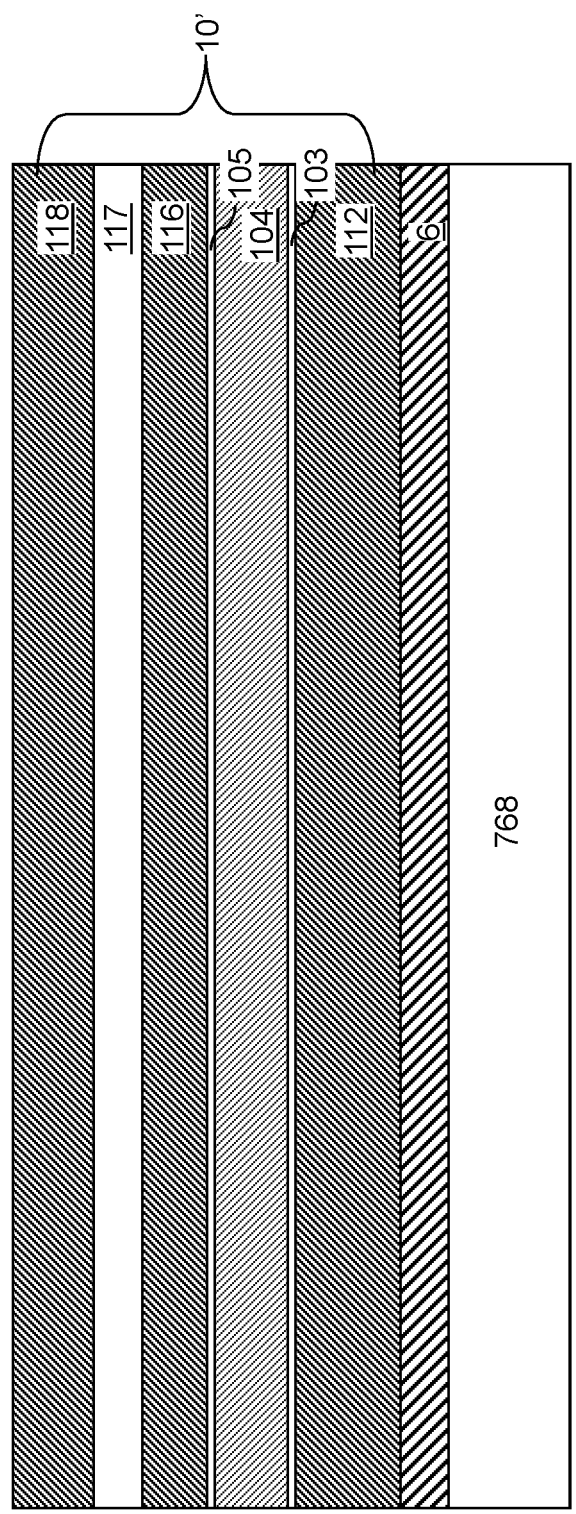

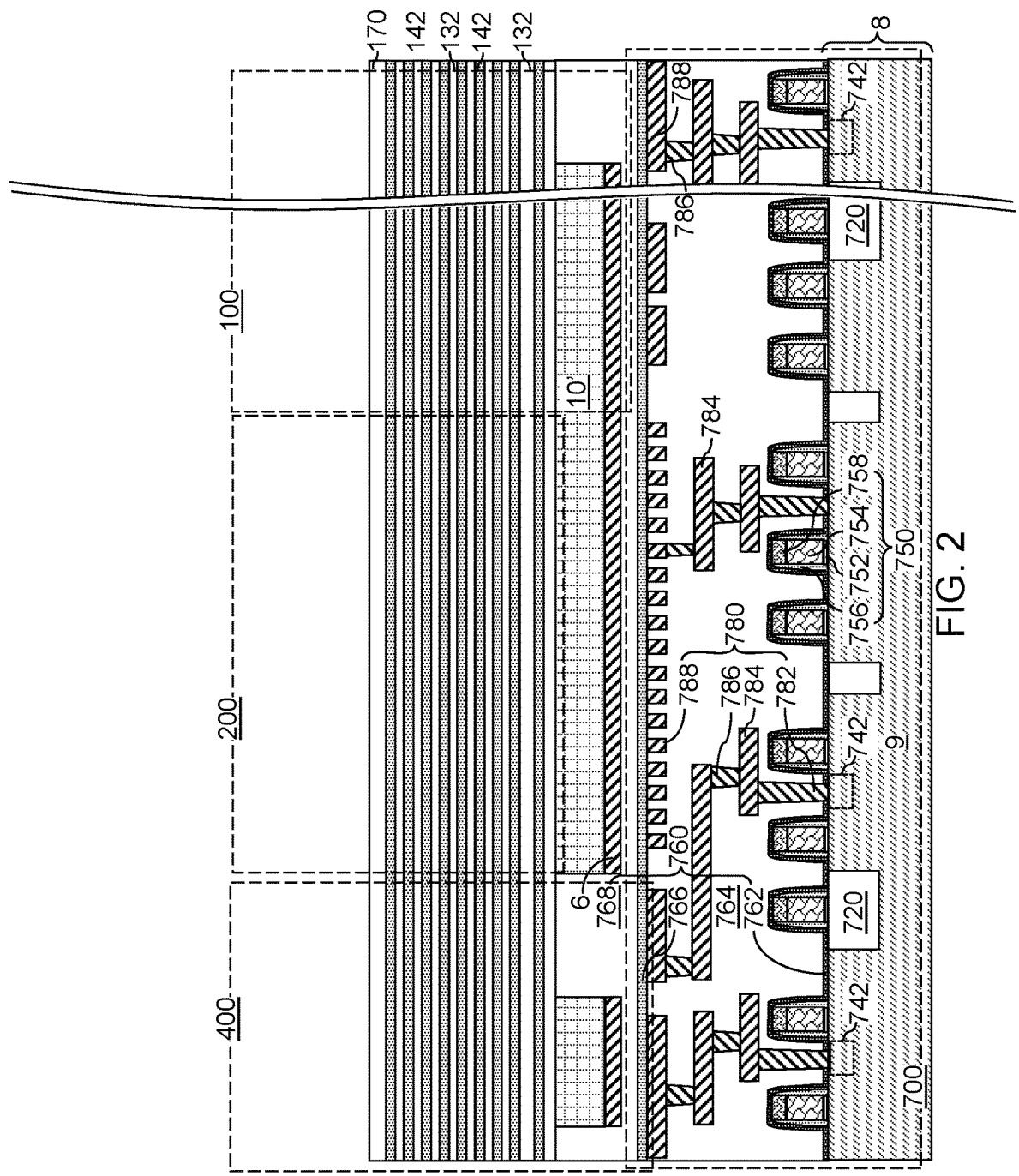

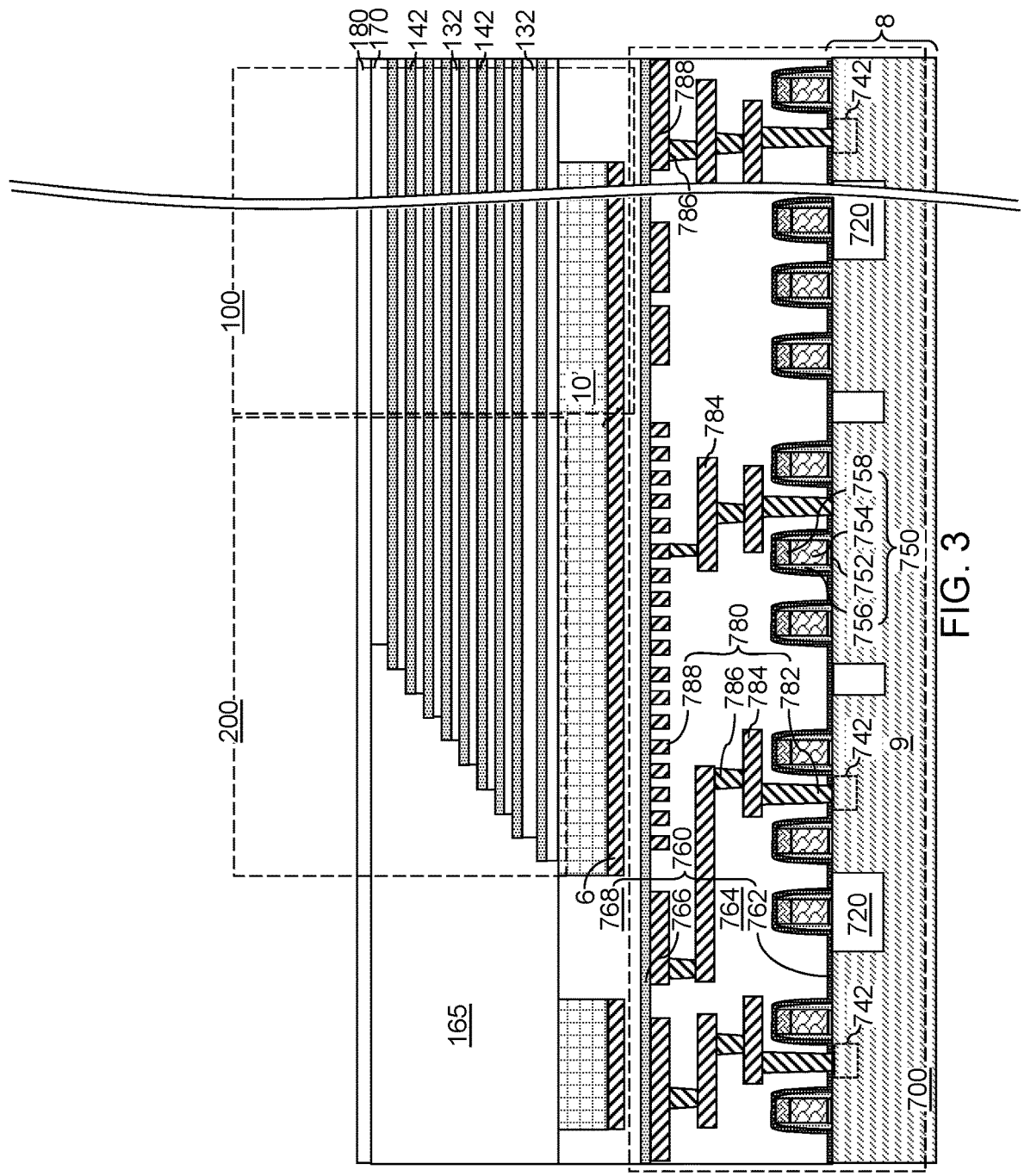

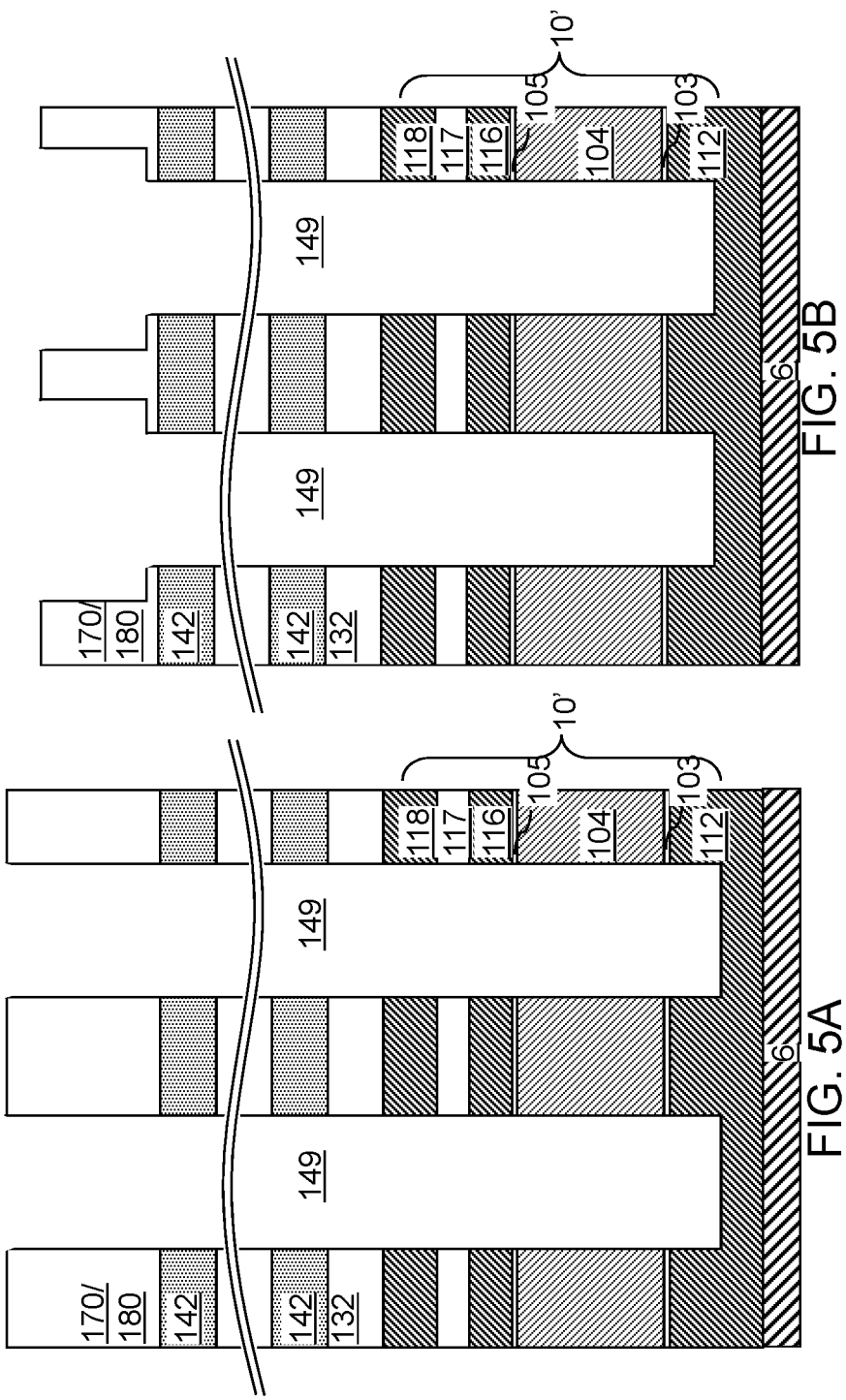

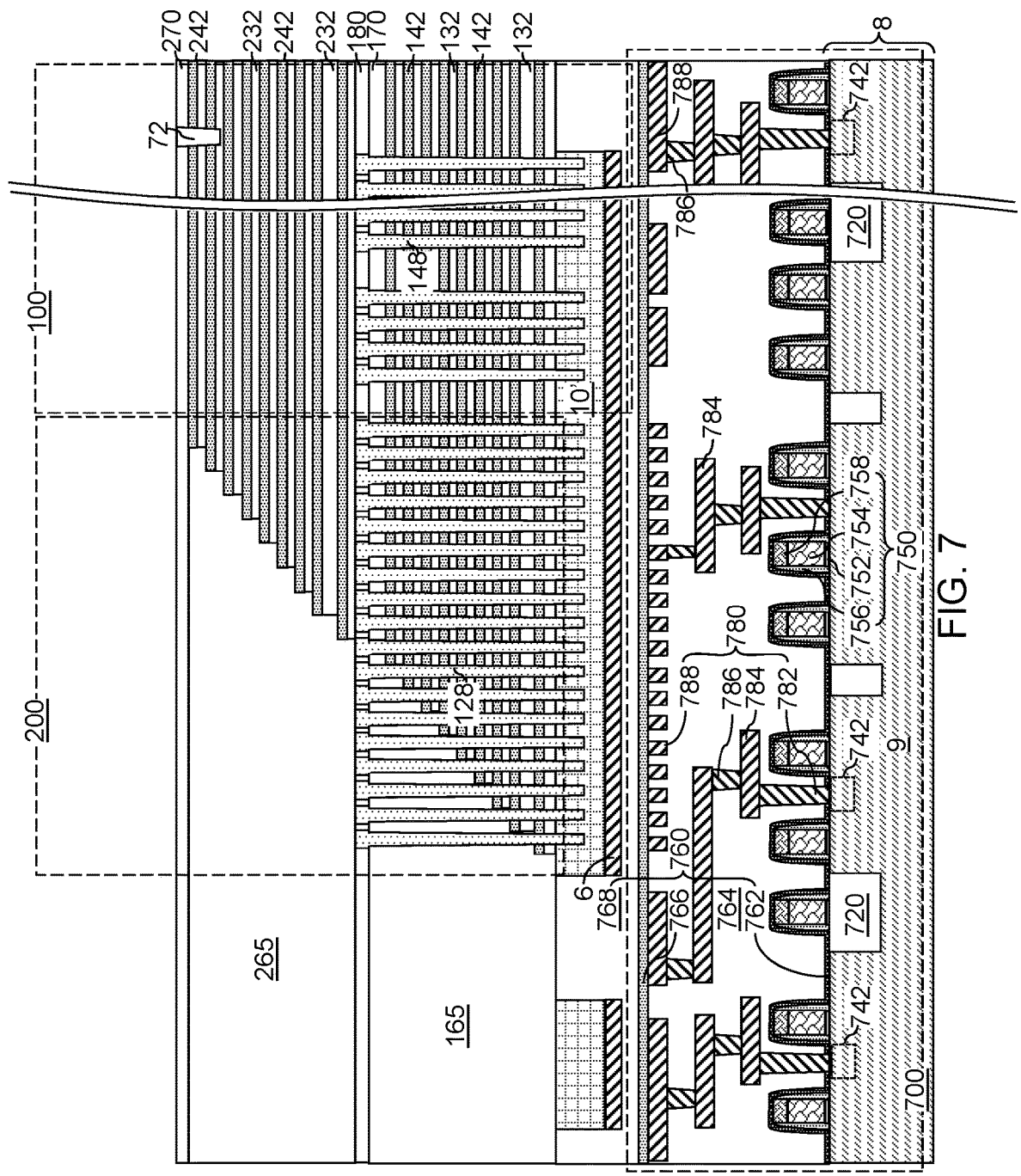

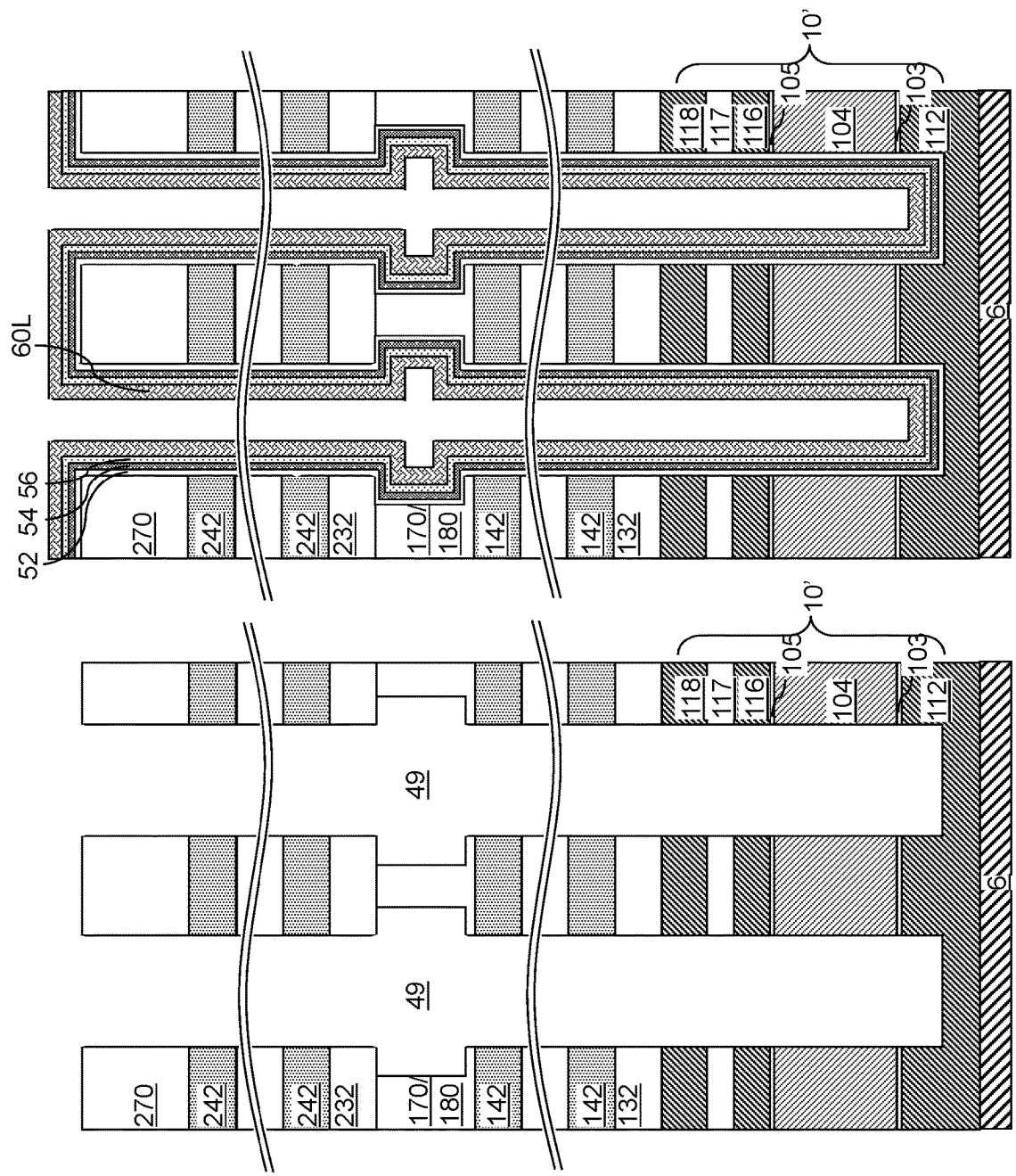

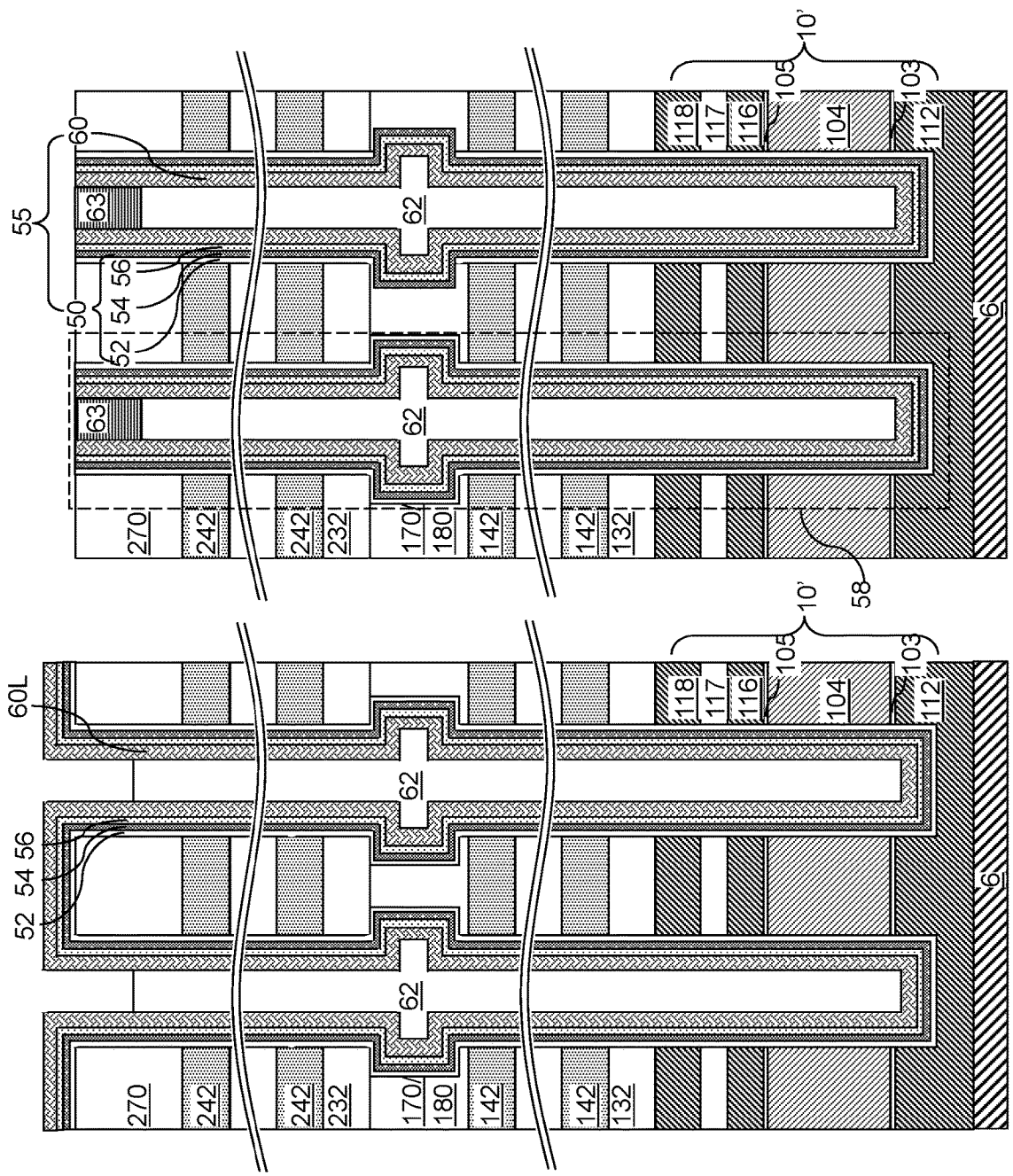

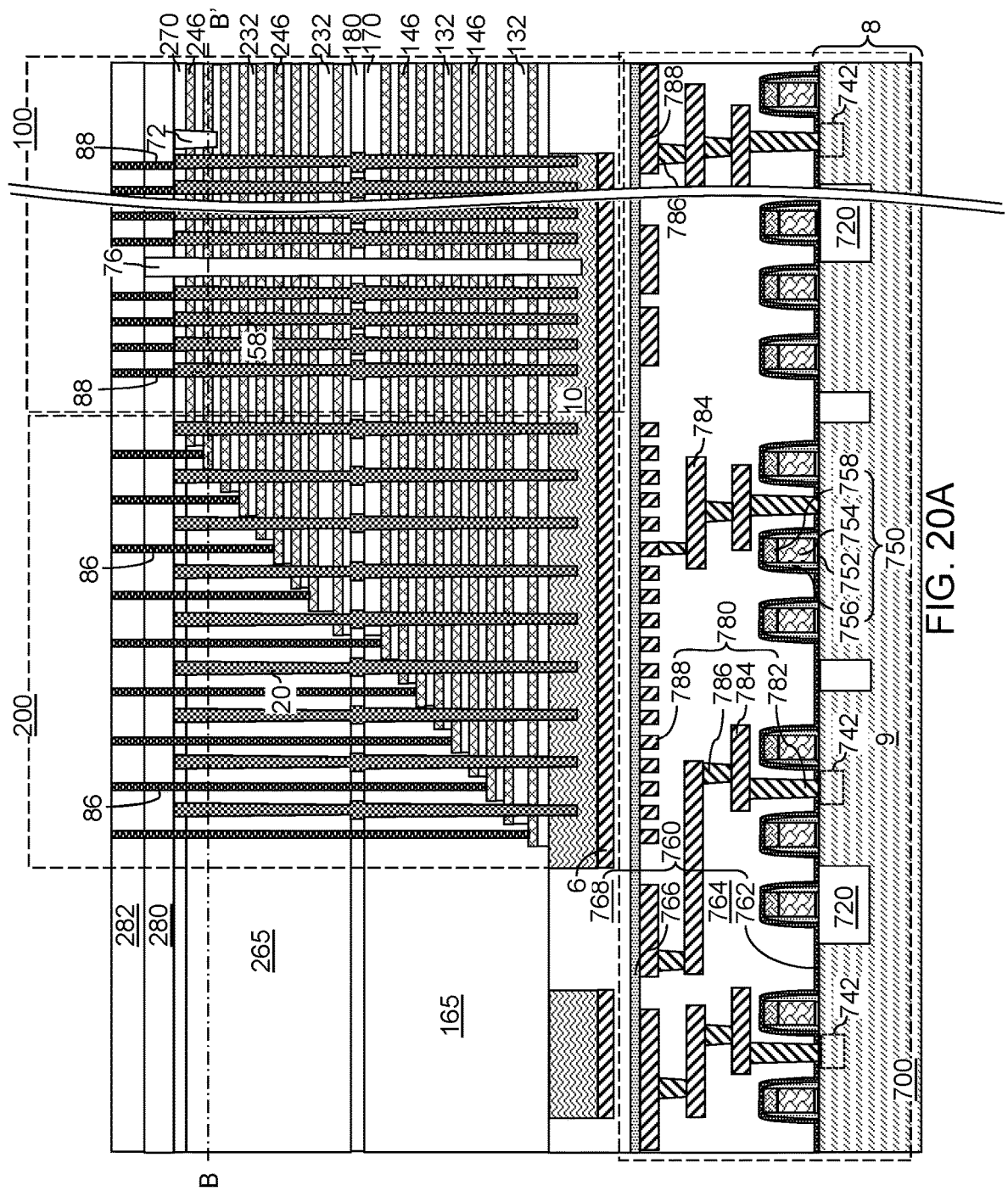

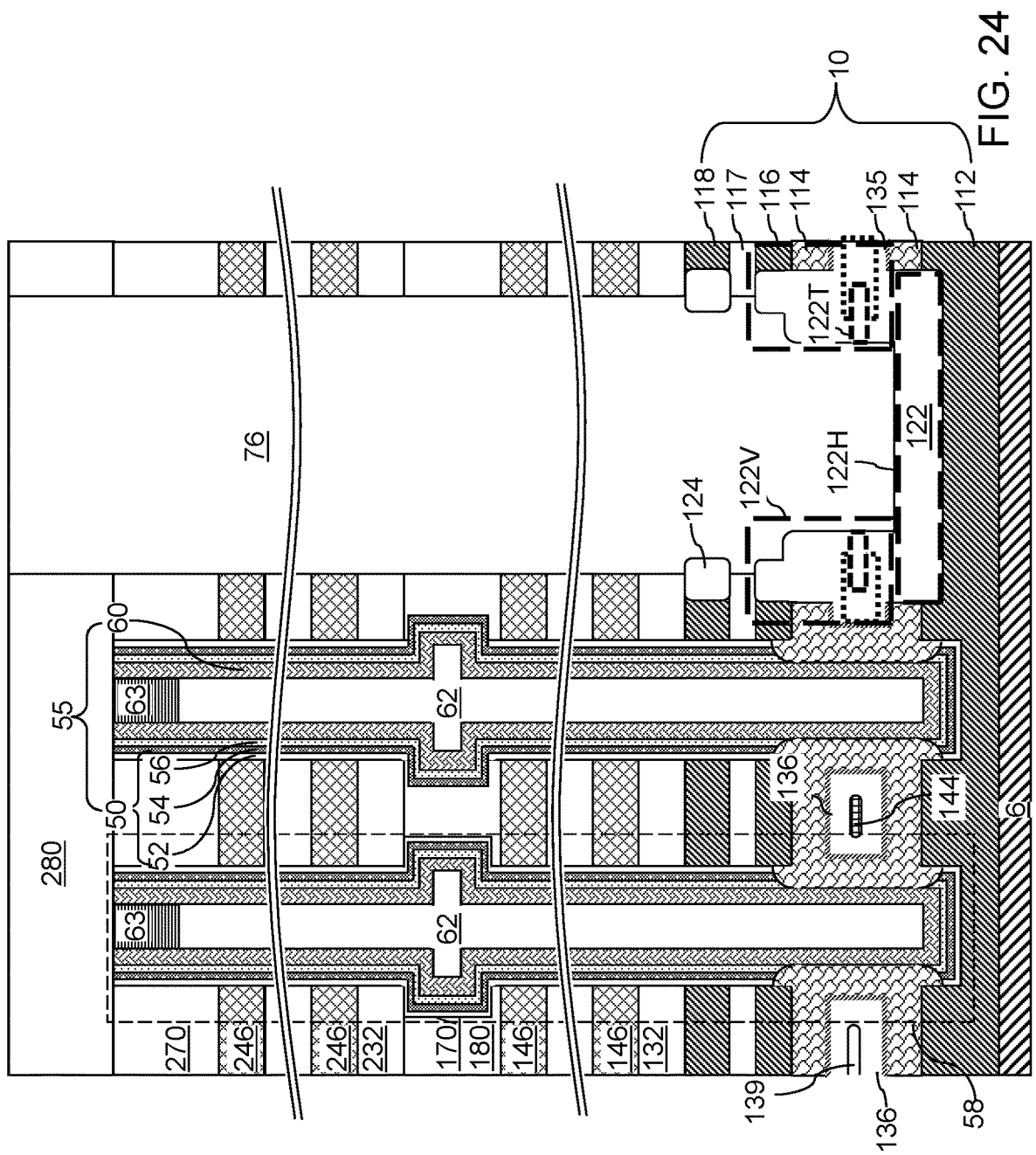

THREE-DIMENSIONAL MEMORY DEVICE CONTAINING A CAPPED INSULATING SOURCE LINE CORE AND METHOD OF MAKING THE SAME

FIELD

The present disclosure relates generally to the field of semiconductor devices, and particular to a three-dimensional memory device including a capped semiconductor oxide source line core and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: source-level material layers located over a substrate and comprising a source contact layer including a doped semiconductor material; an alternating stack of insulating layers and electrically conductive layers located over the source-level material layers; and a memory stack structure extending through the alternating stack and comprising a memory film and a vertical semiconductor channel, wherein a sidewall of the vertical semiconductor channel contacts a respective surface of the source contact layer, and the source contact layer includes at least one cavity that is filled at least partly with an insulating core.

According to another aspect of the present disclosure, a method of forming a three-dimensional memory device is provided, which comprises: forming in-process source-level material layers comprising a source-level sacrificial layer over a substrate; forming an alternating stack of insulating layers and spacer material layers over the in-process source-level material layers; forming a memory stack structure through the alternating stack and partly through the in-process source-level material layers, wherein the memory stack structure comprises a memory film and a vertical semiconductor channel; forming a backside trench through the alternating stack and into the in-process source level material layer; removing the source-level sacrificial layer and portions of the memory film located at a level of the source-level sacrificial layer by introducing an etchant through the backside trench, whereby a source cavity is formed; depositing a doped semiconductor material layer in the source cavity on a sidewall of the vertical semiconductor channel, wherein an unfilled cavity is present within the doped semiconductor material layer; and forming a silicon nitride liner, a silicon oxide fill material and a semiconductor cap in the unfilled cavity over the doped semiconductor material layer.

BRIEF DESCRIPTION OF THE DRAWINGS

FIG. 1A is a vertical cross-sectional view of an exemplary structure after formation of semiconductor devices, lower level dielectric layers, lower metal interconnect structures, and in-process source-level material layers on a semiconductor substrate according to the first embodiment of the present disclosure.

FIG. 1C is a magnified view of the in-process source-level material layers along the vertical plane C-C' of FIG. 1B.

FIG. 2 is a vertical cross-sectional view of the first exemplary structure after formation of a first-tier alternating stack of first insulating layers and first spacer material layers according to the first embodiment of the present disclosure.

FIG. 3 is a vertical cross-sectional view of the first exemplary structure after patterning a first-tier staircase region, a first retro-stepped dielectric material portion, and an inter-tier dielectric layer according to the first embodiment of the present disclosure.

FIGS. 5A and 5B illustrate sequential vertical cross-sectional views of first-tier memory openings during expansion of upper regions of the first-tier memory openings according to the first embodiment of the present disclosure.

FIG. 7 is a vertical cross-sectional view of the first exemplary structure after formation of a second-tier alternating stack of second insulating layers and second spacer material layers, second stepped surfaces, a second retro-stepped dielectric material portion, and drain-select-level isolation structures according to the first embodiment of the present disclosure.

FIGS. 10A-10D are sequential vertical cross-sectional views of a pair of inter-tier memory openings during formation of a pair of memory opening fill structures according to the first embodiment of the present disclosure.

FIG. 20A is a vertical cross-sectional view of the first exemplary structure after formation of drain contact via structures and staircase-region contact via structures according to the first embodiment of the present disclosure.

FIG. 24 is a vertical cross-sectional view of a region of the second exemplary structure at the processing steps corresponding to the processing steps of FIGS. 18A-18D according to the second embodiment of the present disclosure.

DETAILED DESCRIPTION

Figure 1B:
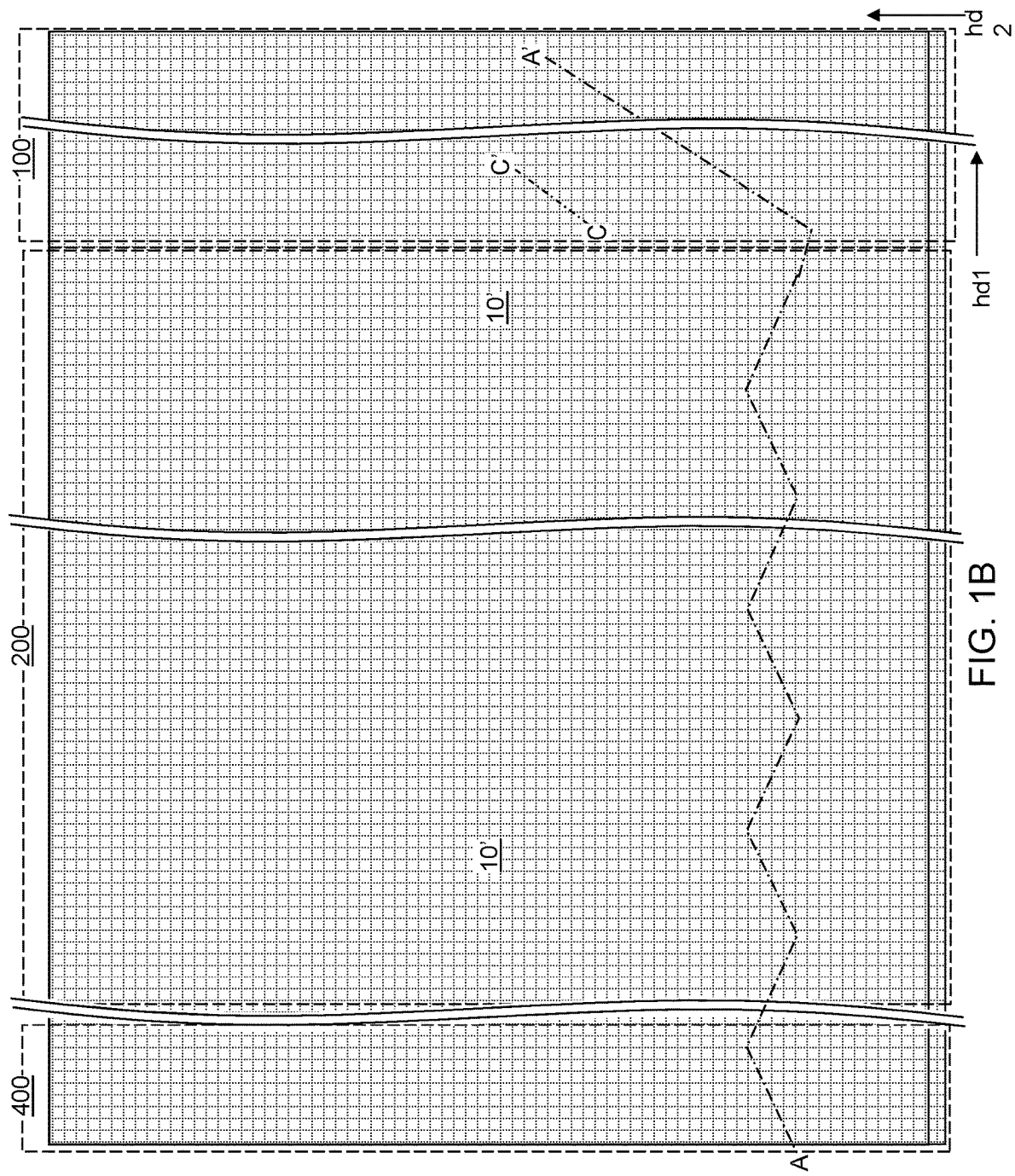
FIG. 1B is a top-down view of the first exemplary structure of FIG. 1A. The zig-zag vertical plane A-A' is the plane of the vertical cross-sectional view of FIG. 1A.

Buried source lines can be used to provide a source-side contact to vertical semiconductor channels. However, migration of a semiconductor material in the buried source lines during thermal cycling can adversely impact device performance. Embodiments of the present disclosure provide three-dimensional memory device including a capped insulating source line core and methods of manufacturing the same, the various aspects of which are described below. The capped insulating core of the buried source line decreases or eliminates semiconductor material migration in the buried source line. The embodiments of the disclosure can be employed to form various structures including a multilevel memory structure, non-limiting examples of which include semiconductor devices, such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array.

In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIGS. 1A-1C, a first exemplary structure according to a first embodiment of the present disclosure is illustrated. FIG. 1C is a magnified view of an in-process source-level material layers 10' illustrated in FIGS. 1A and 1B. The first exemplary structure includes a semiconductor substrate 8 and a complementary metal oxide semiconductor (CMOS) circuitry 700 formed thereupon. The first exemplary structure includes a memory array region 100 in which a three-dimensional memory array is to be subsequently formed, a staircase region 200 in which stepped surfaces of electrically conductive layers and contact via structures are to be subsequently formed, and a peripheral region 400 in which peripheral contact via structures are to be subsequently formed.

The semiconductor substrate 8 includes a substrate semiconductor layer 9 at least at an upper portion thereof. Various doped wells can be formed in upper portions of the substrate semiconductor layer 9. Shallow trench isolation structures 720 can be formed in an upper portion of the substrate semiconductor layer 9 to provide electrical isolation among the semiconductor devices. The CMOS circuitry 700 includes field effect transistors including respective transistor active regions 742 (i.e., source regions and drain regions), channel regions 746, and gate structures 750. The field effect transistors may be arranged in a CMOS configuration. Each gate structure 750 can include, for example, a gate dielectric 752, a gate electrode 754, a dielectric gate spacer 756 and a gate cap dielectric 758.

The CMOS circuitry 700 can include additional semiconductor devices in addition to p-type field effect transistors and n-type field effect transistors, which can be employed to support operation of a memory structure to be subsequently formed. The CMOS circuitry 700 includes a driver circuitry, which is also referred to as a peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 can include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring among the various nodes of the semiconductor devices and landing pads for through-memory-level contact via structures to be subsequently formed. The lower-level metal interconnect structures 780 are embedded within the dielectric layer stack of the lower-level dielectric material layers 760, and comprise a lower-level metal line structure located under and optionally contacting a bottom surface of the silicon nitride layer 766.

For example, the lower-level metal interconnect structures 780 can be embedded within the first dielectric material layers 764. The first dielectric material layers 764 may be a plurality of dielectric material layers in which various elements of the lower-level metal interconnect structures 780 are sequentially embedded. Each dielectric material layer among the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 can comprise, or consist essentially of, dielectric material layers having dielectric constants that do not exceed the dielectric constant of undoped silicate glass (silicon oxide) of 3.9. The lower-level metal interconnect structures 780 can include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 can be formed within a topmost dielectric material layer of the first dielectric material layers 764 (which can be a plurality of dielectric material layers). The landing-pad-level metal line structures 788 can be employed as landing pads for metal via structures to be subsequently formed thereabove. Each of the lower-level metal interconnect structures 780 can include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 can be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer among the at least one second dielectric material layer 768 may include any of doped silicate glass, undoped silicate glass, and organosilicate glass. In one embodiment, the at least one first second material layer 768 can comprise, or consist essentially of, dielectric material layers having dielectric constants that do not exceed the dielectric constant of undoped silicate glass (silicon oxide) of 3.9.

The CMOS circuitry 700 can include peripheral devices for the memory-level assembly to be subsequently formed. The lower-level metal interconnect structures 780 are embedded in the lower-level dielectric layers 760. The combination of the lower-level dielectric layers 760 and the lower-level metal interconnect structures 780 overlie the CMOS circuitry 700.

The lower-level metal interconnect structures 780 can be electrically connected to active nodes (e.g., transistor active regions 742 or gate electrodes 754) of the CMOS circuitry 700 (e.g., CMOS devices), and are located at the level of the lower-level dielectric layers 760. Through-memory-level contact via structures can be subsequently formed directly on the lower-level metal interconnect structures 780 to provide electrical connection to memory devices to be subsequently formed. In one embodiment, the pattern of the lower-level metal interconnect structures 780 can be selected such that the landing-pad-level metal line structures 788 (which are a subset of the lower-level metal interconnect structures 780 located at the topmost portion of the lower-level metal interconnect structures 780) can provide landing pad structures for the through-memory-level contact via structures to be subsequently formed.

A conductive plate layer 6 and in-process source-level material layers 10' are formed over the at least one second dielectric layer. The conductive plate layer 6 can include a metallic compound material such as a conductive metallic nitride (e.g., TiN), a metal alloy (e.g., tungsten silicide) and/or a metal (e.g., W). The conductive plate layer 6 provides a high conductivity conduction path for electrical current that flows into, or out of, the in-process source-level material layers 10'. The conductive plate layer 6 may include, for example, a tungsten or tungsten silicide layer having a thickness in a range from 3 nm to 100 nm, although lesser and greater thicknesses can also be employed. The conductive plate layer 6 may function as a component of a source layer in the completed device. In addition, the conductive plate layer 6 may function as an etch stop layer. The thickness of the conductive plate layer 6 may be in a range from 5 nm to 100 nm, although lesser and greater thicknesses can also be employed.

The in-process source-level material layers 10' can include components layers that are subsequently modified to form source-level material layers. The source-level material layers, upon formation, include a source contact layer that functions as a common source region for vertical field effect transistors of a three-dimensional memory device. In one embodiment, the in-process source-level material layer 10' can include, from bottom to top, a lower source-level material layer 112, a lower sacrificial liner 103, a source-level sacrificial layer 104, an upper sacrificial liner 105, an upper source-level material layer 116, a source-level insulating layer 117, and an optional source-select-level conductive layer 118.

The lower source-level material layer 112 and the upper source-level material layer 116 can include a doped semiconductor material such as doped polysilicon or doped amorphous silicon. The conductivity type of the lower source-level material layer 112 and the upper source-level material layer 116 can be the opposite of the conductivity of vertical semiconductor channels to be subsequently formed. For example, if the vertical semiconductor channels to be subsequently formed have a doping of a first conductivity type, the lower source-level material layer 112 and the upper source-level material layer 116 have a doping of a second conductivity type that is the opposite of the first conductivity type. The thickness of each of the lower source-level material layer 112 and the upper source-level material layer 116 can be in a range from 10 nm to 300 nm, such as from 20 nm to 150 nm, although lesser and greater thicknesses can also be employed.

The source-level sacrificial layer 104 includes a sacrificial material that can be removed selective to the lower sacrificial liner 103 and the upper sacrificial liner 105. In one embodiment, the source-level sacrificial layer 104 can include a semiconductor material such as undoped amorphous silicon or a silicon-germanium alloy with an atomic concentration of germanium greater than 20%. The thickness of the source-level sacrificial layer 104 can be in a range from 30 nm to 400 nm, such as from 60 nm to 200 nm, although lesser and greater thicknesses can also be employed.

The lower sacrificial liner 103 and the upper sacrificial liner 105 include materials that can function as an etch stop material during removal of the source-level sacrificial layer 104. For example, the lower sacrificial liner 103 and the upper sacrificial liner 105 can include silicon oxide, silicon nitride, and/or a dielectric metal oxide. In one embodiment, each of the lower sacrificial liner 103 and the upper sacrificial liner 105 can include a silicon oxide layer having a thickness in a range from 2 nm to 30 nm, although lesser and greater thicknesses can also be employed.

The source-level insulating layer 117 includes a dielectric material such as silicon oxide. The thickness of the source-level insulating layer 117 can be in a range from 20 nm to 400 nm, such as from 40 nm to 200 nm, although lesser and greater thicknesses can also be employed. The optional source-select-level conductive layer 118 can include a conductive material that can be employed as a source-select-level gate electrode. For example, the optional source-select-level conductive layer 118 can include a doped semiconductor material such as doped polysilicon or doped amorphous silicon that can be subsequently converted into doped polysilicon by an anneal process. The thickness of the optional source-level conductive layer 118 can be in a range from 30 nm to 200 nm, such as from 60 nm to 100 nm, although lesser and greater thicknesses can also be employed.

The in-process source-level material layers 10' include a source-level sacrificial layer 104. The source-level sacrificial layer 104 is formed above, and is vertically spaced from, the top surface of the conductive plate layer 6. Further, the in-process source-level material layers 10' comprise a lower source-level material layer 112 underlying the source-level sacrificial layer 104. The in-process lower source-level material layers 10' can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The conductive plate layer 6 and the lower in-process source-level material layers 10' can be patterned, for example, by application and patterning of a photoresist layer over the in-process source-level material layers 10' and by an anisotropic etch process that etches unmasked portions of the conductive plate layer 6 and the lower in-process source-level material layers 10'. Remaining portions of the conductive plate layer 6 and the lower in-process source-level material layers 10' can be present in the memory array region 100, the staircase region 200, and optionally within areas of the peripheral region 400. A dielectric material can be deposited between patterned portions of the conductive plate layer 6 and the lower in-process source-level material layers 10', and can be incorporated into the at least one second dielectric layer 768.

Referring to FIG. 2, an alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack can include first insulating layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described employing embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the in-process source-level material layers. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first-tier alternating stack (132, 142) can have a uniform thickness that is substantially invariant within each respective first sacrificial material layer 142.

A first insulating cap layer 170 is subsequently formed over the stack (132, 142). The first insulating cap layer 170 includes a dielectric material, which can be any dielectric material that can be employed for the first insulating layers 132. In one embodiment, the first insulating cap layer 170 includes the same dielectric material as the first insulating layers 132. The thickness of the insulating cap layer 170 can be in a range from 20 nm to 300 nm, although lesser and greater thicknesses can also be employed.

Referring to FIG. 3, the first insulating cap layer 170 and the first-tier alternating stack (132, 142) can be patterned to form first stepped surfaces in the staircase region 200. The staircase region 200 can include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 can be physically exposed at the first stepped surfaces. The cavity overlying the first stepped surfaces is herein referred to as a first stepped cavity.

A dielectric fill material (such as undoped silicate glass or doped silicate glass) can be deposited to fill the first stepped cavity. Excess portions of the dielectric fill material can be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 can include a doped silicate glass having a greater etch rate than the material of the first insulating layers 132 (which can include an undoped silicate glass). For example, the inter-tier dielectric layer 180 can include phosphosilicate glass. The thickness of the inter-tier dielectric layer 180 can be in a range from 30 nm to 300 nm, although lesser and greater thicknesses can also be employed.

Figure 4A:
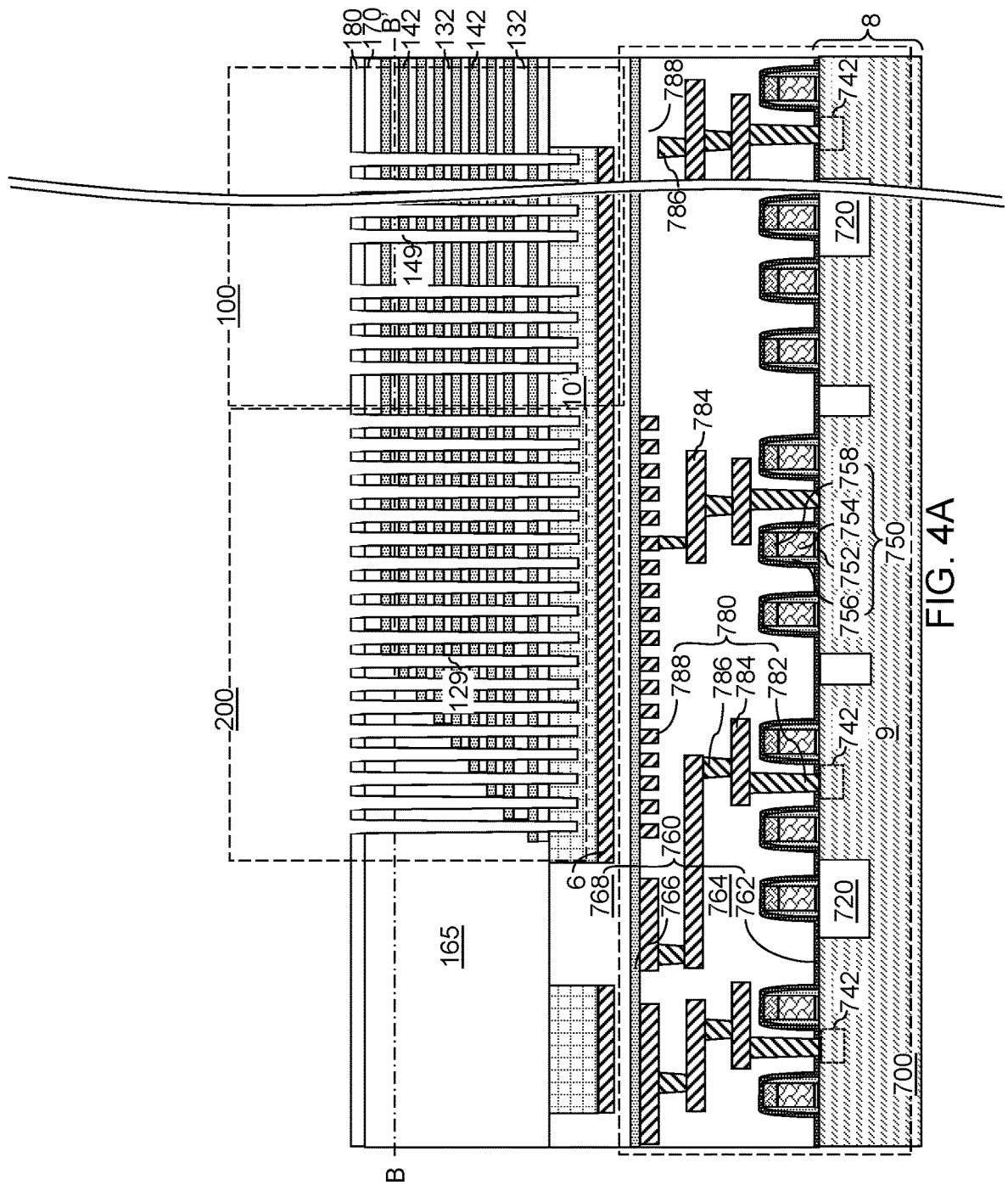
FIG. 4A is a vertical cross-sectional view of the first exemplary structure after formation of first-tier memory openings and first-tier support openings according to the first embodiment of the present disclosure.
Figure 4B:
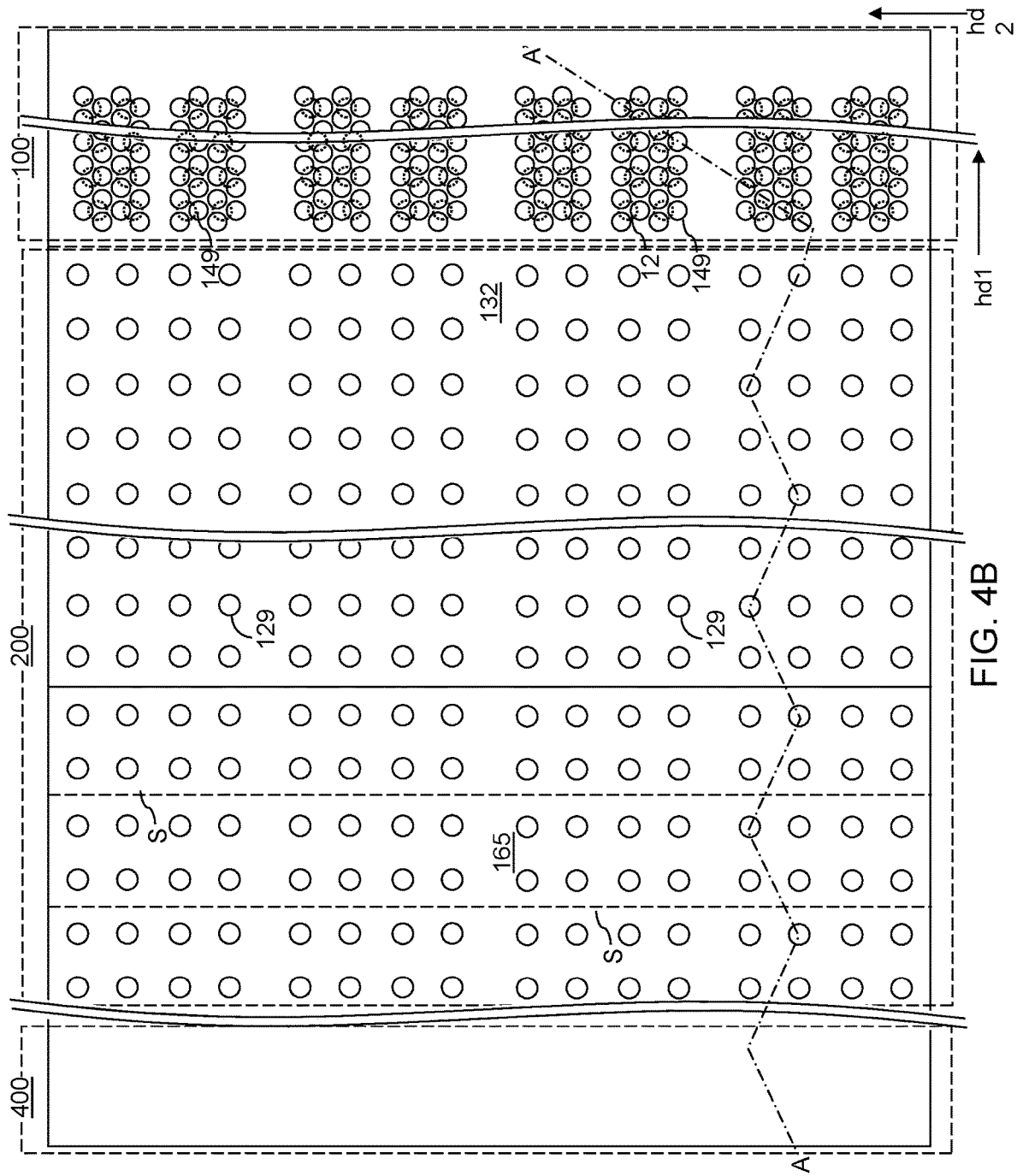
FIG. 4B is a top-down view of the first exemplary structure of FIG. 4A. The zig-zag vertical plane A-A' corresponds to the plane of the vertical cross-sectional view of FIG. 4A.

Referring to FIGS. 4A, 4B, and 5A, first-tier openings (149, 129) can be formed through the inter-tier dielectric layer 180 and the first-tier structure (132, 142, 170, 165) and partly through the in-process source-level material layers 10'. For example, a photoresist layer (not shown) can be applied over the inter-tier dielectric layer 180, and can be lithographically patterned to form various openings therethrough. The pattern of openings in the photoresist layer can be transferred through the inter-tier dielectric layer 180 and the first-tier structure (132, 142, 170, 165) and partly through the in-process source-level material layers 10' by a first anisotropic etch process to form the first-tier openings (149, 129) concurrently, i.e., during the first anisotropic etch process.

The first-tier openings (149, 129) can include first-tier memory openings 149 and first-tier support openings 129. The first-tier memory openings 149 are openings that are formed in the memory array region 100 through each layer within the first alternating stack (132, 142) and are subsequently employed to form memory stack structures therein. The bottom surfaces of the first-tier openings (149, 129) can be a recessed surface of the source-level sacrificial layer 104. Thus, each first-tier opening (149, 129) can have a bottom surface between a horizontal plane including the bottom surface of the source-level sacrificial layer 104 and a horizontal plane including the top surface of the source-level sacrificial layer 104.

The first-tier support openings 129 are openings that are formed in the staircase region 200 and are subsequently employed to form support structures that are subsequently employed to provide structural support to the second exemplary structure during replacement of sacrificial material layers with electrically conductive layers. In case the first spacer materials are formed as first electrically conductive layers, the first-tier support openings 129 can be omitted. A subset of the first-tier support openings 129 can be formed through horizontal surfaces of the first stepped surfaces of the first alternating stack (132, 142).

In one embodiment, the first-tier memory openings 149 can be formed as clusters that are laterally spaced among one another along the second horizontal direction hd2. Each cluster of first-tier memory openings 149 can include a respective two-dimensional array of first-tier memory openings 149 having a first pitch along one horizontal direction and a second pitch along another horizontal direction. In one embodiment, the direction of the first memory structure pitch can be the first horizontal direction (e.g., word line direction) hd1 and the direction of the second memory structure pitch can be the second horizontal direction (e.g., bit line direction) hd2, or vice versa.

The inter-tier dielectric layer 180 can comprise a dielectric material (such as borosilicate glass) having a greater etch rate than the first insulating layers 132 (that can include undoped silicate glass). In one embodiment, the bottom surface of each first-tier memory opening 149 can be formed between the top surface and the bottom surface of the source-level sacrificial layer 104. In this case, surfaces of the source-level sacrificial layer 104 can be exposed at a bottom portion of each first-tier memory opening 149.

Referring to FIG. 5B, an isotropic etch (such as a wet etch employing HF) can be employed to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 6:
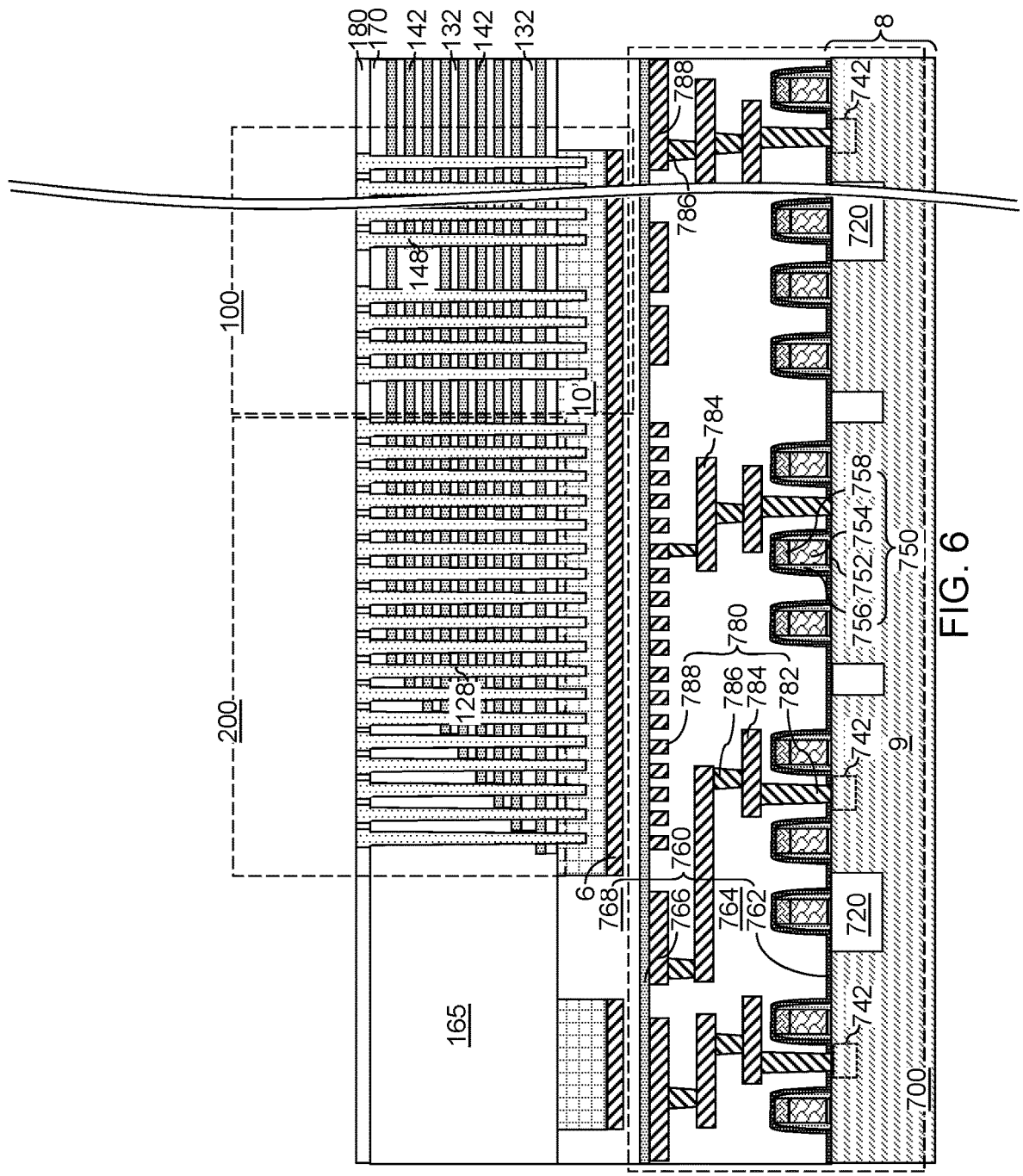
FIG. 6 is a vertical cross-sectional view of the first exemplary structure after formation of sacrificial memory opening fill portions and first-tier support opening fill portions according to the first embodiment of the present disclosure.

Referring to FIG. 6, sacrificial first-tier opening fill portions (148, 128) can be formed in the first-tier openings (149, 129). For example, a sacrificial fill material is deposited concurrently deposited in each of the first-tier openings (149, 129). The sacrificial fill material includes a material that can be subsequently removed selective to the materials of the first insulating layers 132 and the first sacrificial material layers 142.

In one embodiment, the sacrificial fill material can include a semiconductor material such as silicon (e.g., a-Si or polysilicon), a silicon-germanium alloy, germanium, a III-V compound semiconductor material, or a combination thereof. Optionally, a thin etch stop layer (such as a silicon oxide layer or a silicon nitride layer having a thickness in a range from 1 nm to 3 nm) may be employed prior to depositing the sacrificial first-tier fill material. The sacrificial fill material may be formed by a non-conformal deposition or a conformal deposition method.

In another embodiment, the sacrificial fill material can include a silicon oxide material having a higher etch rate than the materials of the first insulating layers 132, the first insulating cap layer 170, and the inter-tier insulating layer 180. For example, the sacrificial fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop layer (such as a silicon nitride layer having a thickness in a range from 1 nm to 3 nm) may be employed prior to depositing the sacrificial first-tier fill material. The sacrificial fill material may be formed by a non-conformal deposition or a conformal deposition method.

In yet another embodiment, the sacrificial fill material can include a carbon-containing material (such as amorphous carbon or diamond-like carbon) that can be subsequently removed by ashing, or a silicon-based polymer that can be subsequently removed selective to the materials of the first alternating stack (132, 142).

Portions of the deposited sacrificial fill material can be removed from above the topmost layer of the first-tier alternating stack (132, 142), such as from above the inter-tier dielectric layer 180. For example, the sacrificial fill material can be recessed to a top surface of the inter-tier dielectric layer 180 employing a planarization process. The planarization process can include a recess etch, chemical mechanical planarization (CMP), or a combination thereof. The top surface of the inter-tier dielectric layer 180 can be employed as an etch stop layer or a planarization stop layer.

Remaining portions of the sacrificial fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The top surfaces of the sacrificial first-tier opening fill portions (148, 128) can be coplanar with the top surface of the inter-tier dielectric layer 180. Each of the sacrificial first-tier opening fill portions (148, 128) may, or may not, include cavities therein.

Referring to FIG. 7, a second-tier structure can be formed over the first-tier structure (132, 142, 170, 165, 148, 128). The second-tier structure can include an additional alternating stack of insulating layers and spacer material layers, which can be sacrificial material layers. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

Second stepped surfaces can be formed in the second stepped area of the staircase region 200 employing a same set of processing steps as the processing steps employed to form the first stepped surfaces in the first stepped area with suitable adjustment to the pattern of at least one masking layer. A second retro-stepped dielectric material portion 265 can be formed over the second stepped surfaces in the staircase region 200.

A second insulating cap layer 270 can be subsequently formed over the second alternating stack (232, 242) and the second retro-stepped dielectric material portion 265. The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Optionally, drain-select-level isolation structures 72 can be formed through the second insulating cap layer 270 and through a subset of layers in an upper portion of the second-tier alternating stack (232, 242). The second sacrificial material layers 242 that are cut by the select-drain-level shallow trench isolation structures 72 correspond to the levels in which drain-select-level electrically conductive layers are subsequently formed. The drain-select-level isolation structures 72 include a dielectric material such as silicon oxide. The drain-select-level isolation structures 72 can laterally extend along a first horizontal direction hd1, and can be laterally spaced apart along a second horizontal direction hd2 that is perpendicular to the first horizontal direction hd1.

Generally speaking, at least one alternating stack of insulating layers (132, 232) and spacer material layers (such as sacrificial material layers (142, 242)) can be formed over the in-process source-level material layers 10', and at least one retro-stepped dielectric material portion (165, 265) can be formed over the staircase regions on the at least one alternating stack (132, 142, 232, 242).

Figure 8A:
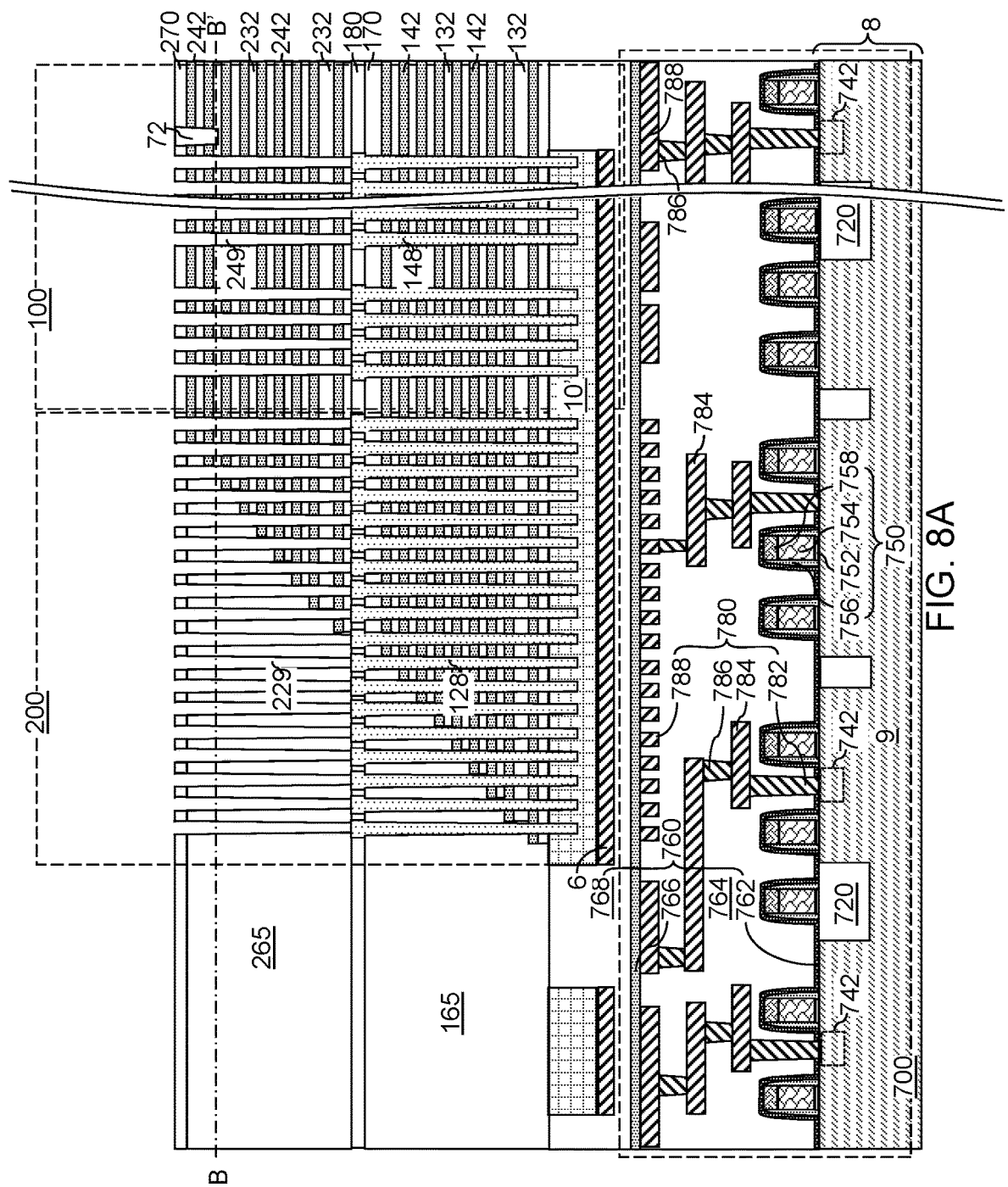
FIG. 8A is a vertical cross-sectional view of the first exemplary structure after formation of second-tier memory openings and second-tier support openings according to the first embodiment of the present disclosure.
Figure 8B:
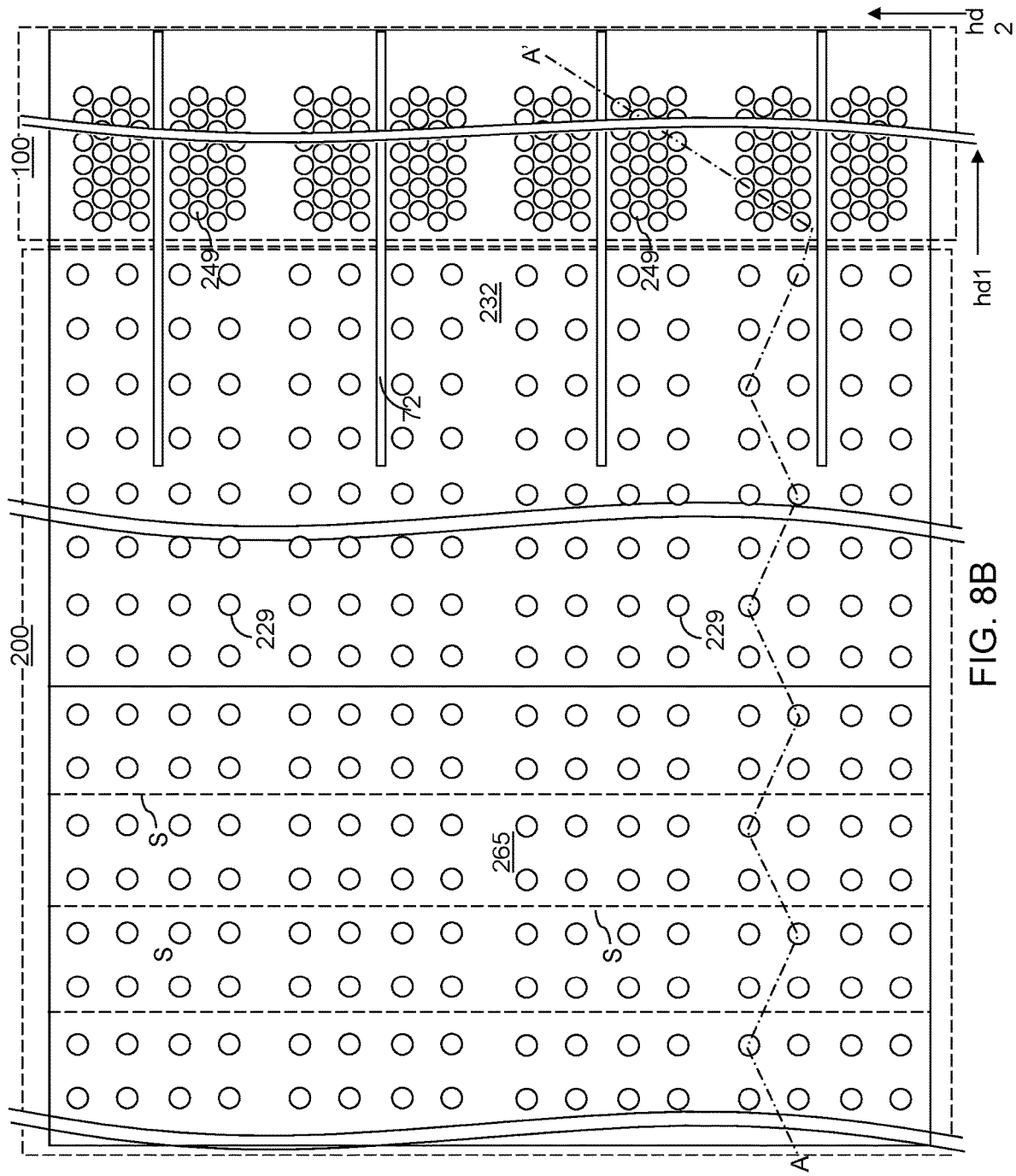
FIG. 8B is a horizontal cross-sectional of the first exemplary structure along the horizontal plane B-B' of FIG. 8A. The zig-zag vertical plane A-A' corresponds to the plane of the vertical cross-sectional view of FIG. 8A.

Referring to FIGS. 8A and 8B, second-tier openings (249, 229) can be formed through the second-tier structure (232, 242, 265, 270, 72). A photoresist layer (not shown) can be applied over the second insulating cap layer 270, and can be lithographically patterned to form various openings therethrough. The pattern of the openings can be the same as the pattern of the various first-tier openings (149, 129), which is the same as the sacrificial first-tier opening fill portions (148, 128). Thus, the lithographic mask employed to pattern the first-tier openings (149, 129) can be employed to pattern the photoresist layer.

The pattern of openings in the photoresist layer can be transferred through the second-tier structure (232, 242, 265, 270, 72) by a second anisotropic etch process to form second-tier openings (249, 229) concurrently, i.e., during the second anisotropic etch process. The second-tier openings (249, 229) can include second-tier memory openings 249 and second-tier support openings.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Locations of steps S in the first-tier alternating stack (132, 142) and the second-tier alternating stack (232, 242) are illustrated as dotted lines in FIG. 8B.

Figure 9:
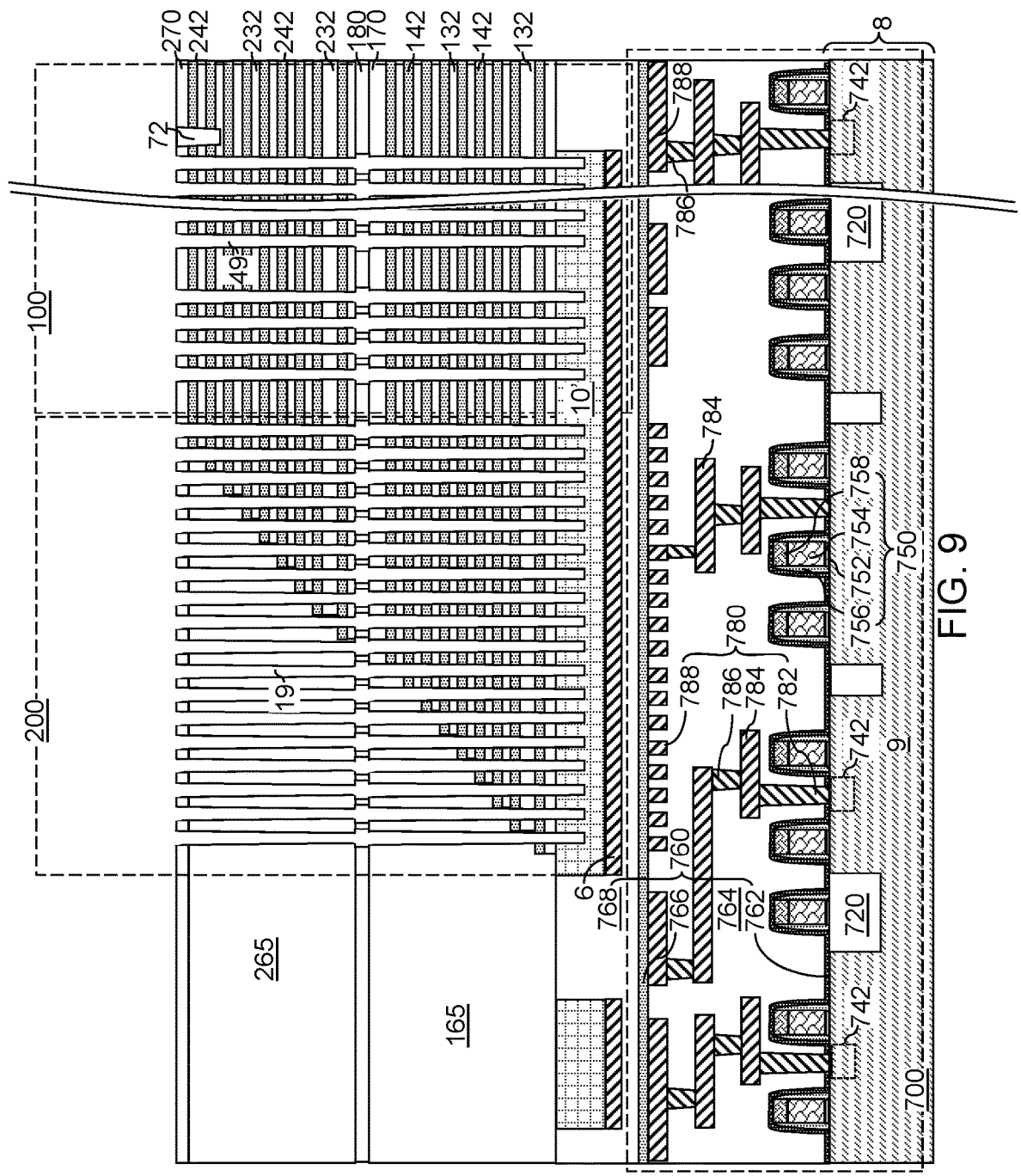
FIG. 9 is a vertical cross-sectional view of the first exemplary structure after formation of inter-tier memory openings and inter-tier support openings according to the first embodiment of the present disclosure.

Referring to FIG. 9, the sacrificial fill material can be removed from underneath the second-tier memory openings 249 and the second-tier support openings 229 employing an etch process that etches the sacrificial fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, is formed in each volume from which a sacrificial first-tier memory opening fill portion 148 is removed. A support opening 19, which is also referred to as an inter-tier support opening 19, is formed in each volume from which a sacrificial first-tier support opening fill portion 128 is removed.

FIGS. 10A-10D provide sequential cross-sectional views of a memory opening 49 during formation of a memory opening fill structure 58 or a support pillar structure 20. The same structural change occurs in each memory openings 49.

Referring to FIG. 10A, a memory opening 49 in the first exemplary device structure of FIG. 9 is illustrated. The memory opening 49 extends through the first-tier structure and the second-tier structure.

Referring to FIG. 10B, a stack of layers including a blocking dielectric layer 52, a charge storage layer 54, a tunneling dielectric layer 56, and a semiconductor channel material layer 60L can be sequentially deposited in the memory openings 49. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 can include a dielectric semiconductor compound such as silicon oxide, silicon oxynitride, silicon nitride, or a combination thereof.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer. As used herein, a first surface and a second surface are "vertically coincident" if there exists the second surface that overlies or underlies the first surface and if there exists a vertical plane that intersects both the first surface and the second surface. Alternatively, the sacrificial material layers (142, 242) can be laterally recessed with respect to the sidewalls of the insulating layers (132, 232), and a combination of a deposition process and an anisotropic etch process can be employed to form the charge storage layer 54 as a plurality of memory material portions that are vertically spaced apart. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed. The stack of the blocking dielectric layer 52, the charge storage layer 54, and the tunneling dielectric layer 56 constitutes a memory film 50 that stores memory bits.

The semiconductor channel material layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L includes amorphous silicon or polysilicon. The semiconductor channel material layer 60L can be formed by a conformal deposition method such as low pressure chemical vapor deposition (LPCVD). The thickness of the semiconductor channel material layer 60L can be in a range from 2 nm to 10 nm, although lesser and greater thicknesses can also be employed. A cavity 49' is formed in the volume of each memory opening 49 that is not filled with the deposited material layers (52, 54, 56, 60L).

Referring to FIG. 10C, in case the cavity 49' in each memory opening is not completely filled by the semiconductor channel material layer 60L, a dielectric core layer can be deposited in the cavity 49' to fill any remaining portion of the cavity 49' within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. The horizontal portion of the dielectric core layer overlying the second insulating cap layer 270 can be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 10D, a doped semiconductor material can be deposited in cavities overlying the dielectric cores 62. The doped semiconductor material has a doping of the opposite conductivity type of the doping of the semiconductor channel material layer 60L. Thus, the doped semiconductor material has a doping of the second conductivity type. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 can be removed by a planarization process such as a chemical mechanical planarization (CMP) process.

Each remaining portion of the doped semiconductor material having a doping of the second conductivity type constitutes a drain region 63. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon.

Each remaining portion of the semiconductor channel material layer 60L constitutes a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements comprise portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 10', the first-tier structure (132, 142, 170, 165), the second-tier structure (232, 242, 270, 265, 72), the inter-tier dielectric layer 180, and the memory opening fill structures 58 collectively constitute a memory-level assembly.

Figure 11:
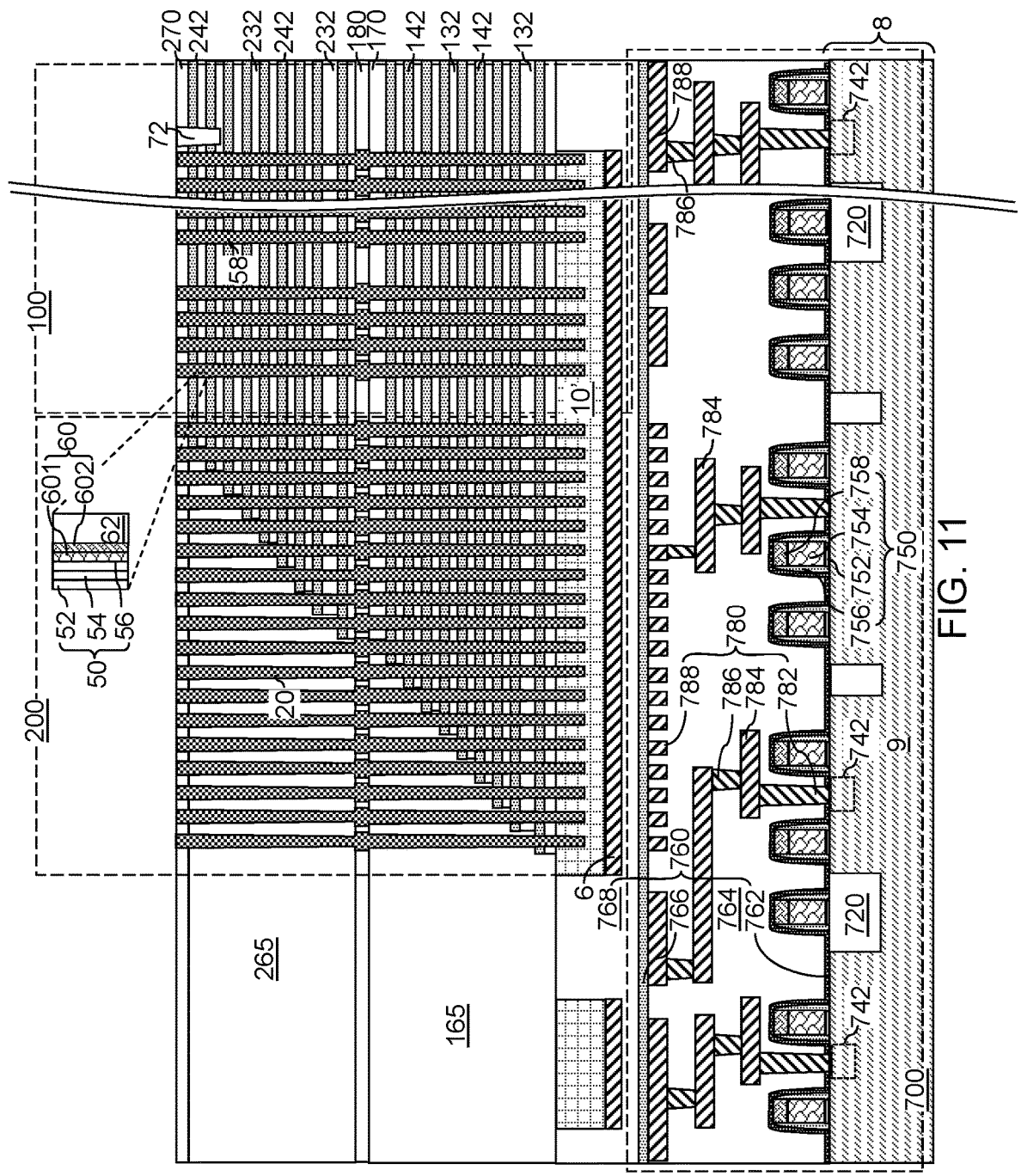
FIG. 11 is a vertical cross-sectional view of the first exemplary structure after formation of memory opening fill structures and support pillar structures according to the first embodiment of the present disclosure.

Referring to FIG. 11, the first exemplary structure is shown after formation of memory opening fill structures 58 in the memory openings 49 and support pillar structures 20 in the support openings 19. Each of the support openings 19 is filled with a respective support pillar structure 20 concurrently with formation of the memory opening fill structures 58. Each support pillar structure 20 can have the same structural elements as a memory opening fill structure 58. Each support pillar structure 20 is a dummy structure, i.e., an electrically inactive structure, and as such, is not subsequently contacted by any contact via structure.

Figure 12A:
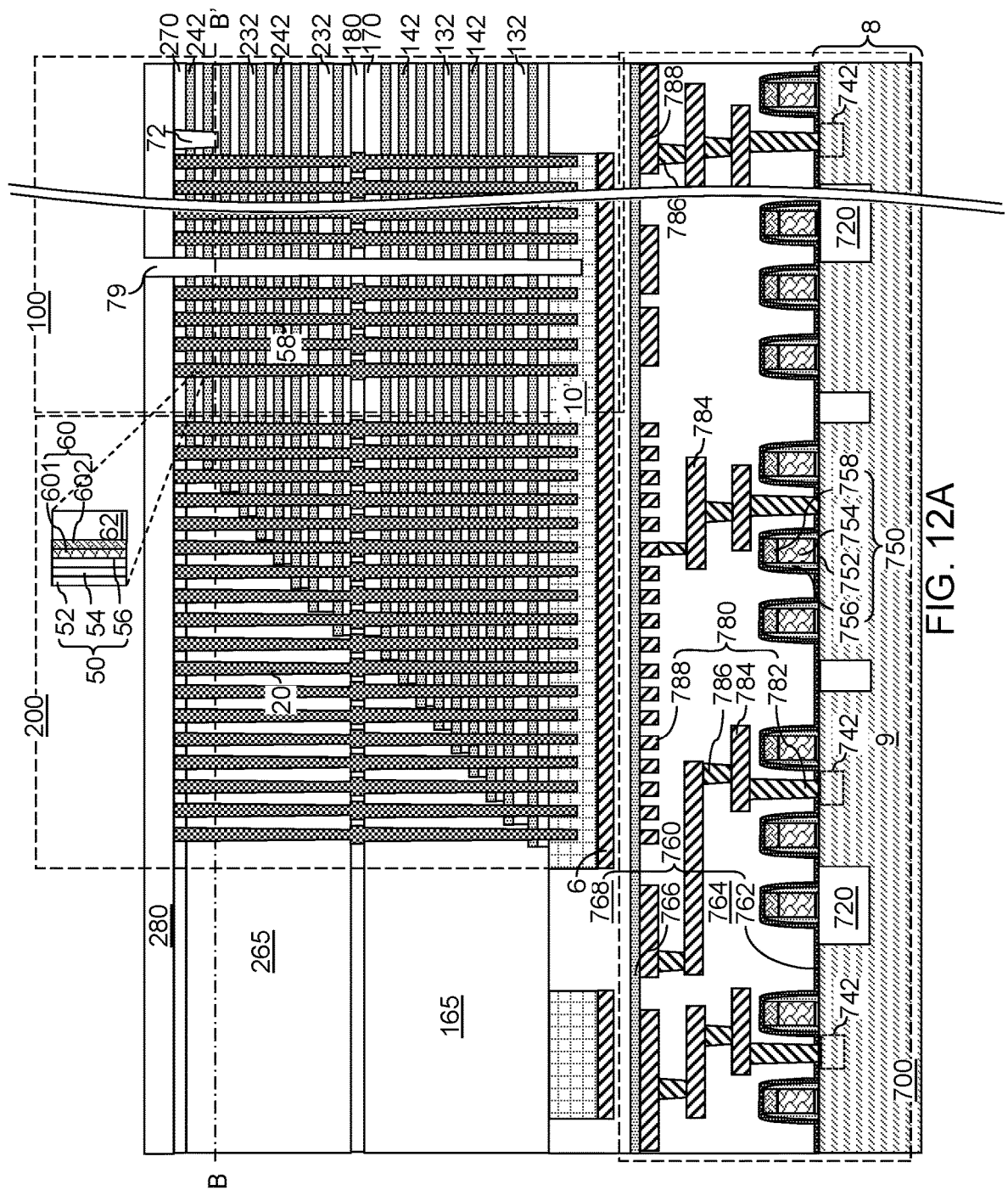
FIG. 12A is a vertical cross-sectional view of the first exemplary structure after formation of backside trenches according to the first embodiment of the present disclosure.
Figure 12B:
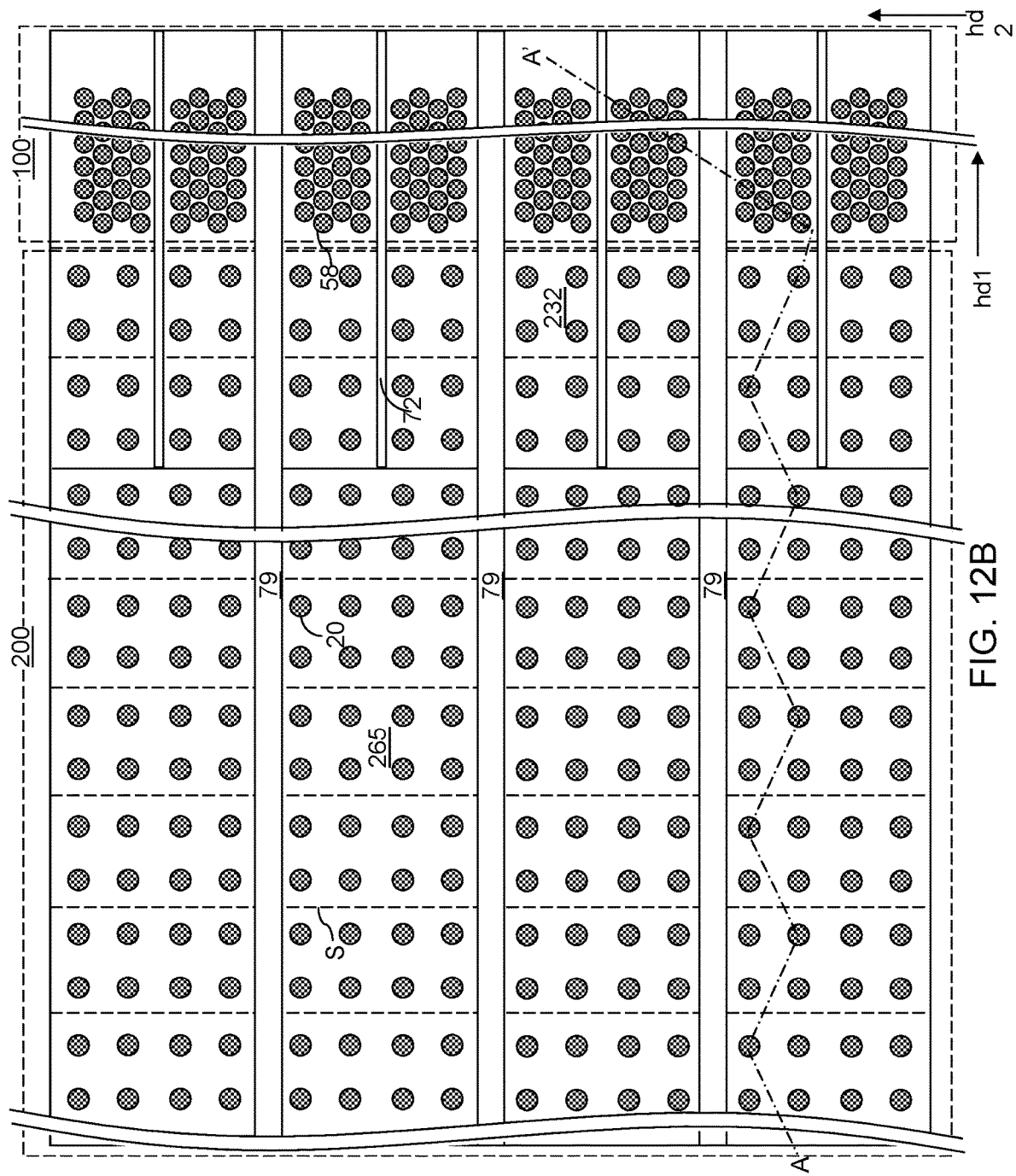
FIG. 12B is a top-down view of the first exemplary structure of FIG. 12A. The zig-zag vertical plane A-A' corresponds to the plane of the vertical cross-sectional view of FIG. 12A.

Referring to FIGS. 12A and 12B, a first contact level dielectric layer 280 can be formed over the second-tier structure (232, 242, 270, 265, 72). The first contact level dielectric layer 280 includes a dielectric material such as silicon oxide, and can be formed by a conformal or non-conformal deposition process. For example, the first contact level dielectric layer 280 can include undoped silicate glass and can have a thickness in a range from 100 nm to 600 nm, although lesser and greater thicknesses can also be employed.

A photoresist layer can be applied over the first contact level dielectric layer 280 and can be lithographically patterned to form openings within areas extending across the memory array region 100 and the staircase region 200. The openings in the photoresist layer can laterally extend along the first horizontal direction hd1 between each neighboring cluster of memory stack structures 55. Backside trenches 79 can be formed by transferring the pattern in the photoresist layer through the first contact level dielectric layer 280, the second alternating stack (232, 242, 270, 265, 72), the first alternating stack (132, 142, 170, 165), and the in-process source-level material layers 10'. Portions of the first contact level dielectric layer 280, the second alternating stack (232, 242, 270, 265, 72), the first alternating stack (132, 142, 170, 165), and the in-process source-level material layers 10' that underlie the openings in the photoresist layer can be removed to form backside trenches 79. In one embodiment, the backside trenches 79 can be formed between clusters of memory stack structures 55. The clusters of the memory stack structures 55 can be laterally spaced apart along the second horizontal direction hd2 by the backside trenches 79.

Figure 13:
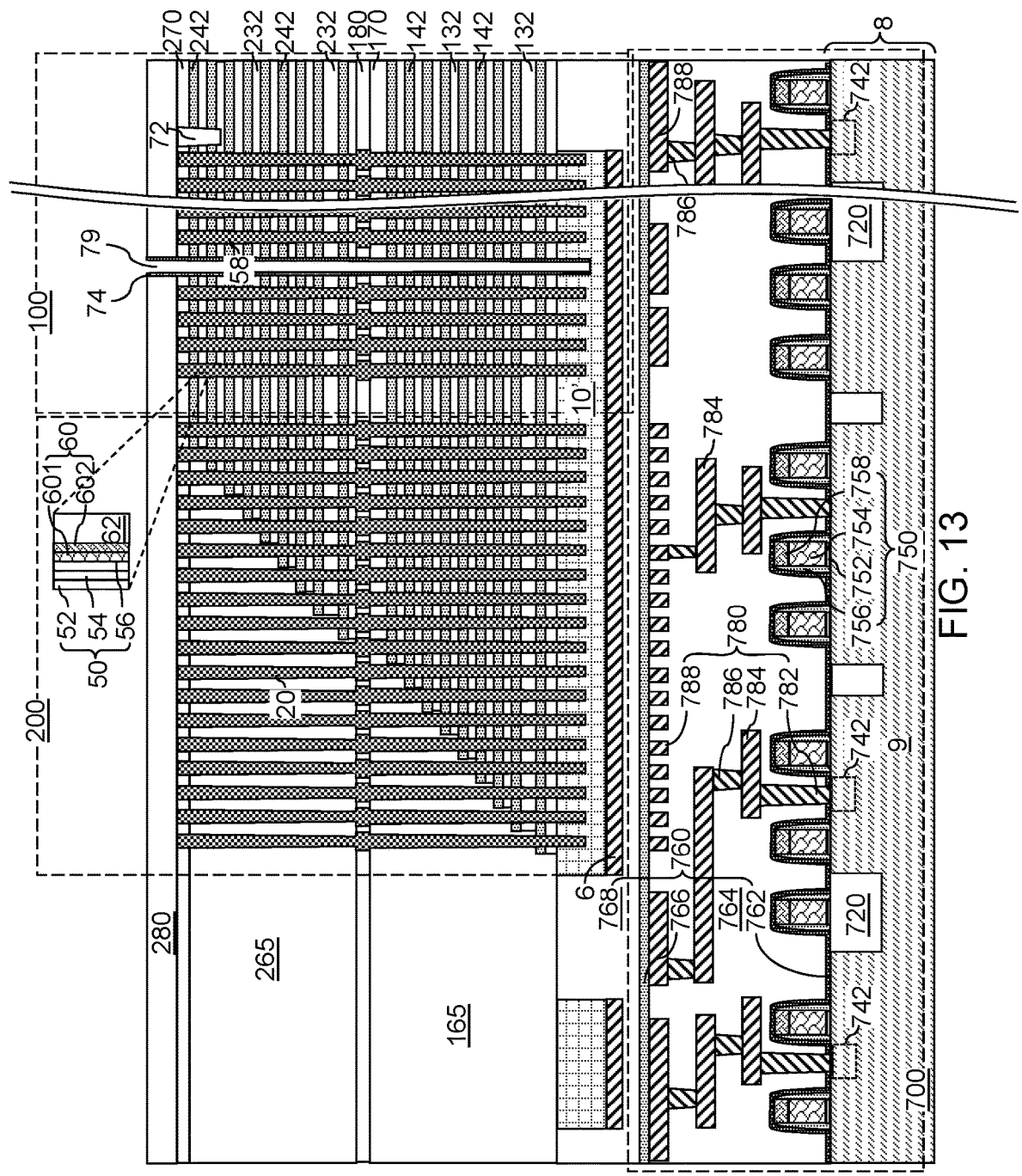
FIG. 13 is a vertical cross-sectional view of the first exemplary structure after formation of backside trench spacers in the backside trenches according to the first embodiment of the present disclosure.
Figure 14A:
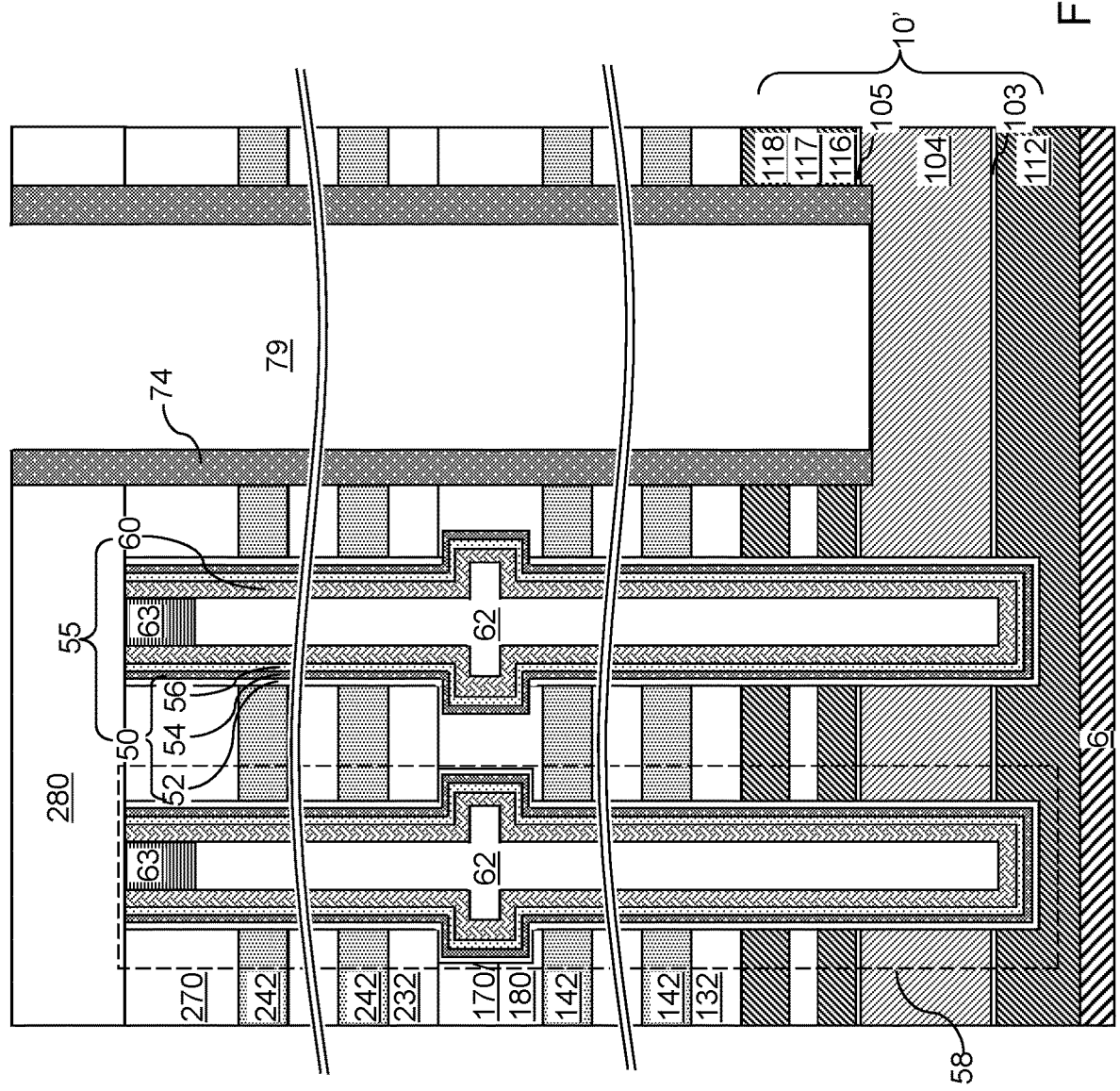
FIGS. 14A-14K illustrate sequential vertical cross-sectional views of a region of the first exemplary structure during formation of a source-level material layers according to the first embodiment of the present disclosure.

Referring to FIGS. 13 and 14A, a backside trench spacer 74 can be formed on sidewalls of each backside trench 79. For example, a conformal spacer material layer can be deposited in the backside trenches 79 and over the first contact level dielectric layer 280, and can be anisotropically etched to form the backside trench spacers 74. The backside trench spacers 74 include a material that is different from the material of the source-level sacrificial layer 104. For example, the backside trench spacers 74 can include silicon nitride.

Figure 14B:
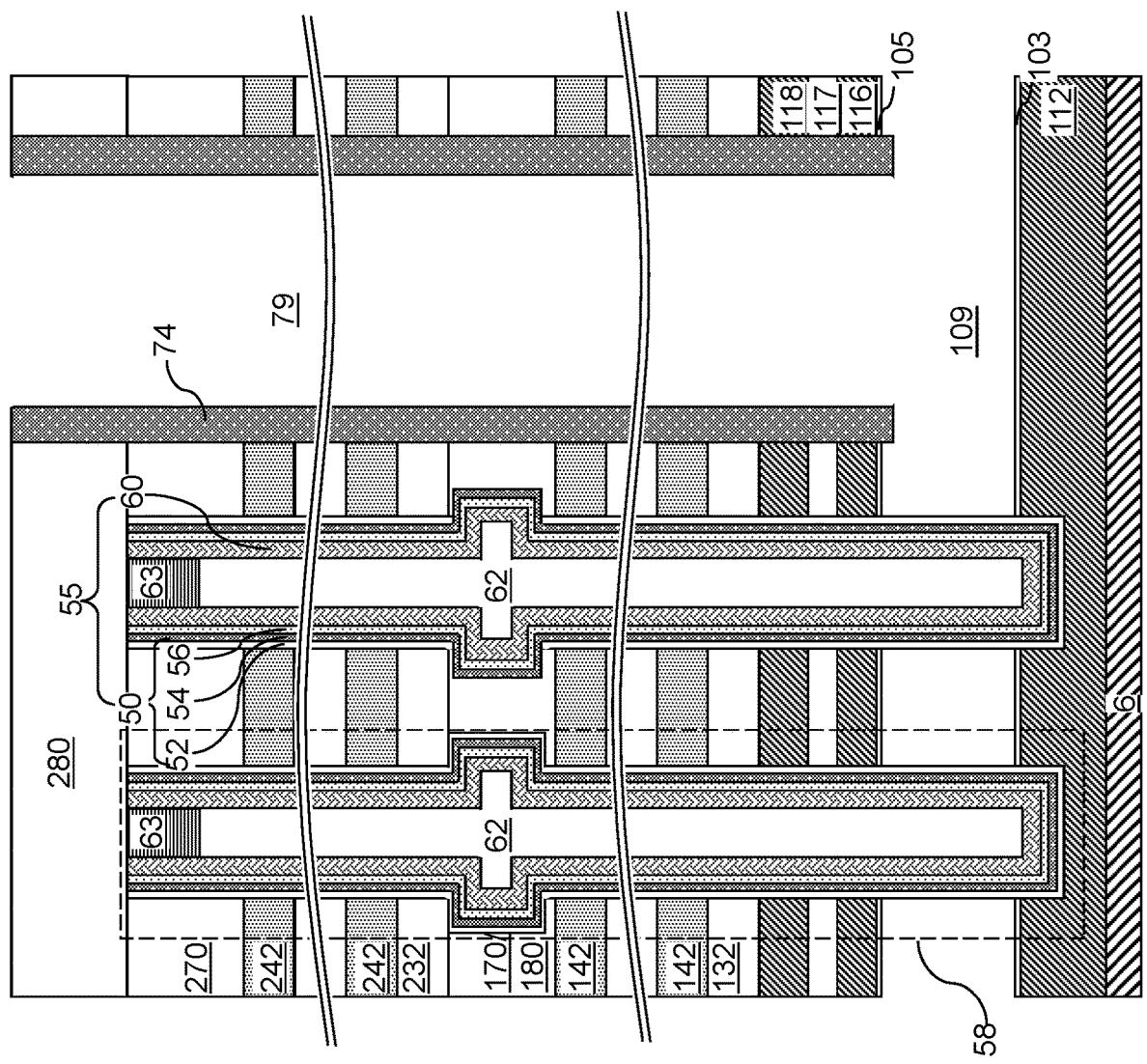

Referring to FIG. 14B, an etchant that etches the material of the source-level sacrificial layer 104 selective to the materials of the first alternating stack (132, 142), the second alternating stack (232, 242), the first and second insulating cap layers (170, 270), the upper sacrificial liner 105, and the lower sacrificial liner 103 can be introduced into the backside trenches 79 in an isotropic etch process. For example, if the source-level sacrificial layer 104 includes undoped amorphous silicon or an undoped amorphous silicon-germanium alloy, the backside trench spacers 74 include silicon nitride, and the upper and lower sacrificial liners (105, 103) include silicon oxide, a wet etch process employing hot trimethyl-2 hydroxyethyl ammonium hydroxide ("hot TMY") or tetramethyl ammonium hydroxide (TMAH) can be employed to remove the source-level sacrificial layer 104 selective to the backside trench spacers 74 and the upper and lower sacrificial liners (105, 103). A source cavity 109 is formed in the volume from which the source-level sacrificial layer 104 is removed. Sidewall surfaces of the memory opening fill structures 58 are physically exposed to the source cavity 109.

Figure 14C:
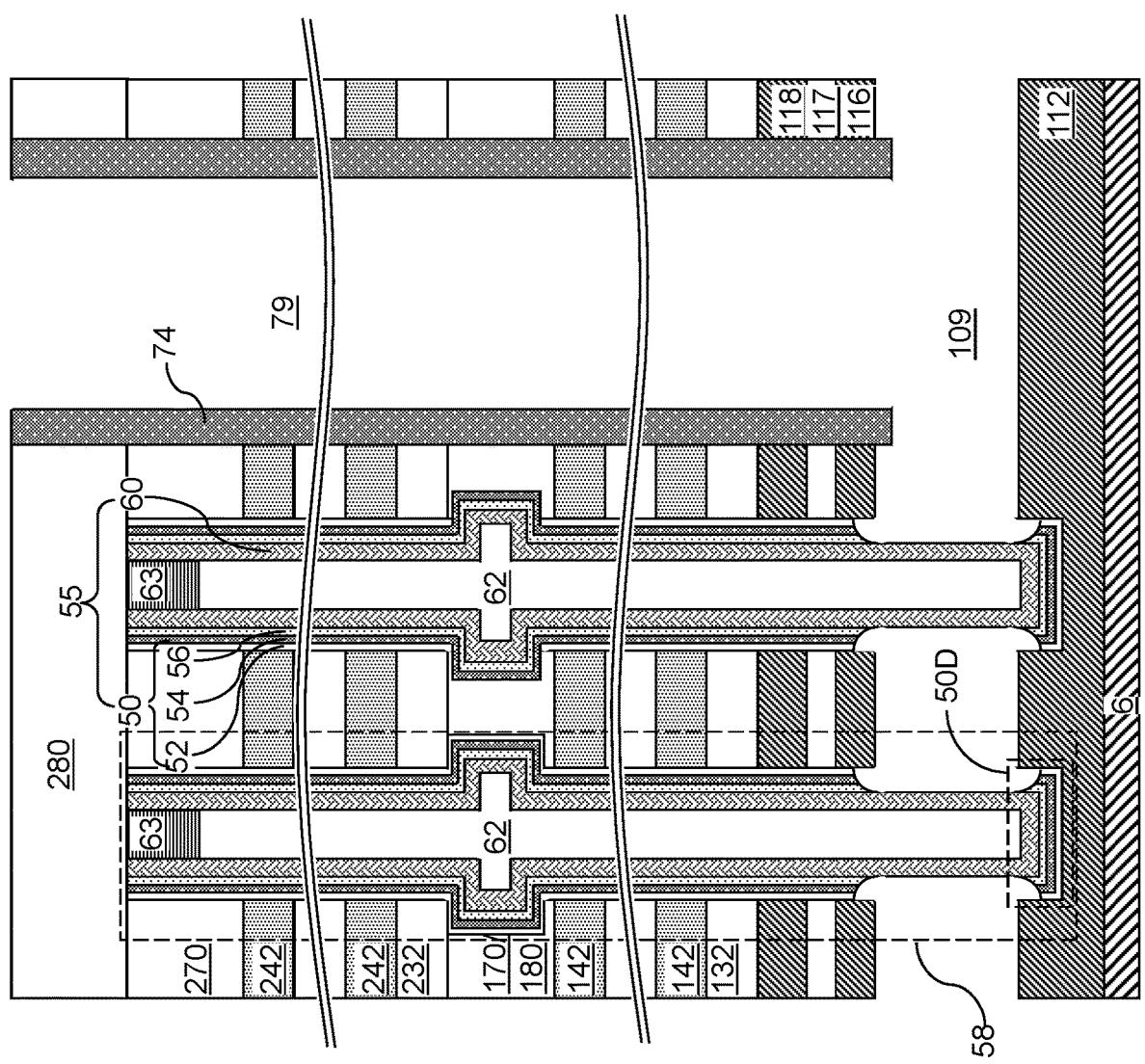

Referring to FIG. 14C, a sequence of isotropic etchants, such as wet etchants, can be applied through the backside trenches 79 and the source cavity 109 to the physically exposed portions of the memory films 50 to sequentially etch the various component layers of the memory films 50 from outside to inside, and to physically expose bottom surfaces and cylindrical side surfaces of the vertical semiconductor channels 60 at the level of the source cavity 109. The upper and lower sacrificial liners (105, 103) can be collaterally etched during removal of the portions of the memory films 50 located at the level of the source cavity 109. The source cavity 109 can be expanded in volume by removal of the portions of the memory films 50 at the level of the source cavity 109 and the upper and lower sacrificial liners (105, 103). A top surface of the lower source-level material layer 112 and a bottom surface of the upper source-level material layer 116 can be physically exposed to the source cavity 109. An outer sidewall of each vertical semiconductor channel 60 is physically exposed to the source cavity 109 after removing the physically exposed portions of the memory films 50. A dielectric material stack 50D is formed underneath each physically exposed cylindrical surface of the vertical semiconductor channels 60. Each dielectric material stack 50D is a remaining portion of the memory films 50, and includes the same dielectric material stack as the memory films 50.

Figure 14D:
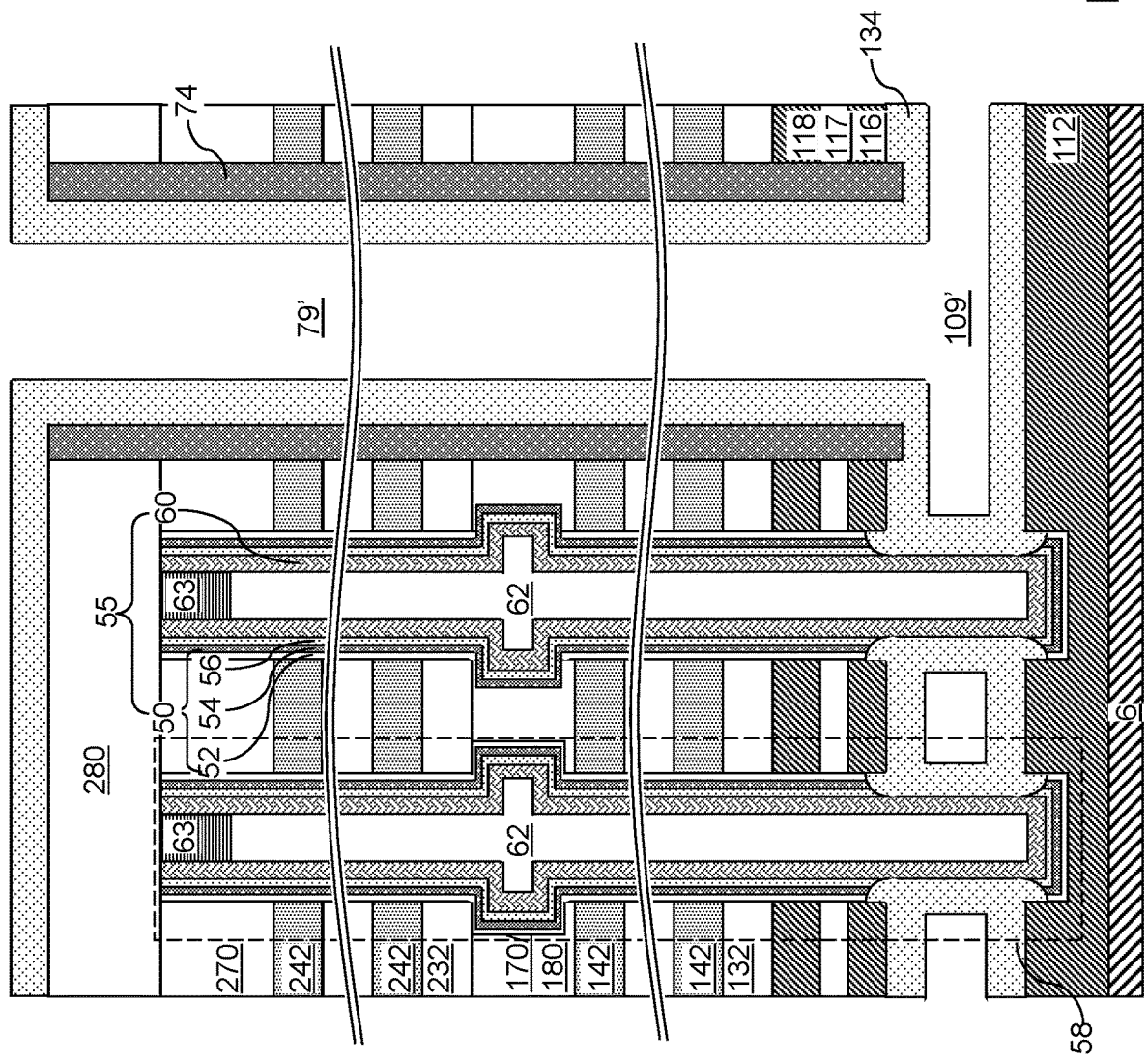

Referring to FIG. 14D, a doped semiconductor material layer 134 can be formed by a non-selective doped semiconductor deposition process that deposits doped semiconductor material, such as amorphous silicon, polysilicon or silicon-germanium on all physically exposed surfaces in the source cavity 109 and in the backside trench 79. In one embodiment, the doped semiconductor material layer 134 comprises an amorphous doped semiconductor material, such as amorphous silicon, having a doping of the second conductivity type that is be deposited by the non-selective doped semiconductor deposition process. A semiconductor precursor gas and a dopant precursor gas can be flowed concurrently into a process chamber including the first exemplary structure during the selective semiconductor deposition process. For example, if the second conductivity type is n-type, a silicon precursor gas (such as silane, disilane, or dichlorosilane) and a dopant precursor gas (such as phosphine, arsine, or stibine) can be simultaneously or alternately flowed into a process chamber containing the first exemplary structure.

In one embodiment, the temperature of the deposition process is selected such that crystallization of the deposited doped semiconductor material does not occur in-situ, and the deposited doped semiconductor material remains amorphous. The non-selective doped semiconductor deposition process deposits the amorphous doped semiconductor material on all physically exposed surfaces of the first exemplary structure. Thus, the amorphous doped semiconductor material layer 134 is formed as a continuous material layer directly on the physically exposed surfaces of the vertical semiconductor channels 60, the lower source-level material layer 112, and the upper source-level material layer 116 in each source cavity 109, directly on the physically exposed surfaces of the backside trench spacer 74 within each backside trench 79, and directly on the top surface of the first contact level dielectric layer 280. In one embodiment, an etchant gas is not employed in the non-selective doped semiconductor deposition process.

In one embodiment, the non-selective semiconductor deposition process can be performed by a conformal deposition process operated in a temperature-limited process regime. For example, the non-selective semiconductor deposition process can comprise a low pressure chemical vapor deposition (LPCVD) process in which a sufficient amount of the semiconductor precursor gas and the dopant precursor gas is provided into a process chamber at a temperature that is not high enough to induce decomposition of a predominant (i.e., over 50%) of the semiconductor precursor gas. In other words, the supply of the semiconductor precursor gas is sufficiently abundant to affect the deposition rate, while the temperature of the deposition is low enough to limit the deposition rate, thereby providing the temperature-limited process region. For example, in case the amorphous doped semiconductor material layer 134 includes amorphous silicon, the deposition temperature may be in a range from 500 degrees Celsius to 575 degree Celsius. Performing the non-selective semiconductor deposition process in the temperature-limited process regime provides the benefit of a stable and reliable deposition process in which the thickness of the amorphous doped semiconductor material layer 134 is uniform across the entire first exemplary structure. Further, the thickness of the amorphous doped semiconductor material layer 134 can be stable over multiple runs such that multiple batches of first exemplary structures can be manufactured with minimal process variations.

The duration of the non-selective semiconductor deposition process can be selected such that the source cavity 109 is only partially filled (i.e., not completely filled) with the amorphous doped semiconductor material layer 134. Thus, an unfilled cavity 109' is present within the source contact layer 114. Further, an unfilled cavity, which is herein referred to as a backside cavity 79', is present within each backside trench 79. The amorphous doped semiconductor material layer 134 can be formed as a conformal material layer. In this case, the thickness of the amorphous doped semiconductor material layer 134 can be less than one half of the height of the source cavity 109 prior to performing the non-selective semiconductor deposition process. In one embodiment, the thickness of the amorphous doped semiconductor material layer 134 can be in a range from 10 nm to 160 nm, such as from 25 nm to 80 nm, although lesser and greater thicknesses can also be employed. The average atomic concentration of dopants of the second conductivity type in the amorphous doped semiconductor material layer 134 can be in a range from $5.0\times10^{19}/cm^3$ to $2.0\times10^{21}/cm^3$, although lesser and greater dopant concentrations can also be employed.

Figure 14E:
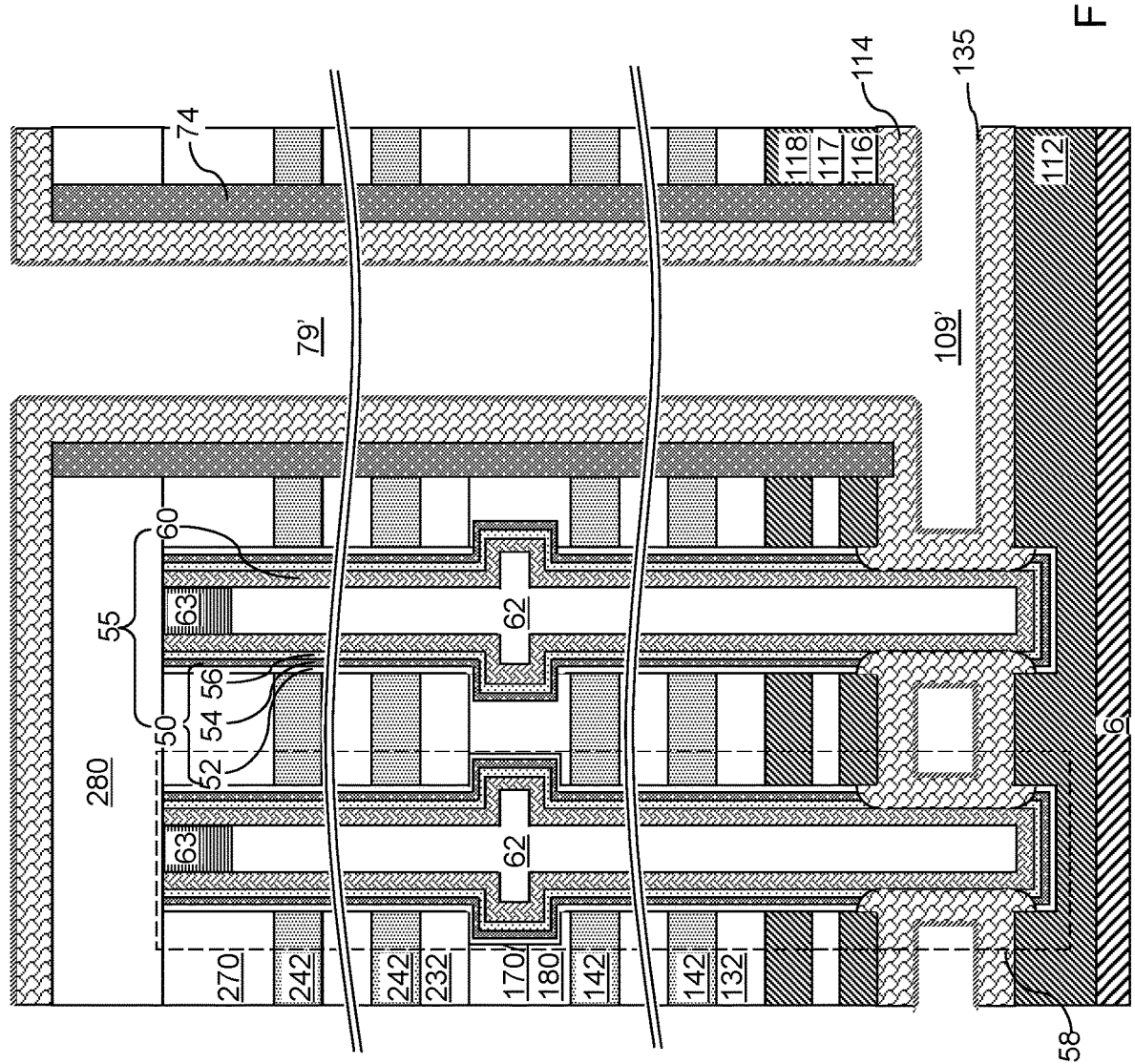

Referring to FIG. 14E, a silicon nitride liner 135 can be formed on the physically exposed surfaces of the amorphous doped semiconductor material layer 134. The silicon nitride liner 135 can be formed as a conformal silicon nitride layer by a thermal nitridation process. For example, the first exemplary structure can be subjected to a nitriding environment at an elevated temperature. For example, the first exemplary structure can be placed within an ammonia-containing ambient at a temperature in a range from 700 degrees Celsius to 900 degrees Celsius. The duration of the thermal nitridation process is selected to convert only the surface portion of the amorphous doped semiconductor material layer (e.g., amorphous silicon layer) 134 into silicon nitride. The thickness of the silicon nitride liner 135 can be in a range from 1 nm to 5 nm, such as from 2 nm to 4, nm, although lesser and greater thicknesses can also be employed.

In one embodiment, the temperature of the thermal nitridation process can be high enough to convert only the remaining amorphous doped semiconductor material (such as amorphous doped silicon) of the amorphous doped semiconductor material layer 134 into a polycrystalline doped semiconductor material (such as doped polysilicon). The remaining amorphous doped semiconductor material layer 134 is converted into a polycrystalline doped semiconductor material layer, which is herein referred to as a source contact layer 114.

Figure 14F:
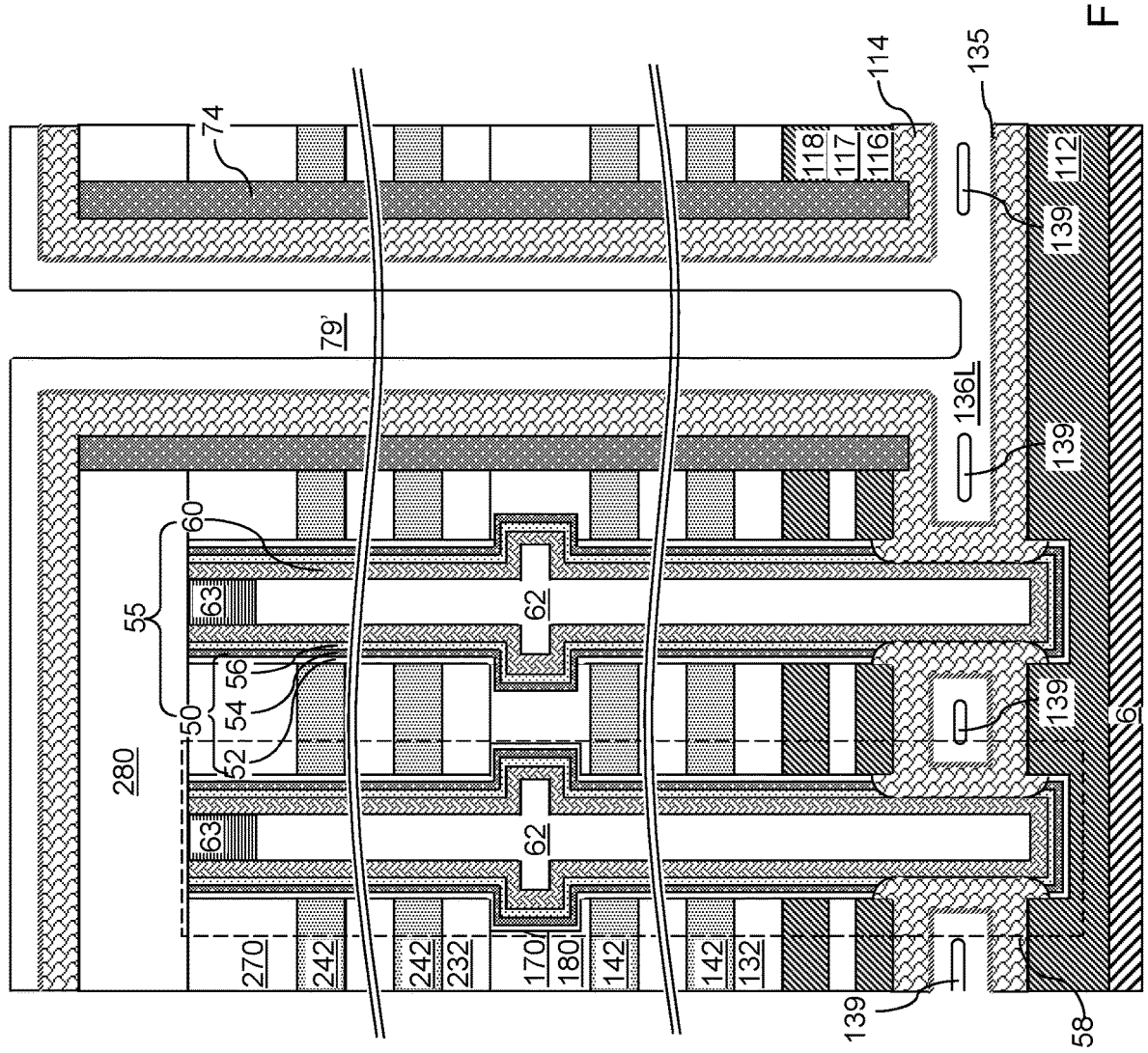

Referring to FIG. 14F, a silicon oxide fill material can be deposited in remaining volumes of the source cavity 109 to form a silicon oxide fill material layer 136L. The silicon oxide fill material layer 136L can include undoped silicate glass or a doped silicate glass. For example, the silicon oxide fill material layer 136L can include undoped TEOS oxide, which is a silicon oxide material deposited by decomposition of tetraethylorthosilicate (TEOS). The silicon oxide fill material layer 136L can be formed by a conformal deposition process such as low pressure chemical vapor deposition process. In one embodiment, the silicon oxide fill material layer 136L can include TEOS oxide, and includes at least 10 parts per million of hydrogen atoms and at least 3 parts per million of carbon atoms that originate from a TEOS precursor employed in the deposition process, and are incorporated into the silicon oxide fill material layer 136L during the deposition process. While conformal deposition processes generally deposit a material with a high degree of thickness uniformity, small reduction in thickness in high-aspect-ratio geometries is typical even in conformal deposition processes. Thus, voids 139 free of any solid or liquid material can be formed within the portions of the silicon oxide fill material layer 136L in the source cavity 109. The voids 139 can include only a gas phase material or can be under vacuum. The silicon oxide fill material layer 136L can be formed on all physically exposed surfaces of the silicon nitride liner 135 including the sidewalls of the silicon nitride liner 135 located in the backside trenches 79 and over the first contact level dielectric layer 280.

Figure 14G:
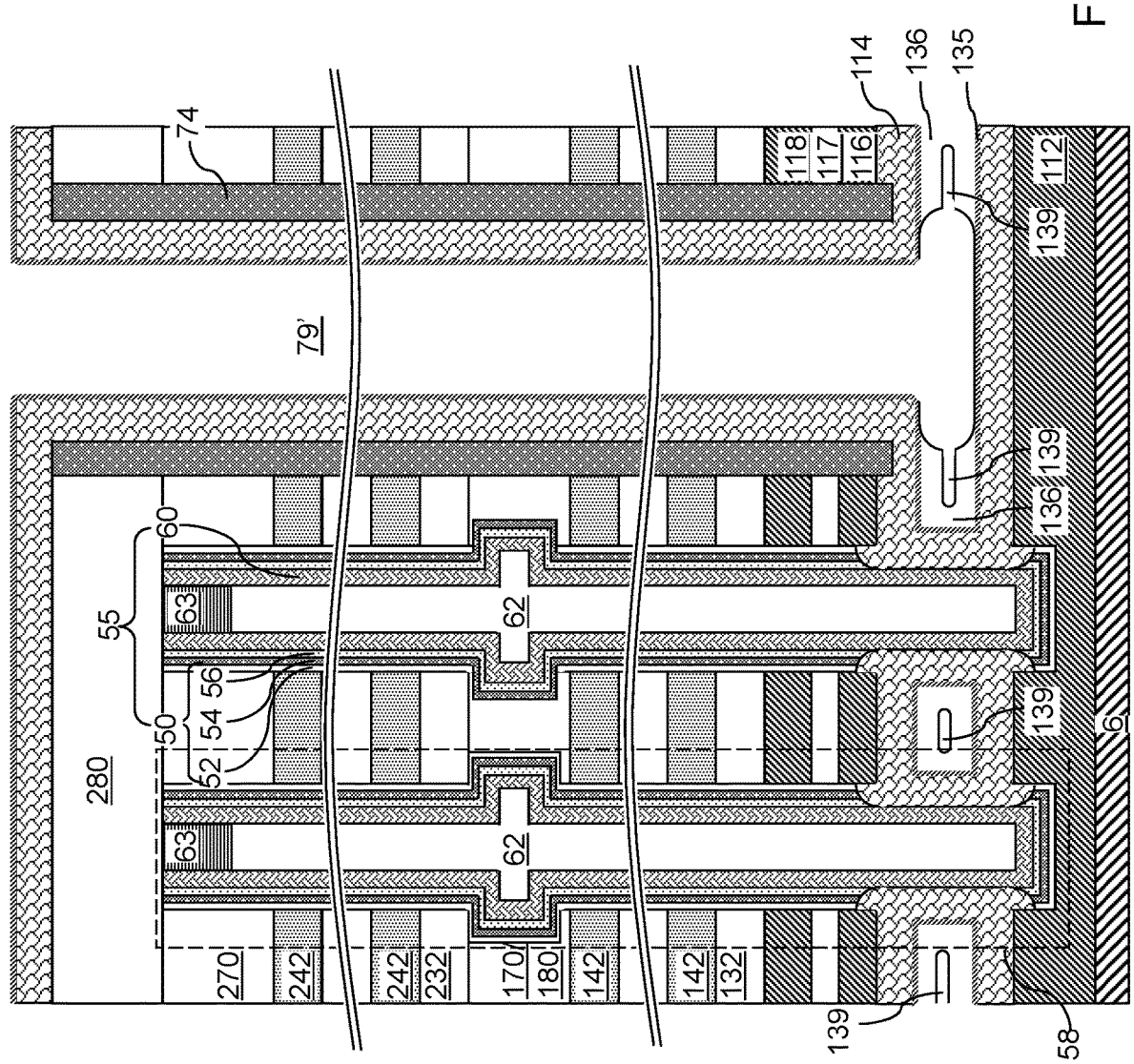

Referring to FIG. 14G, an isotropic dry etch process such as chemical dry etch (CDE) can be performed to remove portion of the silicon oxide fill material layer 136L overlying the first contact level dielectric layer 280 and portions of the silicon oxide fill material layer 136L located at a periphery of each backside cavity 79'. The silicon oxide fill material layer 136L is removed from above the first contact level dielectric layer 280 and from the inner sidewalls of the silicon nitride liner 135 within the backside trenches 79. Further, portions of the silicon oxide fill material layer 136L can be removed around the bottom of each backside cavity 79'. The remaining portions of the silicon oxide fill material layer 136L within the source cavities 109 are herein referred to as silicon oxide fill material portions 136. The silicon oxide fill material portions 136 are located outside the areas of the backside cavities 79', and generally at a periphery of, and outside the areas of, backside trenches 79. A subset of the voids 139 adjacent to the backside cavities 79' can be connected to a respective backside cavity 79' after the isotropic dry etch process.

Figure 14H:
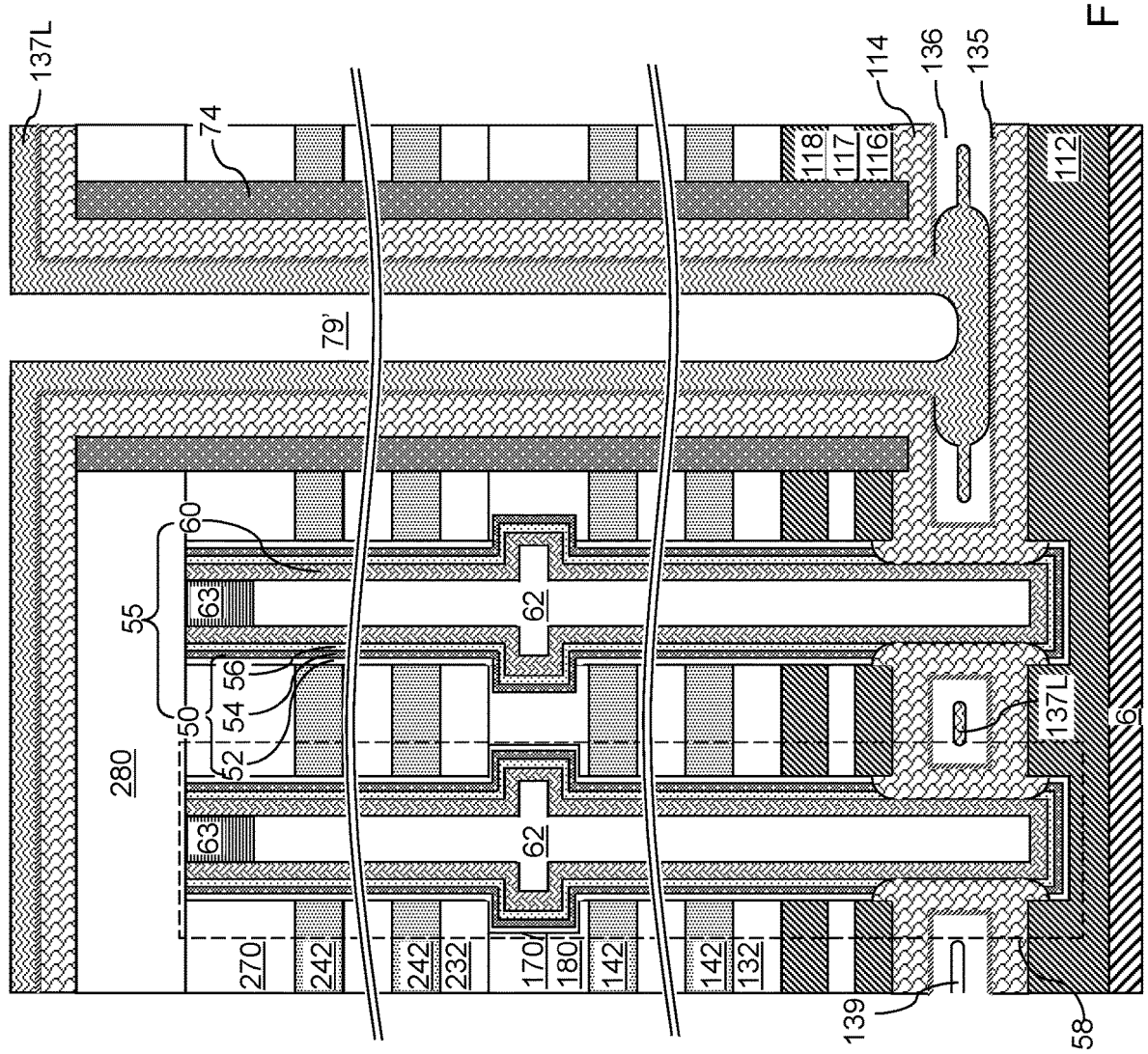

Referring to FIG. 14H, a semiconductor fill material layer 137L can be deposited on the silicon oxide fill material portions 136 by a conformal deposition process. The semiconductor fill material layer 137L can include a doped semiconductor material or an undoped semiconductor material. For example, the semiconductor fill material layer 137L can include amorphous silicon, polysilicon, or a silicon-germanium alloy. The conformal deposition process that deposits the semiconductor fill material layer 137L can comprise, for example, low pressure chemical vapor deposition process. In one embodiment, an amorphous semiconductor material (e.g., amorphous silicon) can be employed for the semiconductor fill material layer 137L to provide high conformity to the semiconductor fill material layer 137L. The thickness of the semiconductor fill material layer 137L can be selected such that a backside cavity 79' remains within each backside trench 79.

Figure 14I:
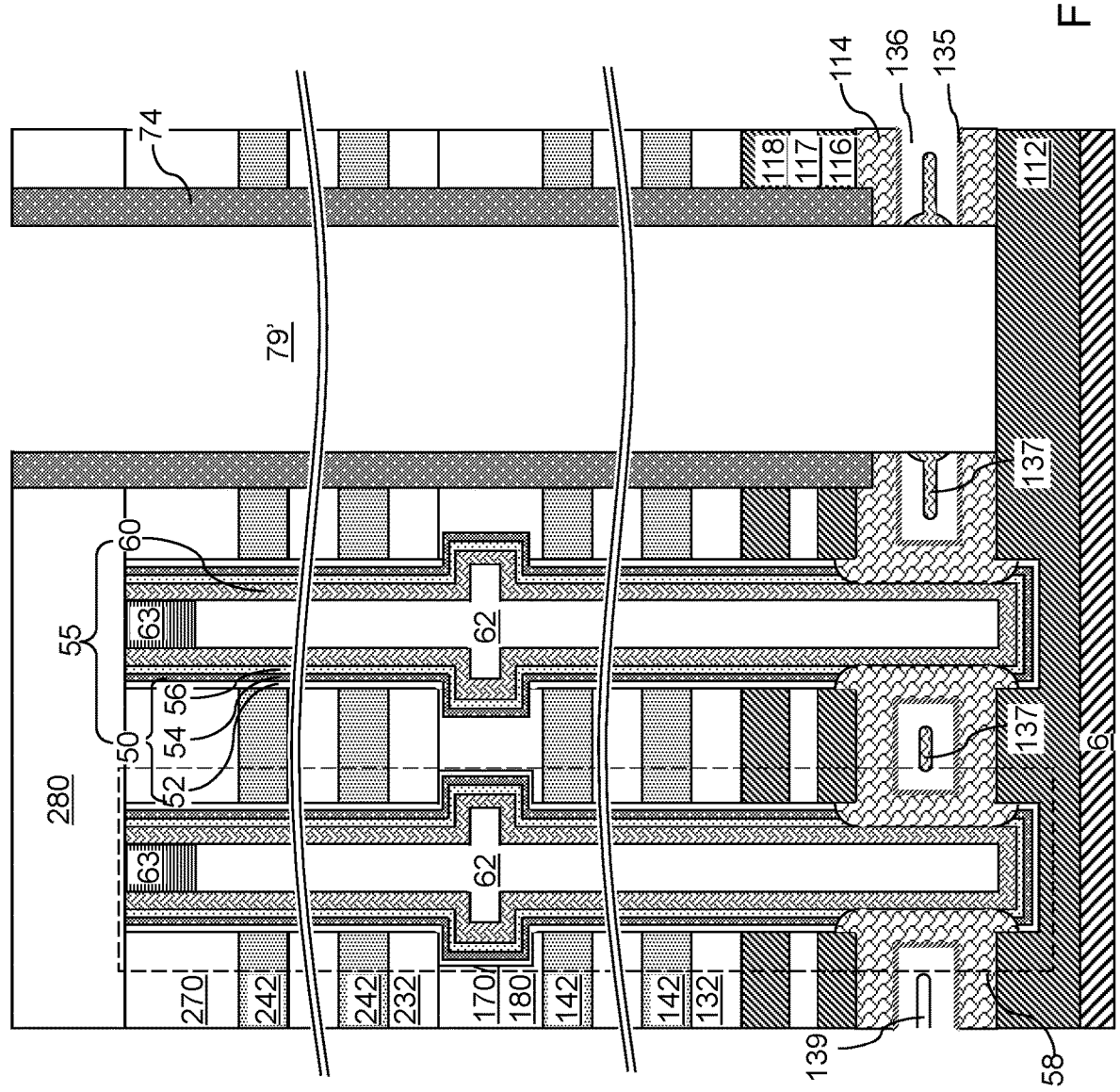

Referring to FIG. 14I, an anisotropic etch process can be performed to sequentially etch the horizontal portion of the semiconductor fill material layer 137L overlying the first contact level dielectric layer 280, the horizontal portion of the silicon nitride liner 135 exposed at the bottom of the backside trench 79, and semiconductor materials of the semiconductor fill material layer 137L and the source contact layer 114 within the volumes of the backside trenches 79. The anisotropic etch process can include multiple steps for sequentially etching the semiconductor material of the horizontal portion of the semiconductor fill material layer 137L overlying the first contact level dielectric layer 280, the silicon nitride material of the horizontal portion of the silicon nitride liner 135 overlying the first contact level dielectric layer 280, and semiconductor materials of the semiconductor fill material layer 137L and the source contact layer 114 within the volumes of the backside trenches

79. Alternatively, the anisotropic etch process can have an etch chemistry that provides a high etch rate for the semiconductor fill materials of the semiconductor fill material layer 137L and the source contact layer 114 while collaterally etching the silicon nitride material of the silicon nitride liner 135 at a low, but sufficient, etch rate to ensure removal of the portions of the silicon nitride liner 135 from above the first contact level dielectric layer 280 and from inside the backside trenches 79. The semiconductor fill material layer 137L, the source contact layer 114, and the silicon nitride liner 135 can be completely removed from above the first contact level dielectric layer 280 and from inside the backside trenches 79. The remaining portions of the semiconductor fill material layer 137L constitute semiconductor fill material portions (e.g., semiconductor caps for the insulating core) 137. In one embodiment, only a subset of voids 139 in the silicon oxide fill material portions 136 can be filled with the semiconductor fill material portions 137, and some voids 139 may remain as voids 139. In another embodiment, all voids 139 in the silicon oxide fill material portions 136 can be filled with the semiconductor fill material portions 137. In one embodiment, a semiconductor fill material portion 137 can laterally surround a lower portion of a backside cavity 79'. The anisotropic etch process can terminate before etching through the lower source-level material layer 112. An inner sidewall of each backside trench spacer 74 can be physically exposed after the anisotropic etch process.

Figure 14J:
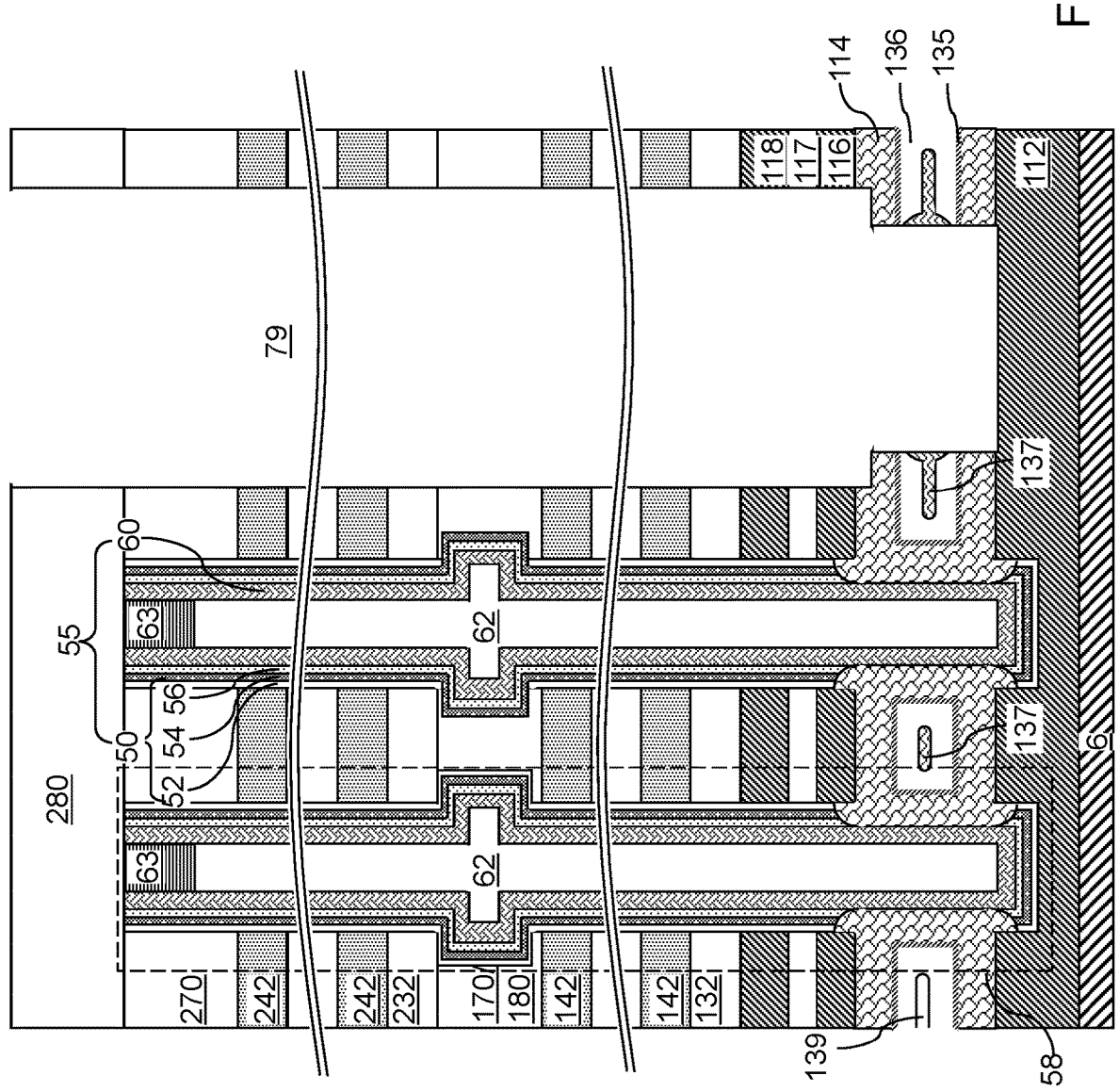

Referring to FIG. 14J, the backside trench spacers 74 can be removed selective to the semiconductor materials of the source contact layer 114 and the semiconductor fill material portions 137, selective to the silicon oxide fill material portions 136, and selective to the first and second insulating layers (132, 232), the first and second insulating cap layers (170, 270), the inter-tier dielectric layer 180, and the first contact level dielectric layer 280. For example, if the backside trench spacers 74 include silicon nitride, a wet etch process employing hot phosphoric acid can be employed to remove the backside trench spacers 74. Sidewalls of the first and second alternating stacks (132, 142, 232, 242), the upper source-level material layer 116, the source-level insulating layer 117, and the optional source-select-level conductive layer 118 can be physically exposed after removal of the backside trench spacers 74.

Figure 14K:
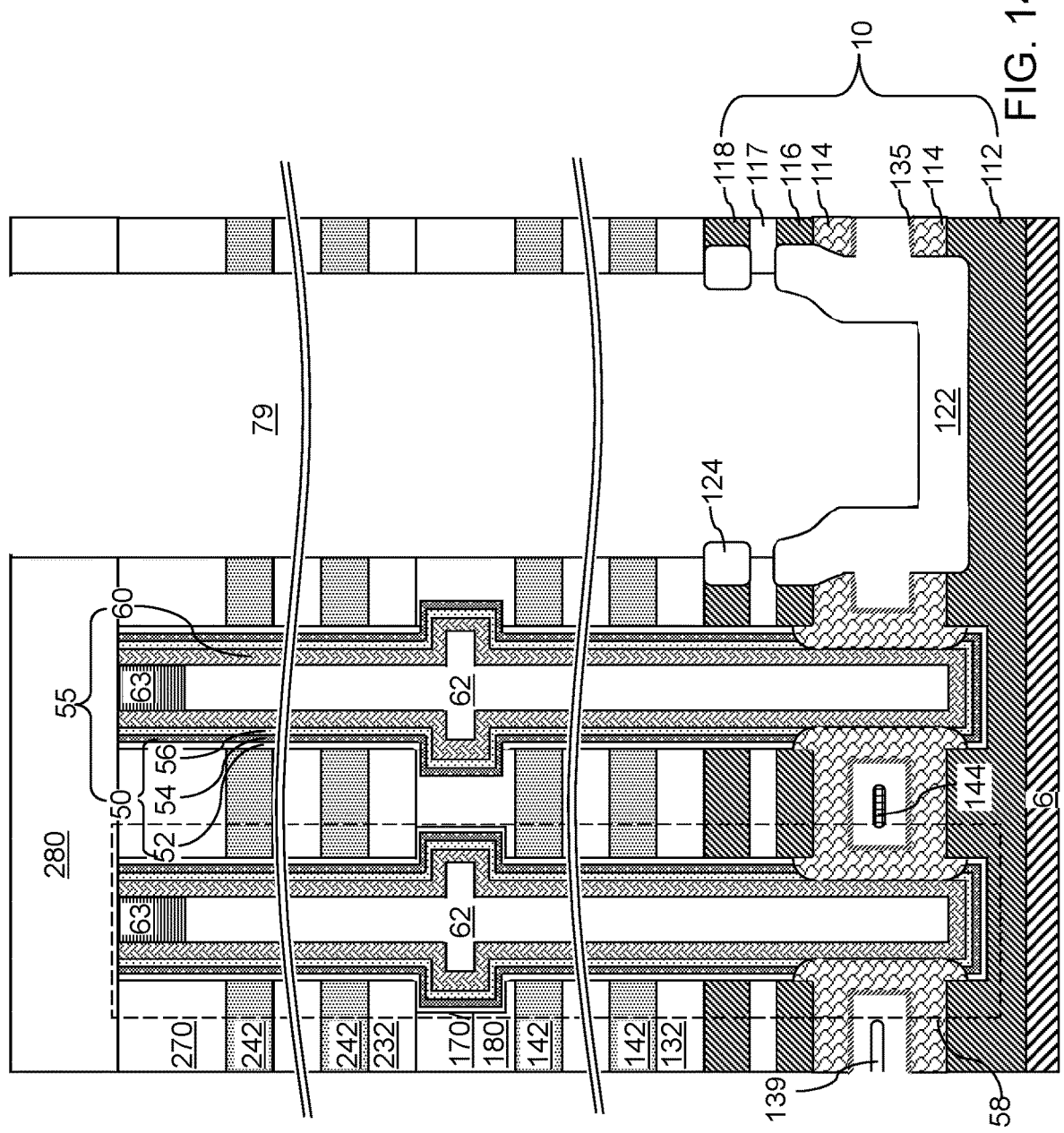
Figure 15:
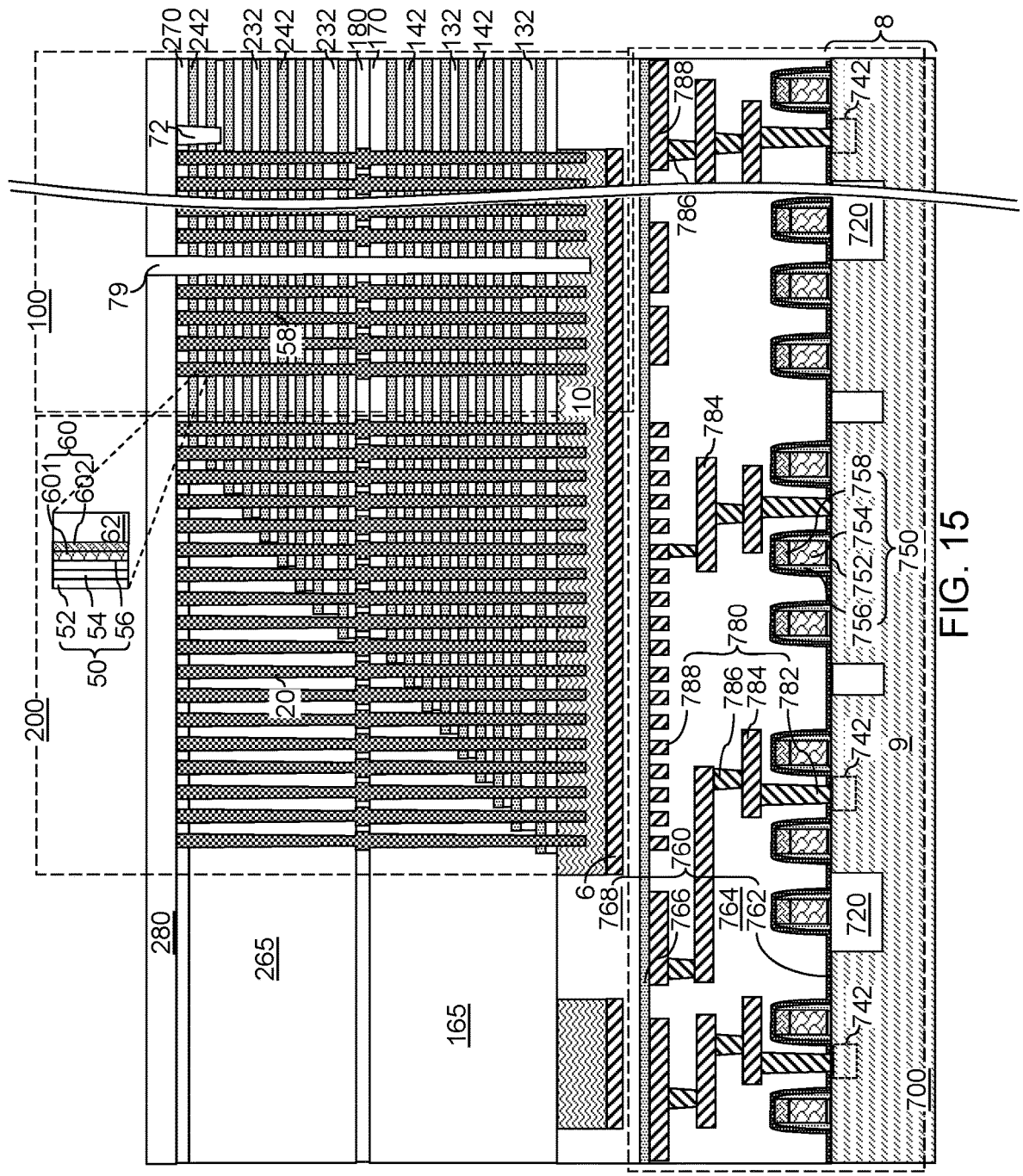
FIG. 15 is a vertical cross-sectional view of the first exemplary structure after formation of the source-level material layers according to the first embodiment of the present disclosure.

Referring to FIGS. 14K and 15, a thermal oxidation process can be performed to convert physically exposed surface portions of various semiconductor materials into semiconductor oxide portions. It is believed that the semiconductor fill material portions 137 function as caps to prevent or reduce unintended oxidation of middle parts of the source contact layer 114 through a seam in the silicon oxide fill material portions 136. Specifically, physically exposed surface portions of the semiconductor fill material portions 137, the lower source-level material layer 112, the source contact layer 114, the upper source-level material layer 116, and the source-select-level conductive layer 118 (if present) are converted into thermal semiconductor oxide material portions. As used herein, a "thermal semiconductor oxide" refers to a material that is formed by thermal oxidation of a semiconductor material. Unlike a semiconductor oxide material formed by chemical vapor deposition, thermal semiconductor oxide materials do not include carbon or hydrogen above a trace level unless the semiconductor material from which the semiconductor oxide material is derived includes carbon prior to a thermal oxidation process. If the semiconductor fill material portions 137, the lower source-level material layer 112, the source contact layer 114, the upper source-level material layer 116, and the source-select-level conductive layer 118 are free of carbon, thermal semiconductor oxide material portions derived therefrom can be free of carbon or hydrogen.

The thermal oxidation process forms a continuous semiconductor oxide structure 122 at the bottom of each backside trench 79. The semiconductor oxide structure 122 includes various thermal semiconductor oxide material portions formed by thermal conversion of surface portions of the semiconductor fill material portions 137, the lower source-level material layer 112, the source contact layer 114, and the upper source-level material layer 116. Further, surface portions of the silicon nitride liner 135 around the backside trench 79 can be converted into an annular thermal semiconductor oxide material portion. A contiguous set of thermal semiconductor oxide material portions derived from the lower source-level material layer 112, the source contact layer 114, the upper source-level material layer 116, and the silicon nitride liner 135 and a thermal semiconductor oxide material portion derived from the semiconductor fill material portions 137 merge with the silicon oxide fill material portions 136 around the bottom of each backside trench 79 to provide a semiconductor oxide structure, such as a silicon oxide structure 122. The semiconductor oxide structure 122 is a continuous structure that extends around a bottom region of a backside trench 79 and extends laterally outward to encircle bottom portions of a set of memory stack structures 55. Each semiconductor oxide structure 122 comprises a continuous thermal semiconductor oxide material portion located at a bottom periphery of a backside trench 79 and formed on a respective silicon oxide fill material portion 136 (which is incorporated into the semiconductor oxide structure 122). An annular semiconductor oxide material portion 124 can be formed around each backside trench 79 by thermal oxidation of physically exposed surface portions of the source-select-level conductive layer 118. In one embodiment, the annular semiconductor oxide material portion 124 can be topologically homeomorphic to a torus. Any remaining segment of the semiconductor fill material portions 137 can be converted into a polycrystalline semiconductor fill material portion 144.

The layer stack including the lower source-level material layer 112, the source contact layer 114, and the upper source-level material layer 116 constitutes a buried source layer (112, 114, 116), which function as a common source region that is connected each of the vertical semiconductor channels 60 and has a doping of the second conductivity type. The average dopant concentration in the buried source layer (112, 114, 116) can be in a range from $5.0 \times 10^{19}/\text{cm}^3$ to $2.0 \times 10^{21}/\text{cm}^3$, although lesser and greater dopant concentrations can also be employed. The set of layers including the buried source layer (112, 114, 116), the source-level insulating layer 117, and the optional source-select-level conductive layer 118 constitutes source-level material layers 10, which replaces the in-process source-level material layers 10'.

Figure 16:
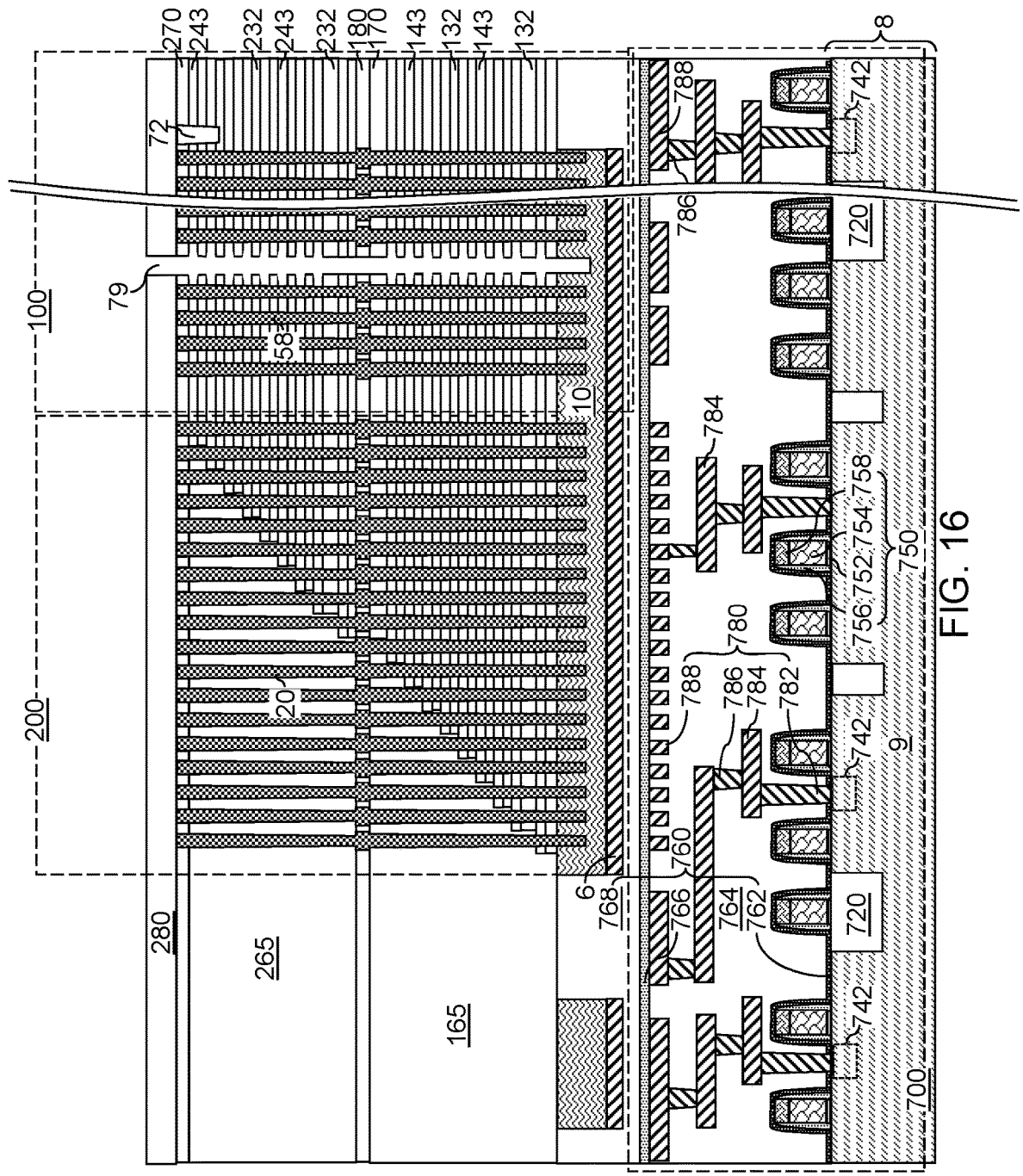
FIG. 16 is a vertical cross-sectional view of the first exemplary structure after formation of backside recesses according to the first embodiment of the present disclosure.

Referring to FIG. 16, an etchant that selectively etches the materials of the first and second sacrificial material layers (142, 242) with respect to the materials of the first and second insulating layers (132, 232), the first and second retro-stepped dielectric material portions (165, 265), and the material of the outermost layer of the memory films 50 can be introduced into the backside trenches 79, for example, employing an isotropic etch process. For example, the first and second sacrificial material layers (142, 242) can include silicon nitride, the materials of the first and second insulating layers (132, 232), the first and second insulating cap layers (170, 270), the first and second retro-stepped dielectric material portions (165, 265), and the material of the outermost layer of the memory films 50 can include silicon oxide materials. First backside recesses 143 are formed in volumes from which the first sacrificial material layers 142 are removed. Second backside recesses 243 are formed in volumes from which the second sacrificial material layers 242 are removed.

The isotropic etch process can be a wet etch process employing a wet etch solution, or can be a gas phase (dry) etch process in which the etchant is introduced in a vapor phase into the backside trenches 79. For example, if the first and second sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials employed in the art.

Each of the first and second backside recesses (143, 243) can be a laterally extending cavity having a lateral dimension that is greater than the vertical extent of the cavity. In other words, the lateral dimension of each of the first and second backside recesses (143, 243) can be greater than the height of the respective backside recess (143, 243). A plurality of first backside recesses 143 can be formed in the volumes from which the material of the first sacrificial material layers 142 is removed. A plurality of second backside recesses 243 can be formed in the volumes from which the material of the second sacrificial material layers 242 is removed. Each of the first and second backside recesses (143, 243) can extend substantially parallel to the top surface of the substrate 8. A backside recess (143, 243) can be vertically bounded by a top surface of an underlying insulating layer (132 or 232) and a bottom surface of an overlying insulating layer (132 or 232). In one embodiment, each of the first and second backside recesses (243, 243) can have a uniform height throughout.

Figure 17A:
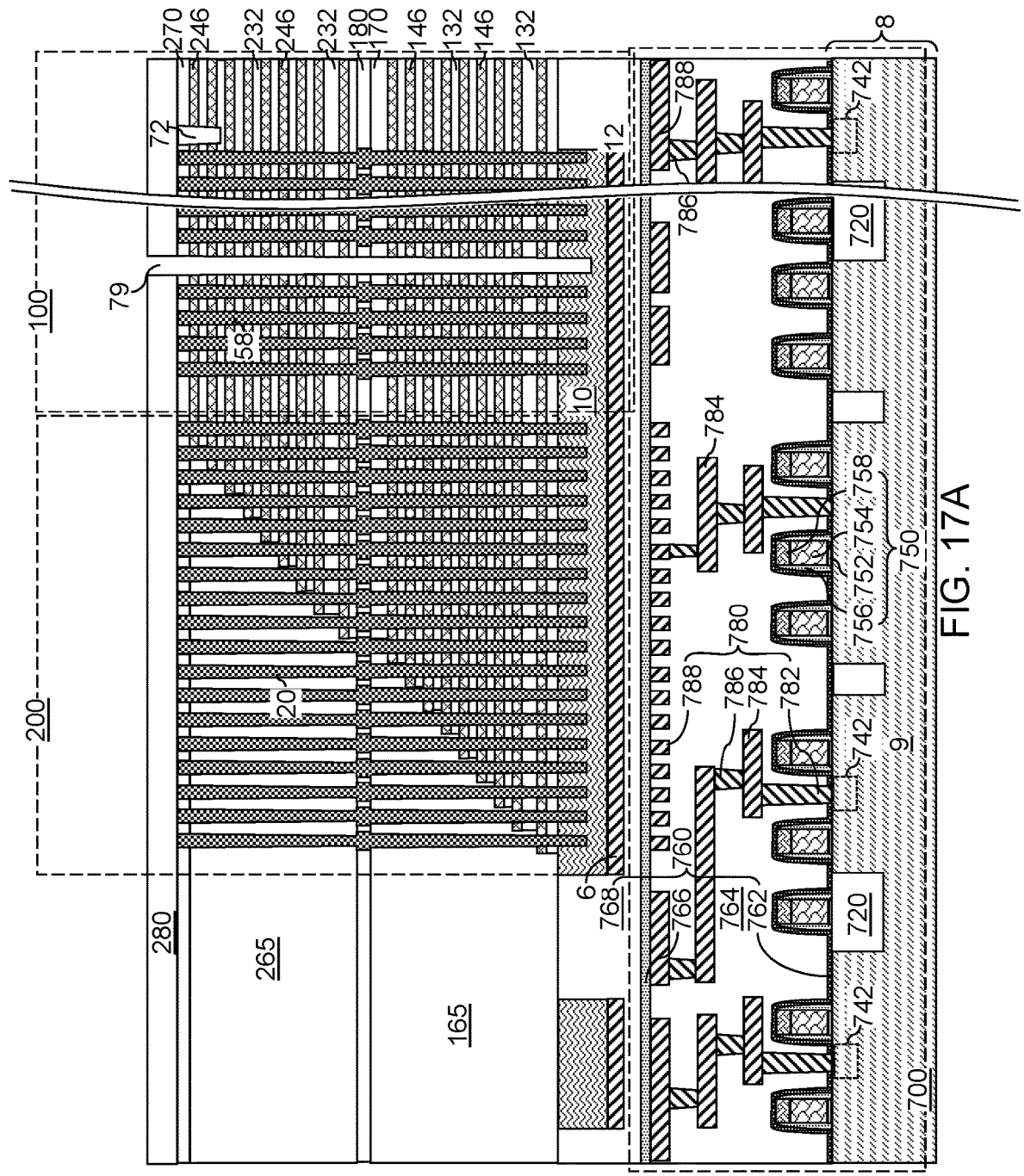
FIG. 17A is a vertical cross-sectional view of the first exemplary structure after formation of electrically conductive layers in the backside recesses according to the first embodiment of the present disclosure.

Referring to FIG. 17A, a backside blocking dielectric layer (not shown) can be optionally deposited in the backside recesses and the backside trenches 79 and over the first contact level dielectric layer 280. The backside blocking dielectric layer can be deposited on the physically exposed portions of the outer surfaces of the memory stack structures 55, which are portions of the memory opening fill structures 58. The backside blocking dielectric layer includes a dielectric material such as a dielectric metal oxide, silicon oxide, or a combination thereof. If employed, the backside blocking dielectric layer can be formed by a conformal deposition process such as atomic layer deposition or chemical vapor deposition. The thickness of the backside blocking dielectric layer can be in a range from 1 nm to 60 nm, although lesser and greater thicknesses can also be employed.

At least one conductive material can be deposited in the plurality of backside recesses (243, 243), on the sidewalls of the backside trench 79, and over the first contact level dielectric layer 280. The at least one conductive material can include at least one metallic material, i.e., an electrically conductive material that includes at least one metallic element.

A plurality of first electrically conductive layers 146 can be formed in the plurality of first backside recesses 143, a plurality of second electrically conductive layers 246 can be formed in the plurality of second backside recesses 243, and a continuous metallic material layer (not shown) can be formed on the sidewalls of each backside trench 79 and over the first contact level dielectric layer 280. Thus, the first and second sacrificial material layers (142, 242) can be replaced with the first and second conductive material layers (146, 246), respectively. Specifically, each first sacrificial material layer 142 can be replaced with an optional portion of the backside blocking dielectric layer and a first electrically conductive layer 146, and each second sacrificial material layer 242 can be replaced with an optional portion of the backside blocking dielectric layer and a second electrically conductive layer 246. A backside cavity is present in the portion of each backside trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses can be a combination of titanium nitride layer and a tungsten fill material. In one embodiment, the metallic material can be deposited by chemical vapor deposition or atomic layer deposition.

Figure 17B:
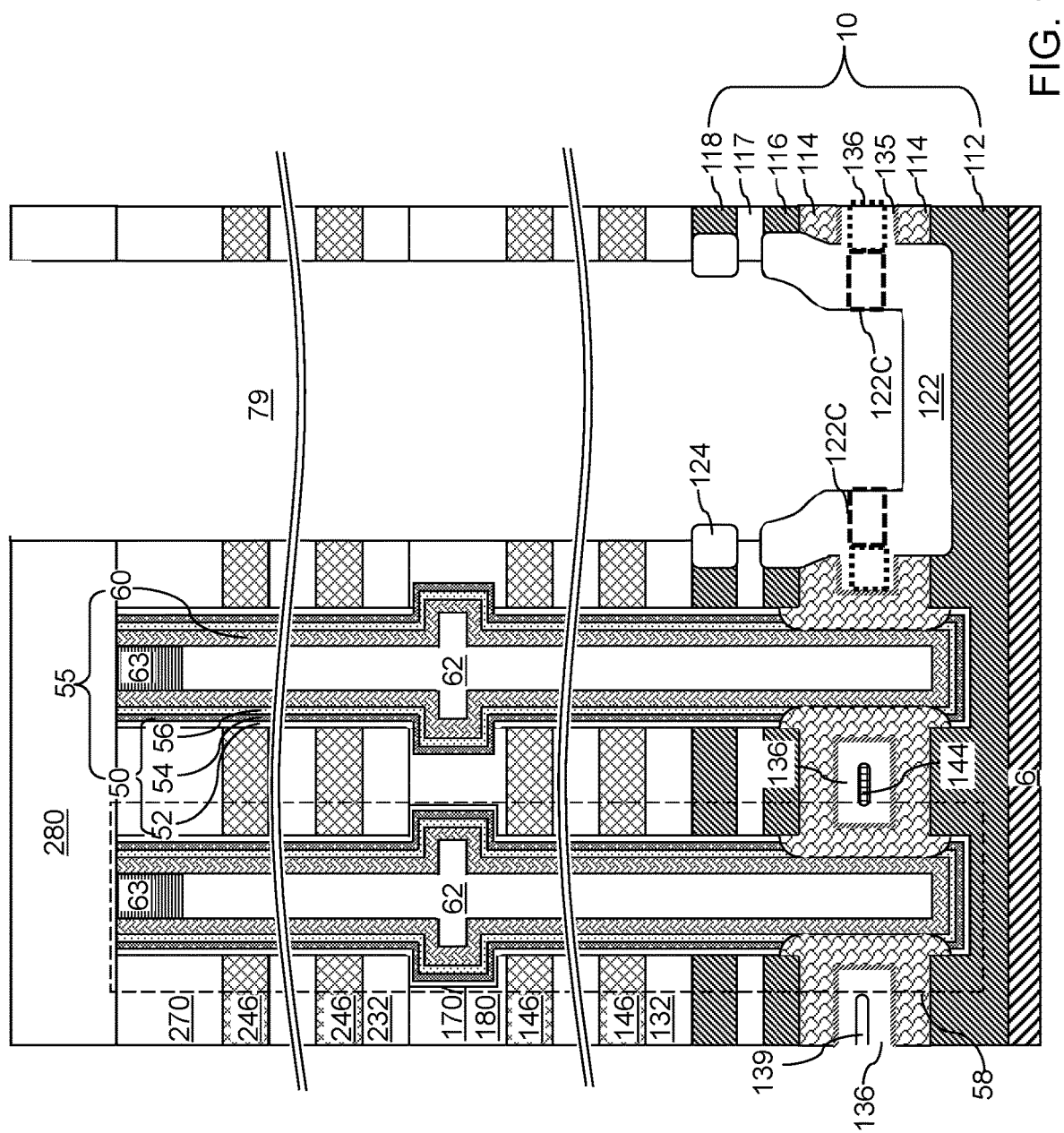
FIG. 17B is a vertical cross-sectional view of a region of the first exemplary structure at the bottom of the backside trench in FIG. 17A.

Referring to FIG. 17B, it is believed that the oxidized portions semiconductor fill material portions 137 function as semiconductor caps 122C for the insulating core 136 of the in-process buried source line containing an insulating core (comprising silicon oxide fill material portions 136) surrounded by an electrically conductive (e.g., heavily doped semiconductor) shell comprising the source contact layer 114. Without wishing to be bound by a particular theory, it is believed that the hot phosphoric acid used to etch the backside trench spacers 74 and the sacrificial material layers (142, 242) in the step illustrated in FIG. 16, can also collaterally etch the buried source line materials (i.e., the silicon oxide fill material portions 136 surrounded by the source contact layer 114), by infiltrating a seam in the silicon oxide fill material portions 136 of the semiconductor oxide structure 122. This is believed to also result in hot phosphoric acid reaching the memory film 50 and etching through the silicon nitride layer(s) (e.g., layer 54) in the memory film 50. This may result in a short circuit between the buried source line (e.g., between layer 114) and the source-select-level conductive layer (i.e., the source select gate electrode) 118 if the conductive material used to form the electrically conductive layers 146, 246 fills the passages etched through layers 114 and 54. The caps 122C comprise thickened portions of the semiconductor oxide structure 122 located in the backside trenches 79 to prevent or reduce hot phosphoric acid etching damage to layers 114 and 54, and thus reduce or prevent short circuits between the buried source line and the source select gate electrode.

Residual conductive material can be removed from inside the backside trenches 79. Specifically, the deposited metallic material of the continuous metallic material layer can be etched back from the sidewalls of each backside trench 79 and from above the first contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Each electrically conductive layer (146, 246) can be a conductive line structure.

A subset of the second electrically conductive layers 246 located at the levels of the drain-select-level isolation structures 72 constitutes drain select gate electrodes. A subset of the electrically conductive layer (146, 246) located underneath the drain select gate electrodes can function as combinations of a control gate and a word line located at the same level. The control gate electrodes within each electrically conductive layer (146, 246) are the control gate electrodes for a vertical memory device including the memory stack structure 55. The source-select-level conductive layer 118 functions as a source select gate electrode.

Each of the memory stack structures 55 comprises a vertical stack of memory elements located at each level of the electrically conductive layers (146, 246). A subset of the electrically conductive layers (146, 246) can comprise word lines for the memory elements. The semiconductor devices in the underlying peripheral device region 700 can comprise word line switch devices configured to control a bias voltage to respective word lines. The memory-level assembly includes all structures located above the topmost surface of the lower-level metal interconnect structures 780, and is located over, and is vertically spaced from, the substrate semiconductor layer 9. The memory-level assembly includes at least one alternating stack (132, 146, 232, 246) and memory stack structures 55 vertically extending through the at least one alternating stack (132, 146, 232, 246). Each of the at least one an alternating stack (132, 146, 232, 246) includes alternating layers of respective insulating layers (132 or 232) and respective electrically conductive layers (146 or 246). The at least one alternating stack (132, 146, 232, 246) comprises staircase regions that include terraces in which each underlying electrically conductive layer (146, 246) extends farther along the first horizontal direction hd1 than any overlying electrically conductive layer (146, 246) in the memory-level assembly.

Referring to FIGS. 18A-18D, an insulating material can be deposited in the backside trenches 79 by a conformal deposition process. Excess portions of the insulating material deposited over the top surface of the first contact level dielectric layer 280 can be removed by a planarization process such as a recess etch or a chemical mechanical planarization (CMP) process. Each remaining portion of the insulating material in the backside trenches 79 constitutes a dielectric wall structure 76. The dielectric wall structures 76 include an insulating material such as silicon oxide, silicon nitride, and/or a dielectric metal oxide. Each dielectric wall structure 76 can vertically extend through first alternating stacks (132, 146) of first insulating layers 132 and first electrically conductive layers 146 and second alternating stacks (232, 246) of second insulating layers 232 and second electrically conductive layers 246, and laterally extends along the first horizontal direction hd1 and are laterally spaced apart among one another along the second horizontal direction hd2.

Figure 19A:
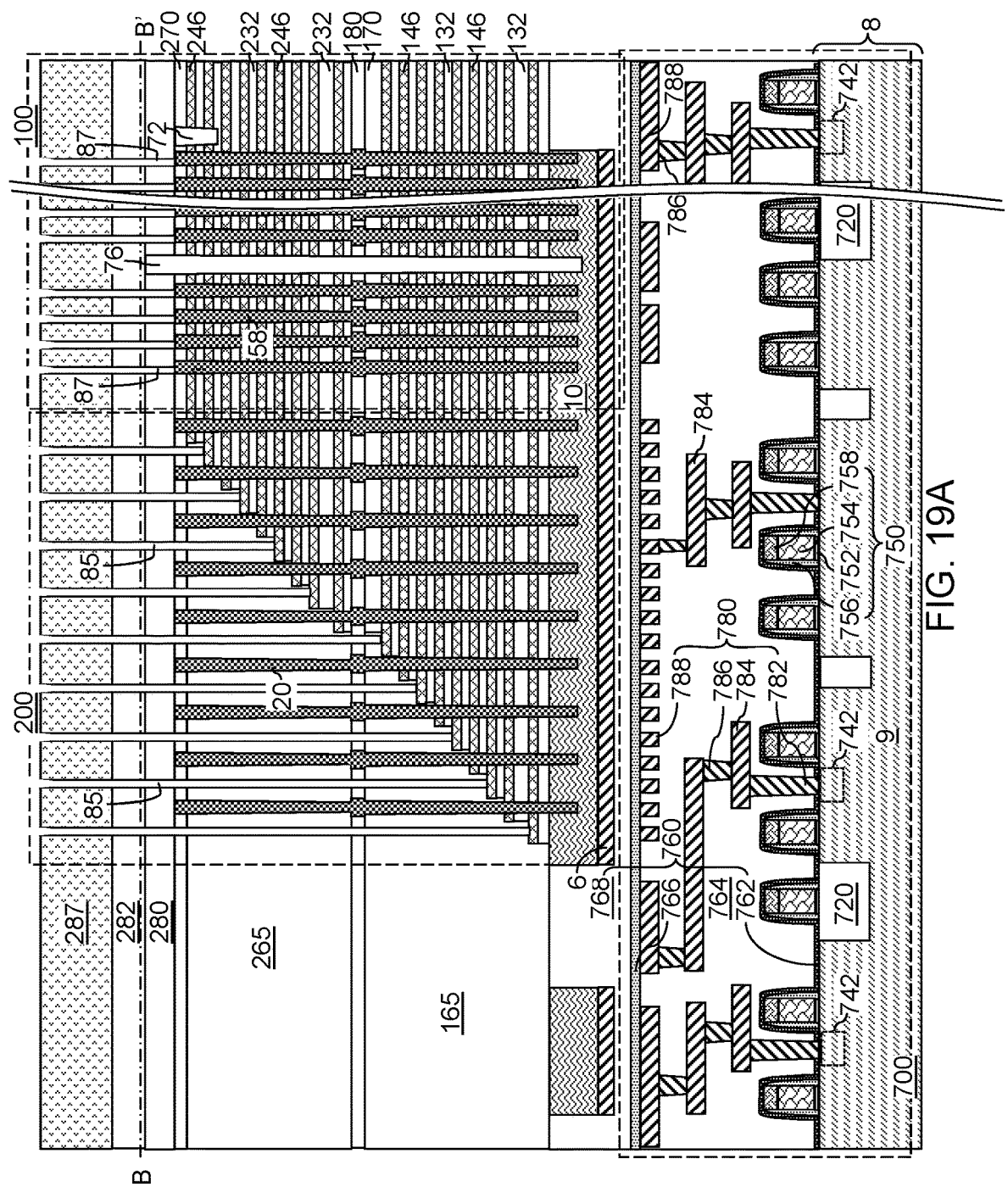
FIG. 19A is a vertical cross-sectional view of the first exemplary structure after formation of drain contact via cavities and staircase-region contact via cavities according to the first embodiment of the present disclosure.
Figure 19B:
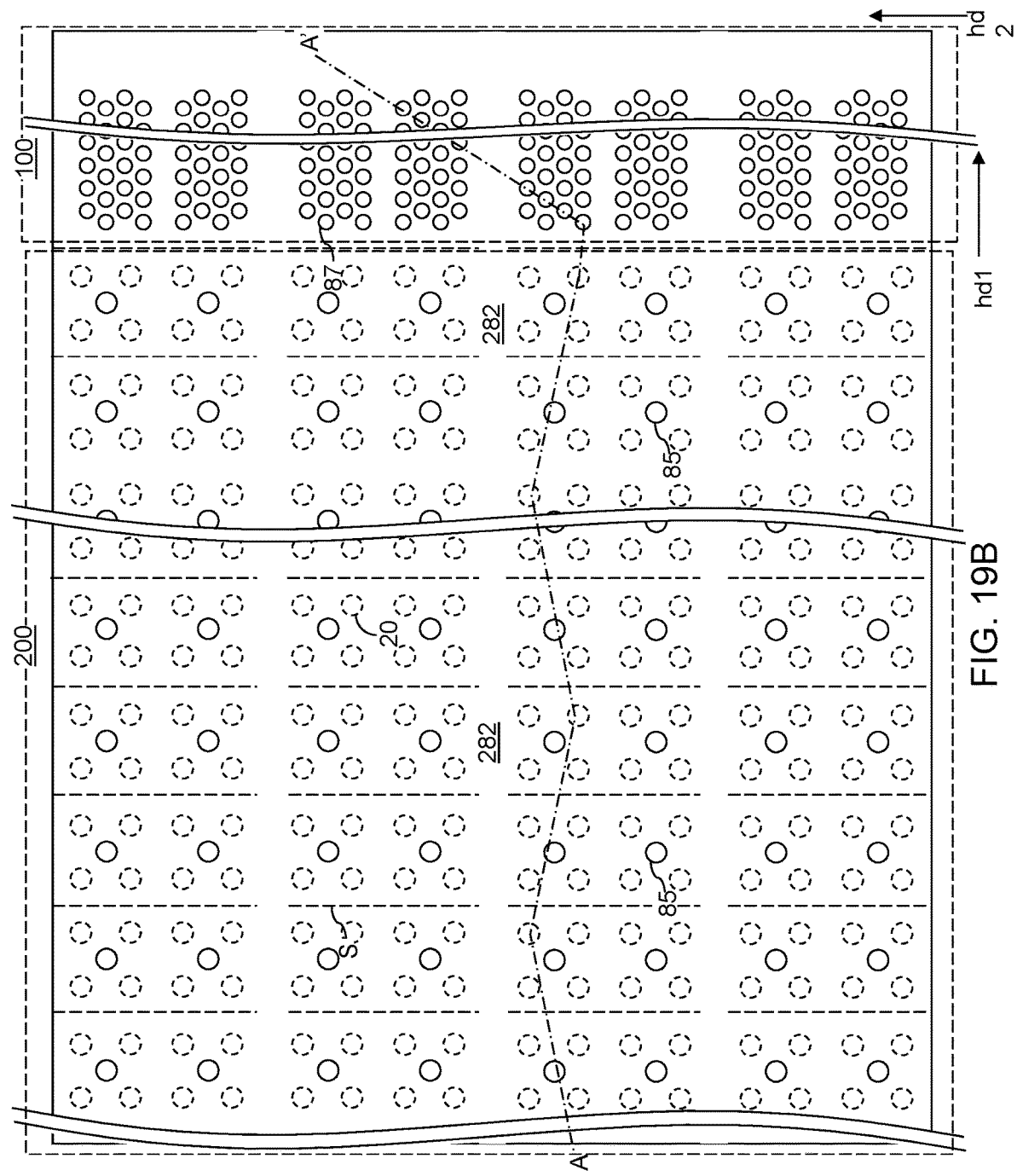
FIG. 19B is a horizontal cross-sectional view of the first exemplary structure of FIG. 19A. The zig-zag vertical plane A-A' corresponds to the plane of the vertical cross-sectional view of FIG. 19A.

Referring to FIGS. 19A and 19B, a second contact level dielectric layer 282 may be formed over the first contact level dielectric layer 280. The second contact level dielectric layer 282 includes a dielectric material such as silicon oxide, and can have a thickness in a range from 100 nm to 600 nm, although lesser and greater thicknesses can also be employed.

A photoresist layer 287 can be applied over the second contact level dielectric layer 282, and can be lithographically patterned to form various contact via openings. For example, openings for forming drain contact via structures can be formed in the memory array region 100, and openings for forming staircase region contact via structures can be formed in the staircase region 200. An anisotropic etch process is performed to transfer the pattern in the photoresist layer through the second and first contact level dielectric layers (282, 280) and underlying dielectric material portions. The drain regions 63 and the electrically conductive layers (146, 246) can be employed as etch stop structures. Drain contact via cavities 87 can be formed over each drain region 63, and staircase-region contact via cavities 85 can be formed over each electrically conductive layer (146. 246) at the stepped surfaces underlying the first and second retro-stepped dielectric material portions (165, 265). The photoresist layer 287 can be subsequently removed, for example, by ashing.

Figure 20B:
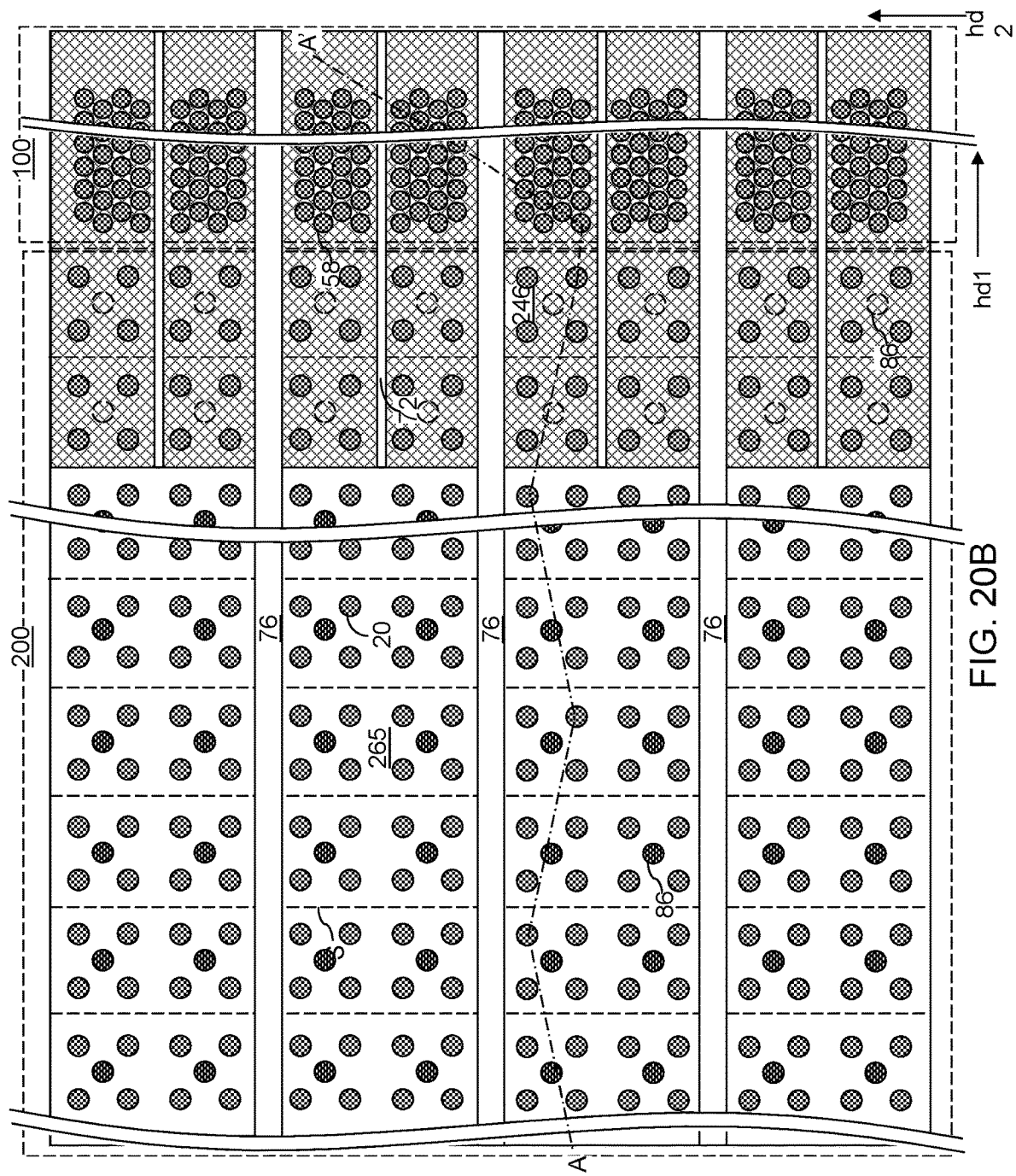
FIG. 20B is a horizontal cross-sectional view of the first exemplary structure of FIG. 20A. The zig-zag vertical plane A-A' corresponds to the plane of the vertical cross-sectional view of FIG. 20A.

Referring to FIGS. 20A and 20B, drain contact via structures 88 are formed in the drain contact via cavities 87 and on a top surface of a respective one of the drain regions 63. Staircase-region contact via structures 86 are formed in the staircase-region contact via cavities 85 and on a top surface of a respective one of the electrically conductive strips (146, 246). The staircase-region contact via structures 86 can include drain select level contact via structures that contact a subset of the second electrically conductive strips 246 that function as drain select level gate electrodes. Further, the staircase-region contact via structures 86 can include word line contact via structures that contact electrically conductive strips (146, 246) that underlie the drain select level gate electrodes and function as word lines for the memory stack structures 55.

Figure 21:
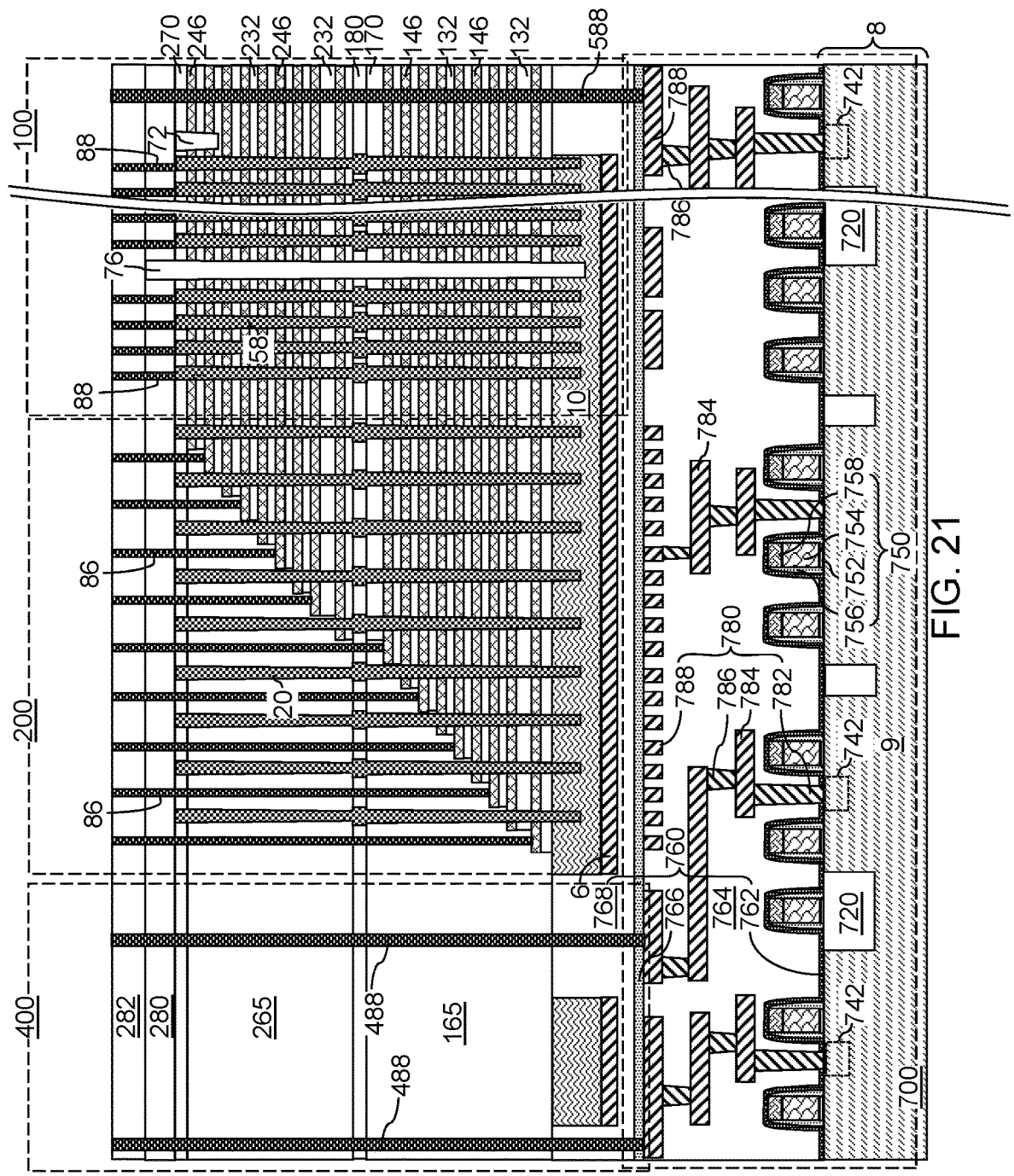
FIG. 21 is a vertical cross-sectional view of the first exemplary structure after formation of through-memory-level contact via structures according to the first embodiment of the present disclosure.

Referring to FIG. 21, peripheral-region via cavities can be formed through the second and first contact level dielectric layers (282, 280), the second and first retro-stepped dielectric material portions (265, 165), and the at least one second dielectric layer 768 to top surfaces of the lower metal interconnect structure 780 in the peripheral region 400. Array-region via cavities can be formed through the alternating stacks (132, 146, 232, 246) to top surfaces of the lower metal interconnect structure 780 in the memory array region 100. At least one conductive material can be deposited in the peripheral-region via cavities and the array-region via cavities to form peripheral-region contact via structures 488 and array-region contact via structures 588.

Figure 22:
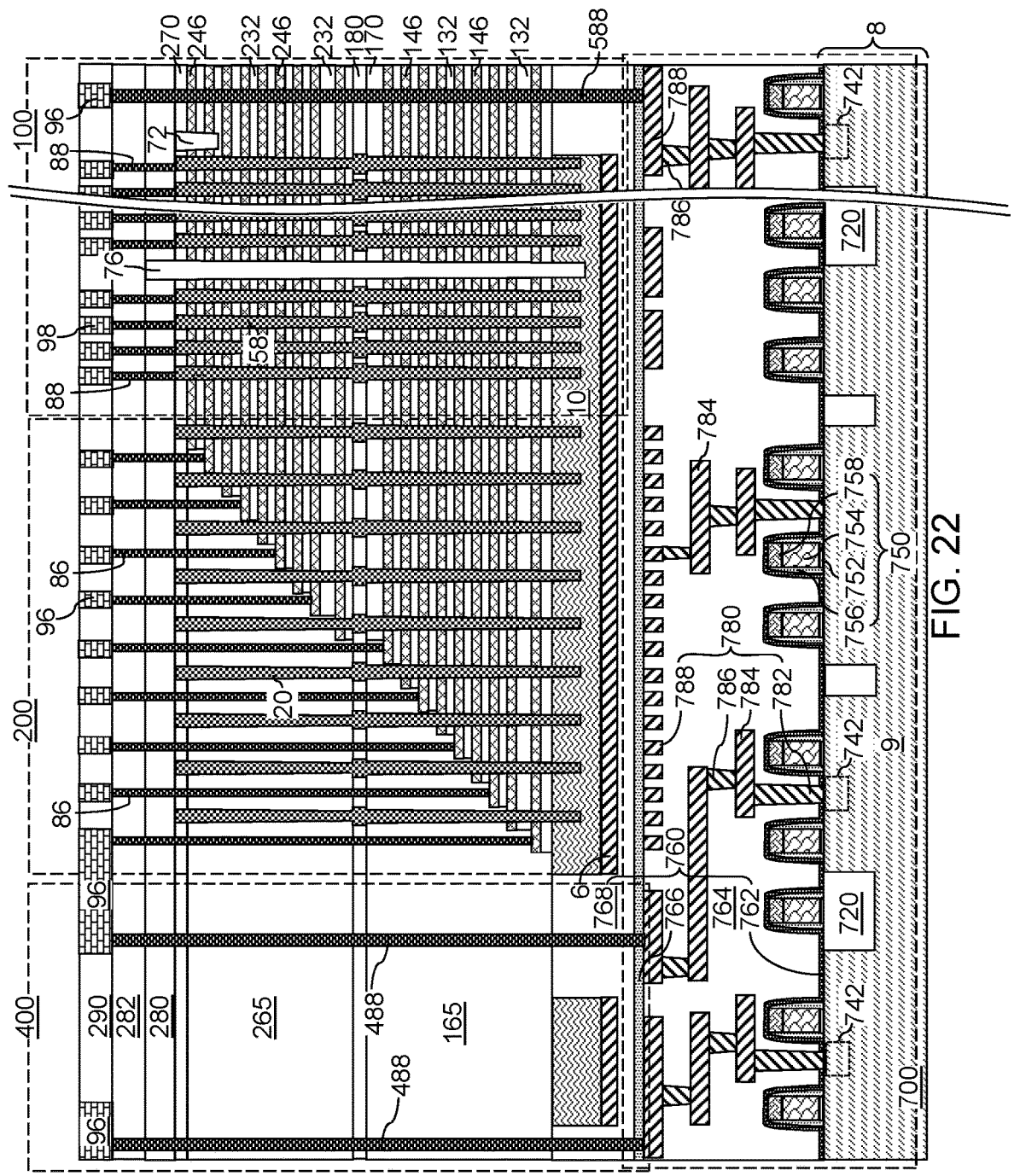
FIG. 22 is a vertical cross-sectional view of the first exemplary structure after formation of upper metal line structures according to the first embodiment of the present disclosure.

Referring to FIG. 22, at least one additional dielectric layer can be formed over the contact level dielectric layers (280, 282), and additional metal interconnect structures (herein referred to as upper-level metal interconnect structures) can be formed in the at least one additional dielectric layer. For example, the at least one additional dielectric layer can include a line-level dielectric layer 290 that is formed over the contact level dielectric layers (280, 282). The upper-level metal interconnect structures can include bit lines 98 contacting, or electrically connected to, a respective one of the drain contact via structures 88, and interconnection line structures 96 contacting, and/or electrically connected to, at least one of the staircase-region contact via structures 86, the peripheral-region contact via structures 488, and/or the array-region contact via structures 588.

FIGS. 23A-23G illustrate sequential vertical cross-sectional views of a region of a second exemplary structure during formation of a source-level material layers 10 according to a second embodiment of the present disclosure. The second exemplary structure is derived from the first exemplary structure at the processing steps of FIG. 14G. FIG.

23A illustrates a region of the second exemplary structure, which is the same as a region of the first exemplary structure illustrated in FIG. 14G.

Figure 23A:
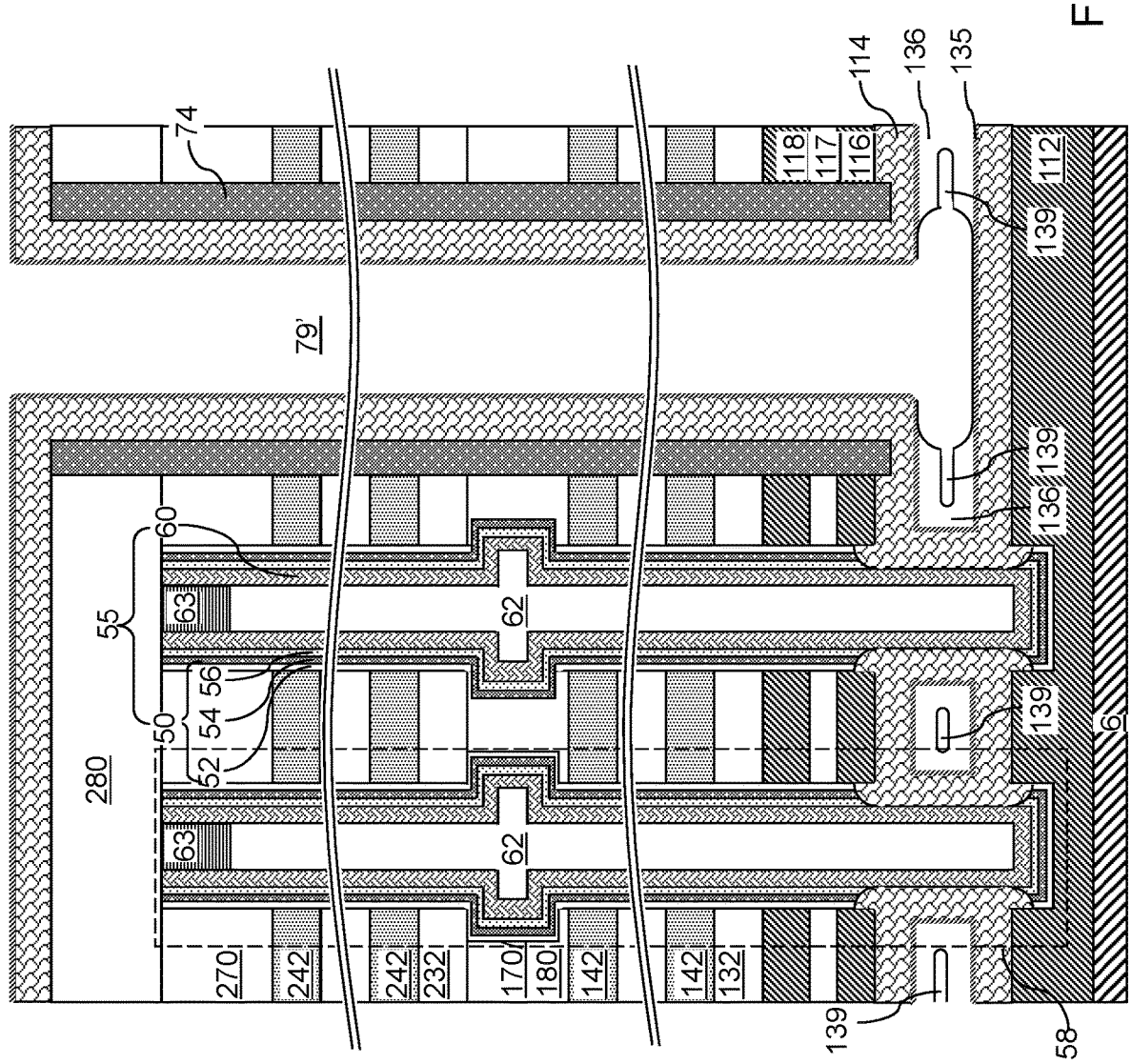
FIGS. 23A-23G illustrate sequential vertical cross-sectional views of a region of a second exemplary structure during formation of a source-level material layers according to a second embodiment of the present disclosure.
Figure 23B:
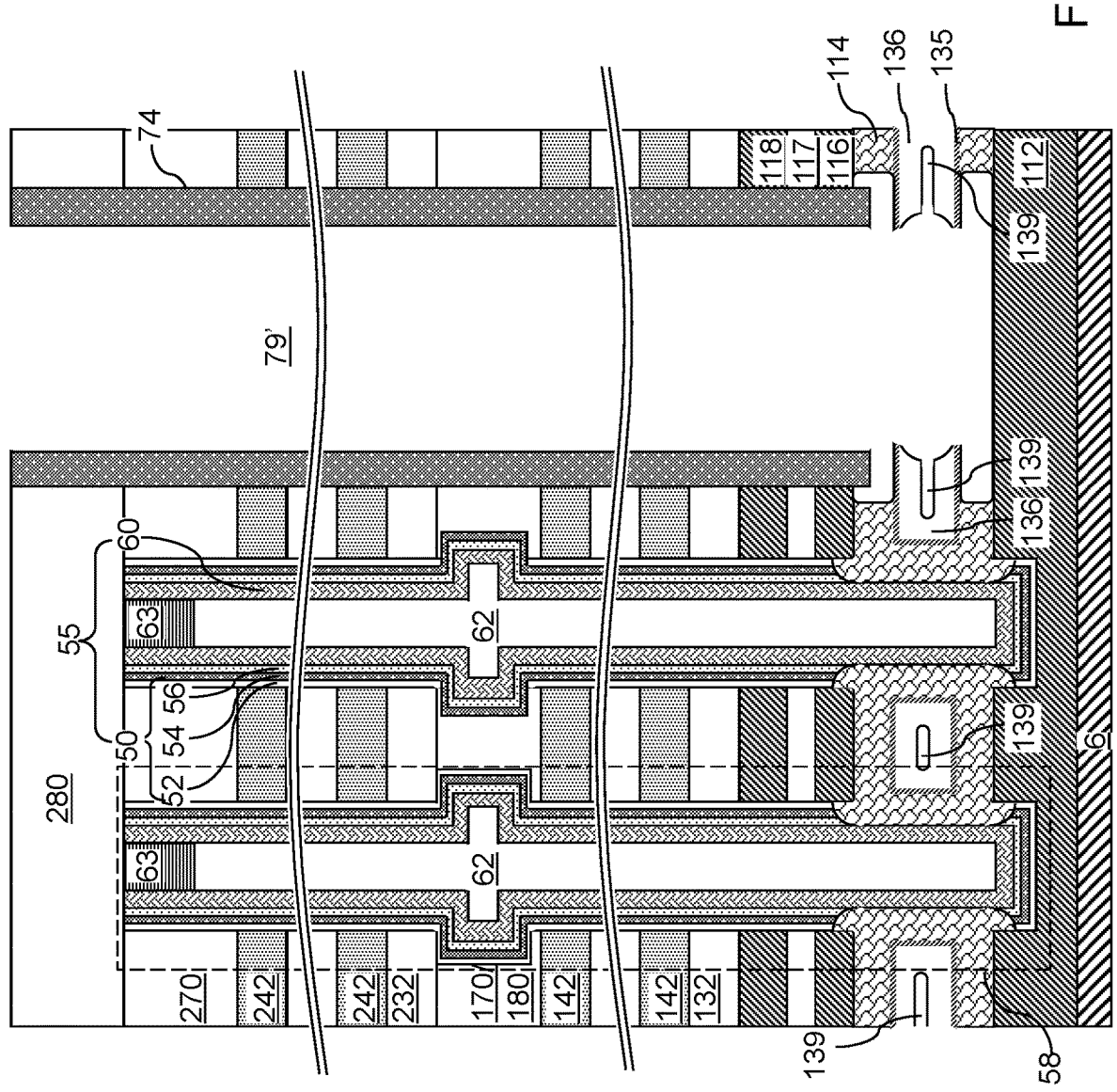

Referring to FIG. 23B, the source contact layer 114 can be laterally recessed by an isotropic etch process that etches the semiconductor material of the source contact layer 114 selective to the dielectric materials of the silicon oxide fill material portions 136 and the silicon nitride liner 135, and selective to the backside trench spacers 74. For example, a wet etch process employing hot trimethyl-2 hydroxyethyl ammonium hydroxide ("hot TMY") or tetramethyl ammonium hydroxide (TMAH) can be employed to laterally recess the source contact layer 114. Alternatively, an isotropic dry etch process employing gas phase hydrochloric acid can be employed to laterally recess the source contact layer 114. The lateral extent of the isotropic etch process can be selected such that the material of the source contact layer 114 is removed from volumes underneath the backside trenches 79.

Figure 23C:
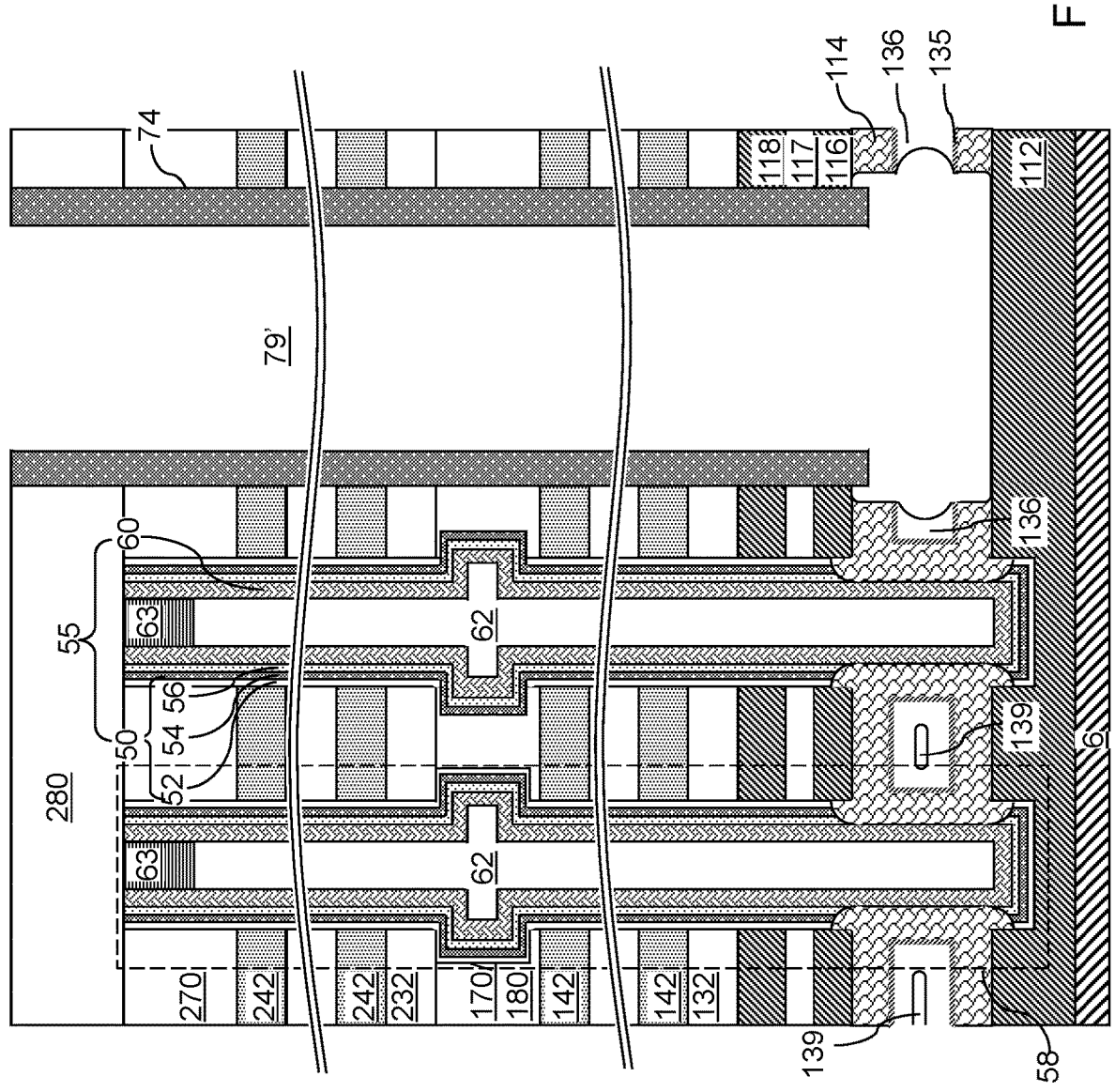

Referring to FIG. 23C, a first isotropic etch process can be performed to remove physically exposed portions of the silicon nitride liner 135. For example, a wet etch process employing hot phosphoric acid may be employed to remove the physically exposed portions of the silicon nitride liner 135. The duration of the first isotropic etch process can be controlled not to remove the entirety of the backside trench spacers 74. A second isotropic etch process can be performed to remove regions of the silicon oxide fill material portions 136 that are proximal to the backside cavities 79'. For example, a wet etch process employing dilute hydrofluoric acid can be performed to remove the regions of the silicon oxide fill material portions 136 that are proximal to the backside cavities 79'. The physically exposed sidewalls of the source contact layer 114, the silicon nitride liner 135, and the silicon oxide fill material portions 136 can be located outside the area of each backside trench 79 (i.e., the area defined by an outer periphery of a backside trench spacer) in a plan view.

Figure 23D:
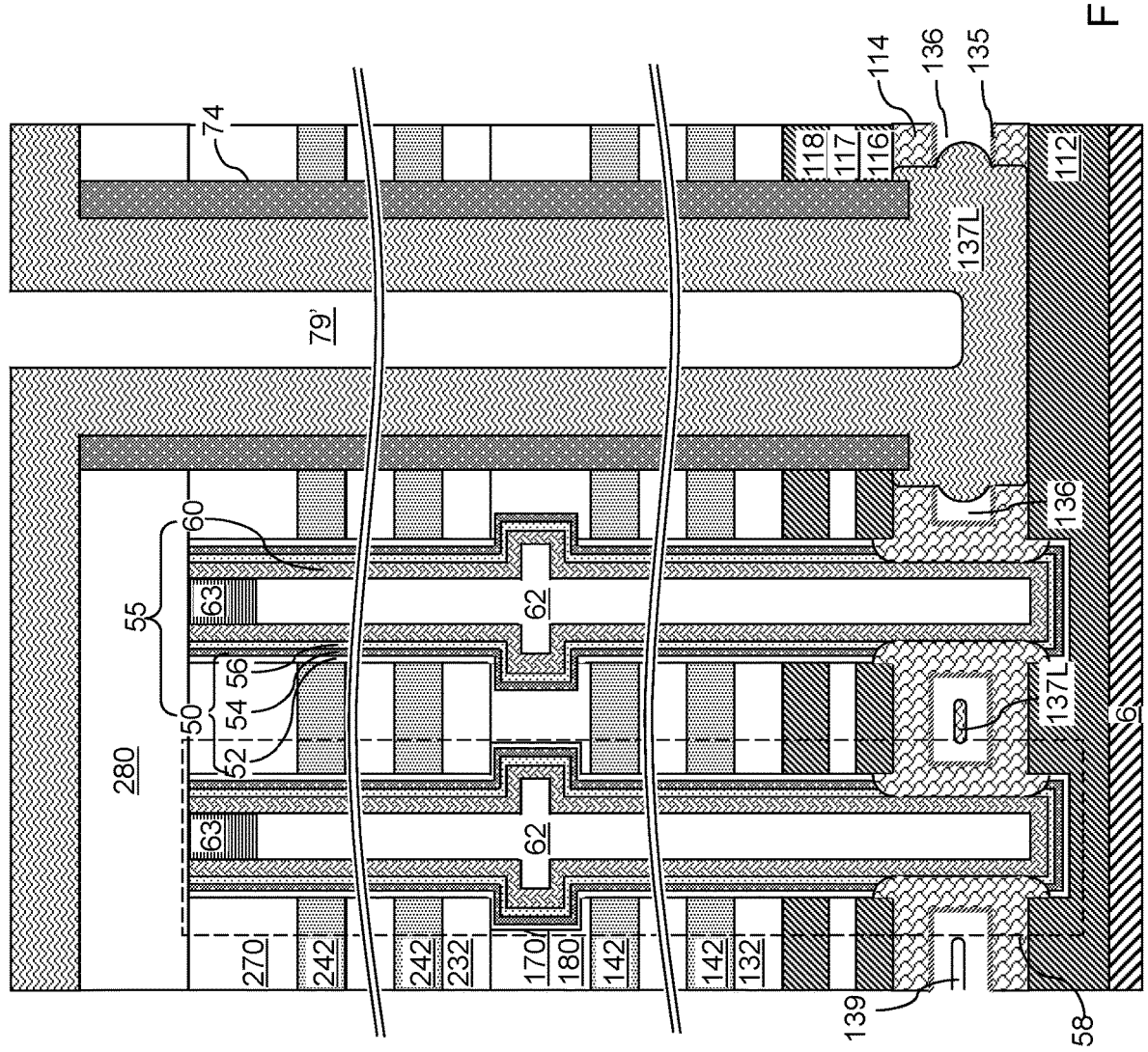

Referring to FIG. 23D, a semiconductor fill material layer 137L can be deposited on the silicon oxide fill material portions 136 and the source contact layer 114 by a conformal deposition process. The semiconductor fill material layer 137L can include a doped semiconductor material or an undoped semiconductor material. For example, the semiconductor fill material layer 137L can include amorphous silicon, polysilicon, or a silicon-germanium alloy. The conformal deposition process that deposits the semiconductor fill material layer 137L can comprise, for example, low pressure chemical vapor deposition process. In one embodiment, an amorphous semiconductor material can be employed for the semiconductor fill material layer 137L to provide high conformity to the semiconductor fill material layer 137L. The thickness of the semiconductor fill material layer 137L can be selected such that a backside cavity 79' remains within each backside trench 79.

Figure 23E:
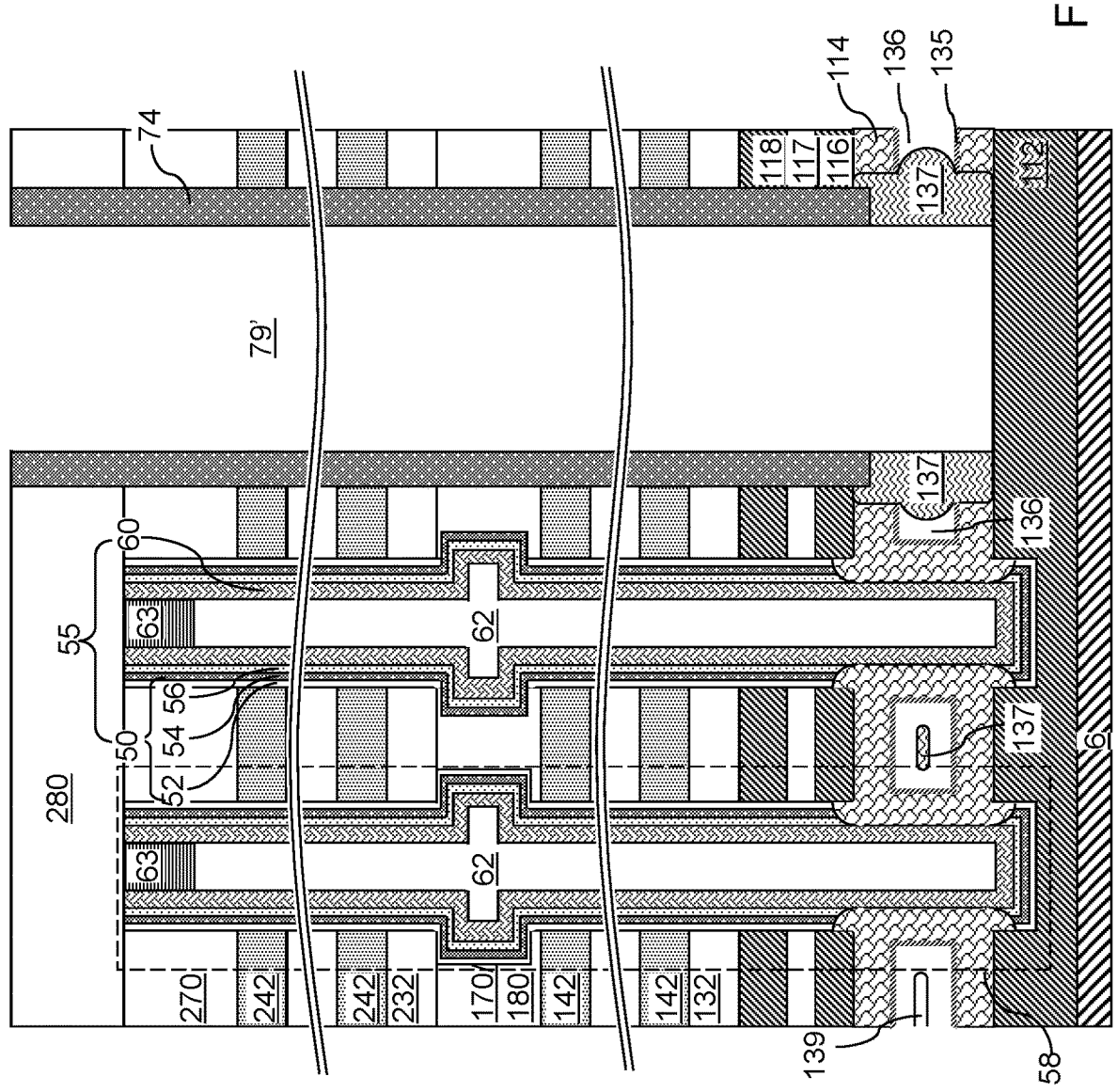

Referring to FIG. 23E, an anisotropic etch process can be performed to etch portions of the semiconductor fill material layer 137L that overlie the first contact level dielectric layer 280 or located inside of the backside trenches 79. The anisotropic etch process can have an etch chemistry that etches semiconductor materials selective to dielectric materials (such as silicon oxide and silicon nitride). Portions of the semiconductor fill material layer 137L that are not masked by the backside trench spacers 74 or the first contact level dielectric layer 280 can be removed by the anisotropic etch process. The remaining portions of the semiconductor fill material layer 137L constitute semiconductor fill material portions 137. In one embodiment, the semiconductor fill material portions 137 can include vertical sidewalls that are vertically coincident with inner sidewalls of the backside trench spacers 74. The semiconductor fill material portions 137 also function as a cap in this second embodiment, as described above with respect to FIG. 17B of the first embodiment.

In one embodiment, only a subset of voids 139 in the silicon oxide fill material portions 136 can be filled with the semiconductor fill material portions 137, and some voids 139 may remain as voids 139. In another embodiment, all voids 139 in the silicon oxide fill material portions 136 can be filled with the semiconductor fill material portions 137. In one embodiment, a semiconductor fill material portion 137 can laterally surround a lower portion of a backside cavity 79'. The anisotropic etch process can terminate before etching through the lower source-level material layer 112. An inner sidewall of each backside trench spacer 74 can be physically exposed after the anisotropic etch process.

Figure 23F:
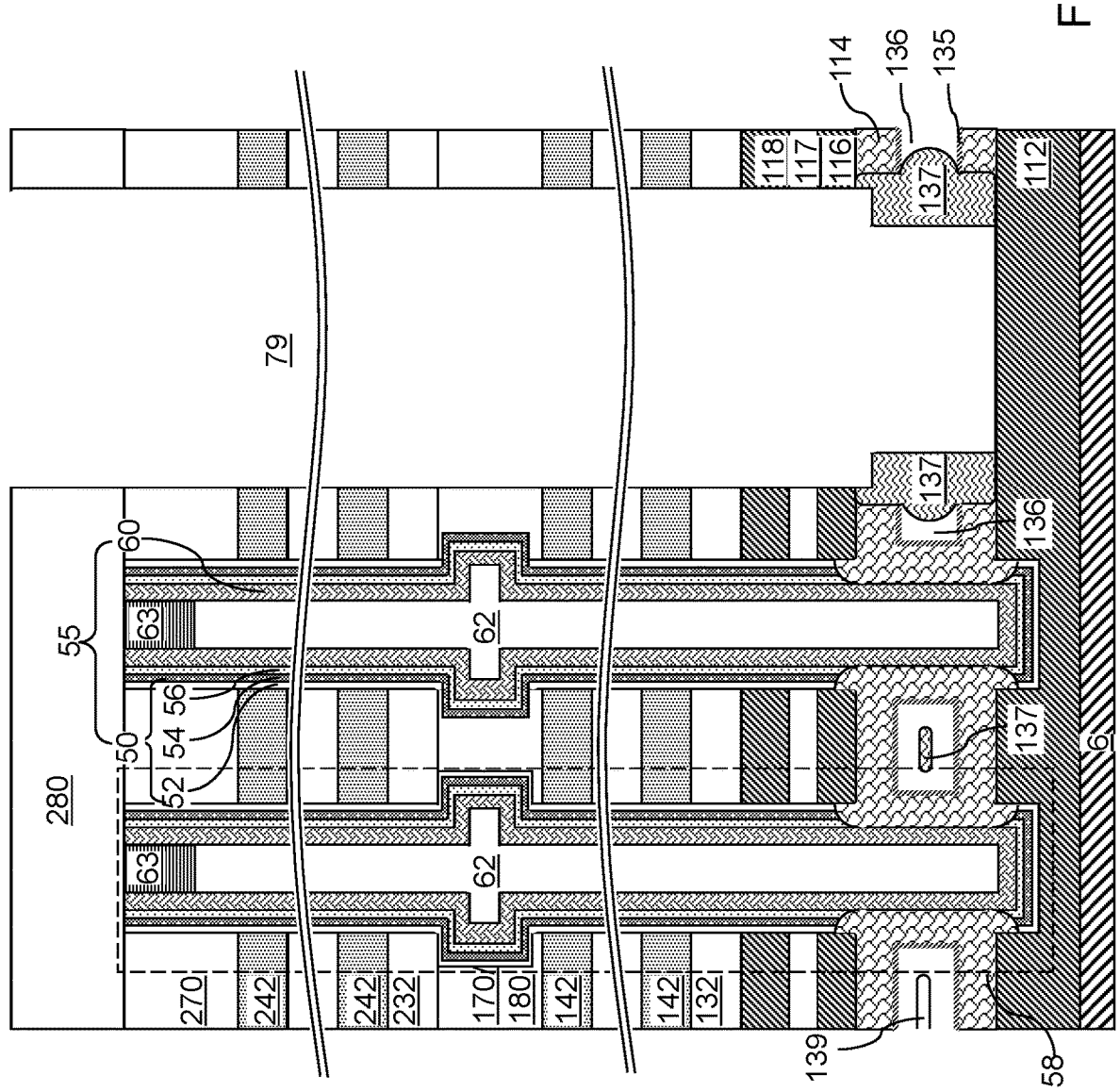

Referring to FIG. 23F, the backside trench spacers 74 can be removed selective to the semiconductor materials of the source contact layer 114 and the semiconductor fill material portions 137, and selective to the first and second insulating layers (132, 232), the first and second insulating cap layers (170, 270), the inter-tier dielectric layer 180, and the first contact level dielectric layer 280. For example, if the backside trench spacers 74 include silicon nitride, a wet etch process employing hot phosphoric acid can be employed to remove the backside trench spacers 74. Sidewalls of the first and second alternating stacks (132, 142, 232, 242), the upper source-level material layer 116, the source-level insulating layer 117, and the optional source-select-level conductive layer 118 can be physically exposed after removal of the backside trench spacers 74.

Figure 23G:
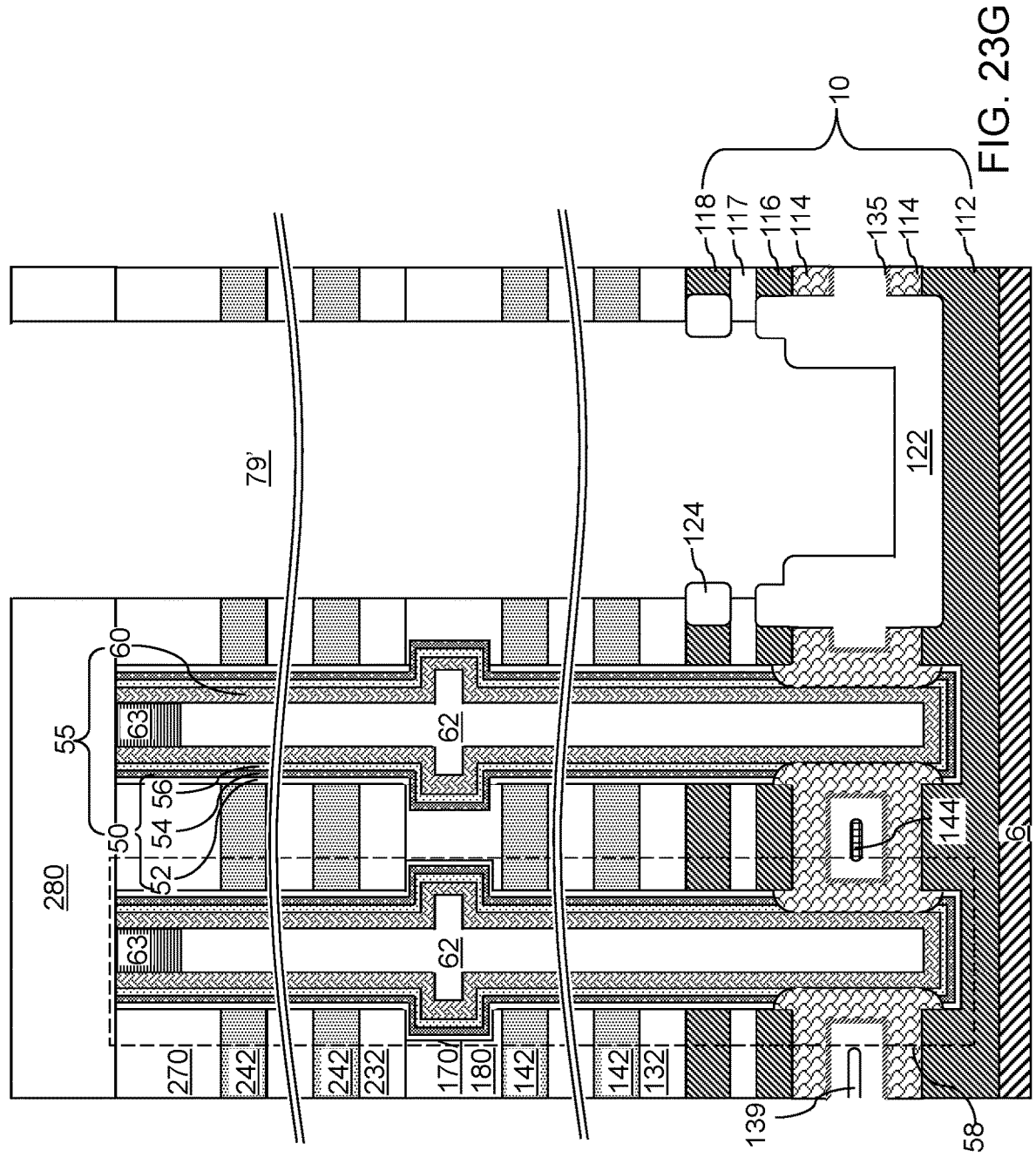

Referring to FIG. 23G, a thermal oxidation process can be performed to convert physically exposed surface portions of various semiconductor materials into semiconductor oxide portions. Specifically, physically exposed surface portions of the semiconductor fill material portions 137, the lower source-level material layer 112, the upper source-level material layer 116, and the source-select-level conductive layer 118 (if present) are converted into thermal semiconductor oxide material portions. Portions of the source contact layer 114 that are proximal to the backside trenches 79 can be converted into thermal silicon oxide material portions. In one embodiment, the thermal semiconductor oxide material portions derived therefrom can be free of carbon or hydrogen.

The thermal oxidation process forms a continuous semiconductor oxide structure 122 at the bottom of each backside trench 79. The semiconductor oxide structure 122 includes various thermal semiconductor oxide material portions formed by thermal conversion of surface portions of the semiconductor fill material portions 137, the lower source-level material layer 112, the source contact layer 114, and the upper source-level material layer 116. A contiguous set of thermal semiconductor oxide material portions derived from the lower source-level material layer 112, the source contact layer 114, the upper source-level material layer 116, and the semiconductor fill material portions 137 merge with the silicon oxide fill material portions 136 around the bottom of each backside trench 79 to provide a semiconductor oxide structure 122. The semiconductor oxide structure 122 is a continuous structure that extends around a bottom region of a backside trench 79 and extends laterally outward to encircle bottom portions of a set of memory stack structures 55. Each semiconductor oxide structure 122 comprises a continuous thermal semiconductor oxide material portion located at a bottom periphery of a backside trench 79 and formed on a respective silicon oxide fill material portion 136 (which is incorporated into the semiconductor oxide structure 122). An annular semiconductor oxide material portion 124 can be formed around each backside trench 79 by thermal oxidation of physically exposed surface portions of the source-select-level conductive layer 118. In one embodiment, the annular semiconductor oxide material portion 124 can be topologically homeomorphic to a torus. Any remaining segment of the semiconductor fill material portions 137 can be converted into a polycrystalline semiconductor fill material portion 144.

The layer stack including the lower source-level material layer 112, the source contact layer 114, and the upper source-level material layer 116 constitutes a buried source layer (112, 114, 116), which functions as a common source region that is connected each of the vertical semiconductor channels 60 and has a doping of the second conductivity type. The average dopant concentration in the buried source layer (112, 114, 116) can be in a range from $5.0 \times 10^{19}/cm^3$ to $2.0 \times 10^{21}/cm^3$, although lesser and greater dopant concentrations can also be employed. The set of layers including the buried source layer (112, 114, 116), the source-level insulating layer 117, and the optional source-select-level conductive layer 118 constitutes source-level material layers 10, which replaces the in-process source-level material layers 10'.

Referring to FIG. 24, the processing steps of FIGS. 16, 17A, and 18A-18D can be subsequently performed to replace the sacrificial material layers (142, 242) with electrically conductive layers (146, 246) and to form a dielectric wall structure 76 within each backside trench 79. Subsequently, the processing steps of FIGS. 19A and 19B, 20A and 20B, 21, and 22 can be performed to complete the second exemplary structure.

Figure 18A:
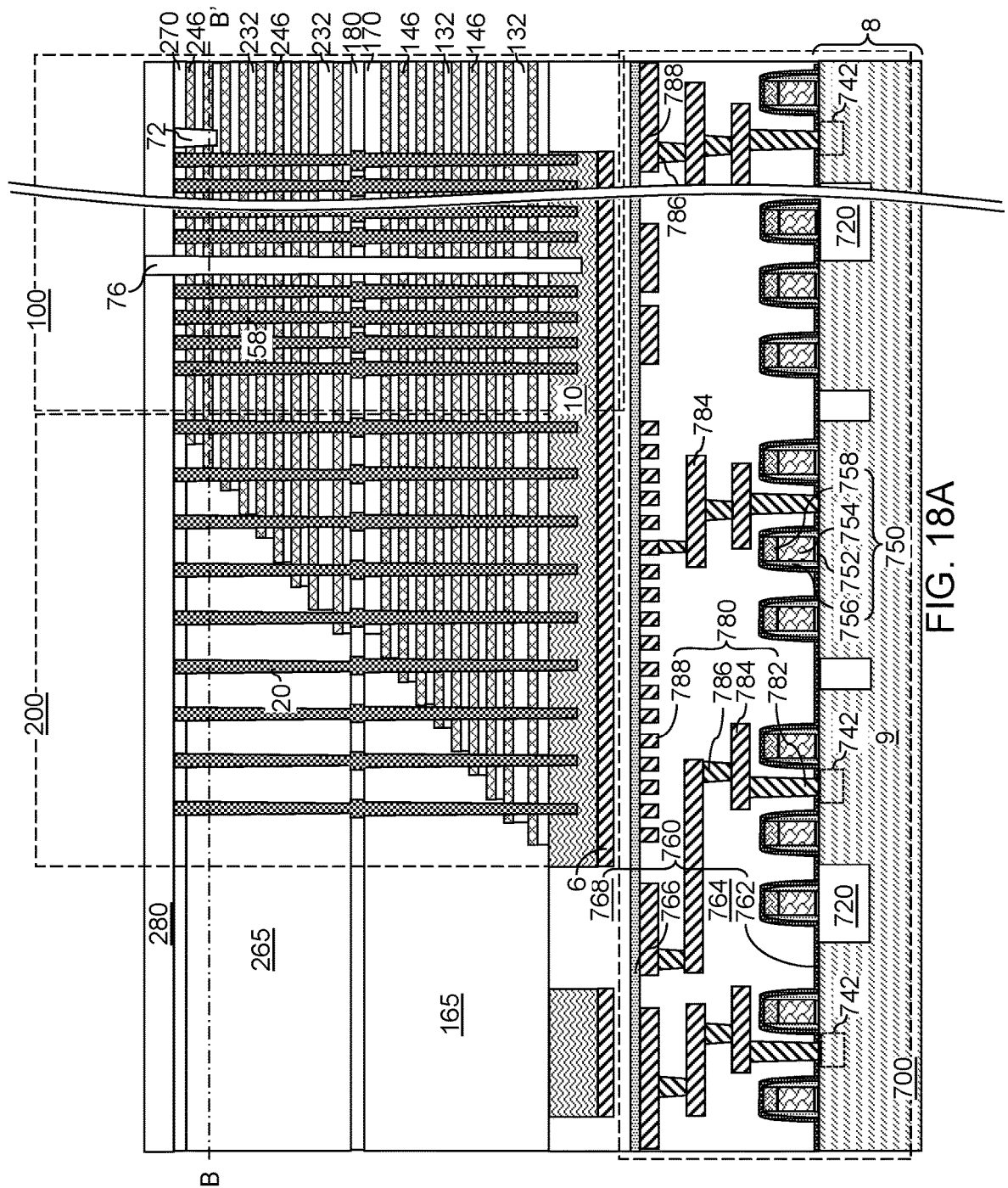
FIG. 18A is a vertical cross-sectional view of the first exemplary structure after formation of dielectric wall structures in the backside trenches according to the first embodiment of the present disclosure.
Figure 18B:
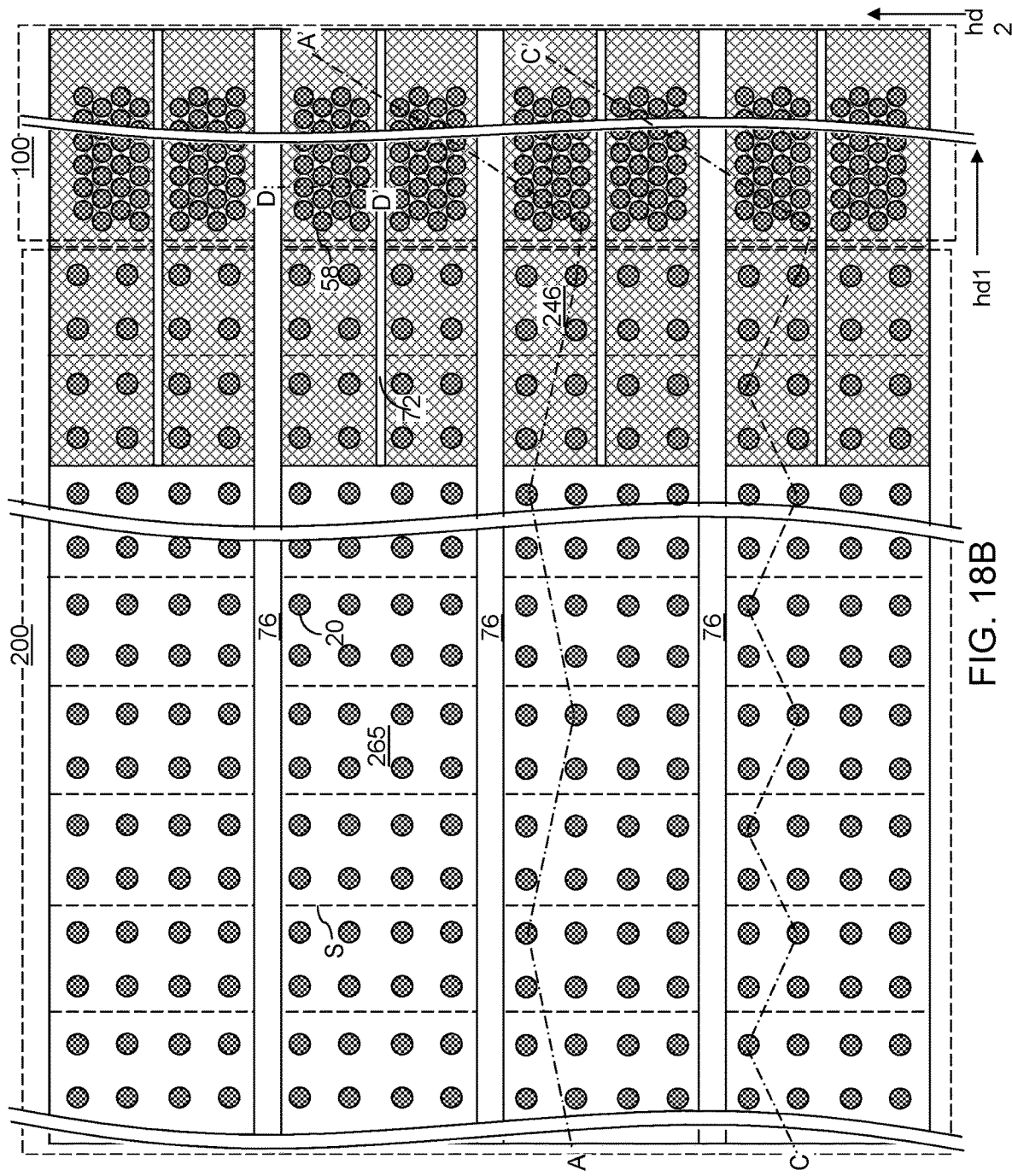
FIG. 18B is a horizontal cross-sectional of the first exemplary structure along the vertical plane B-B' of FIG. 18A. The zig-zag vertical plane A-A' corresponds to the plane of the vertical cross-sectional view of FIG. 18A.
Figure 18C:
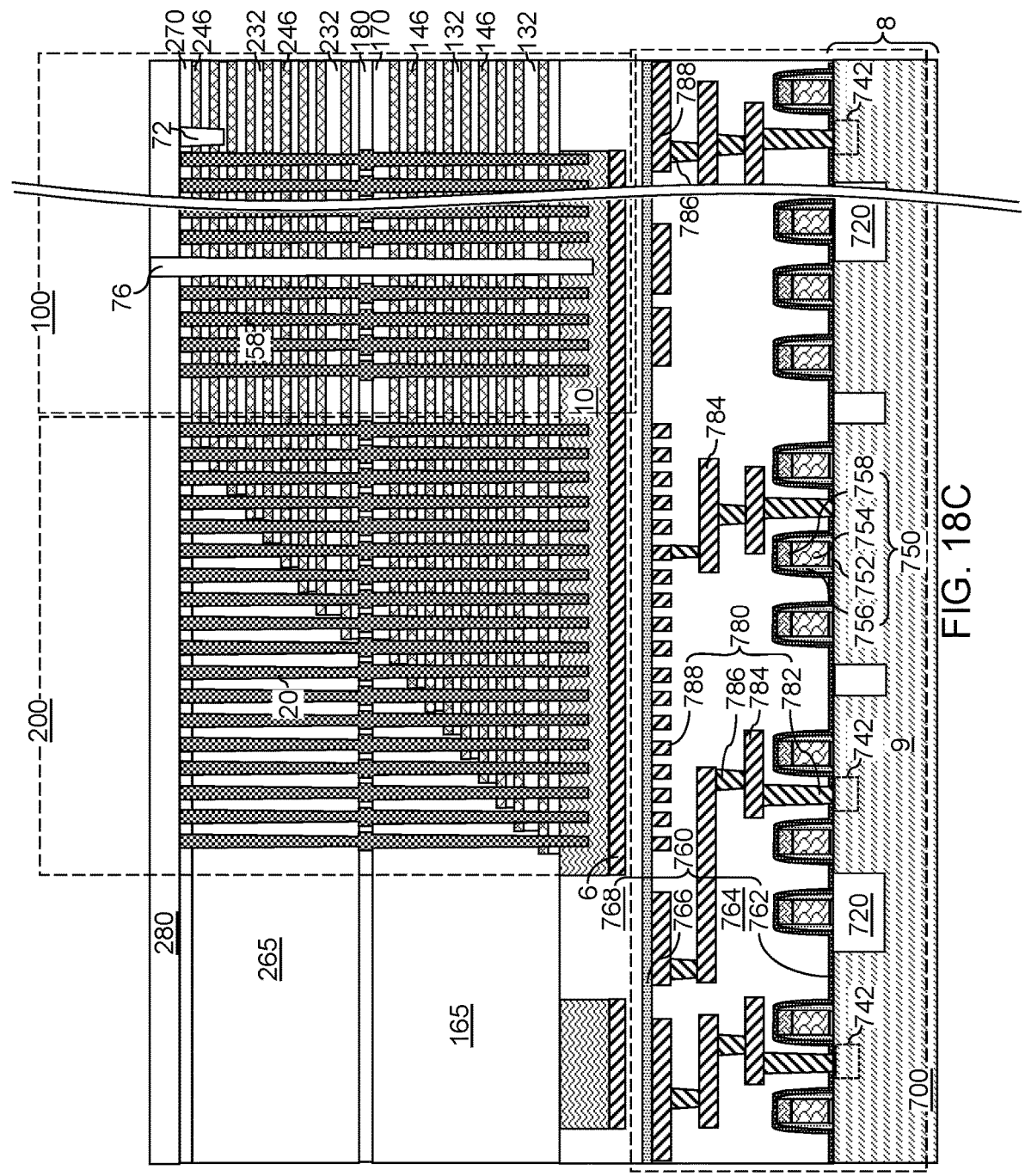
FIG. 18C is a vertical cross-sectional view of the first exemplary structure along the zig-zag vertical plane C-C' of FIG. 18B.
Figure 18D:
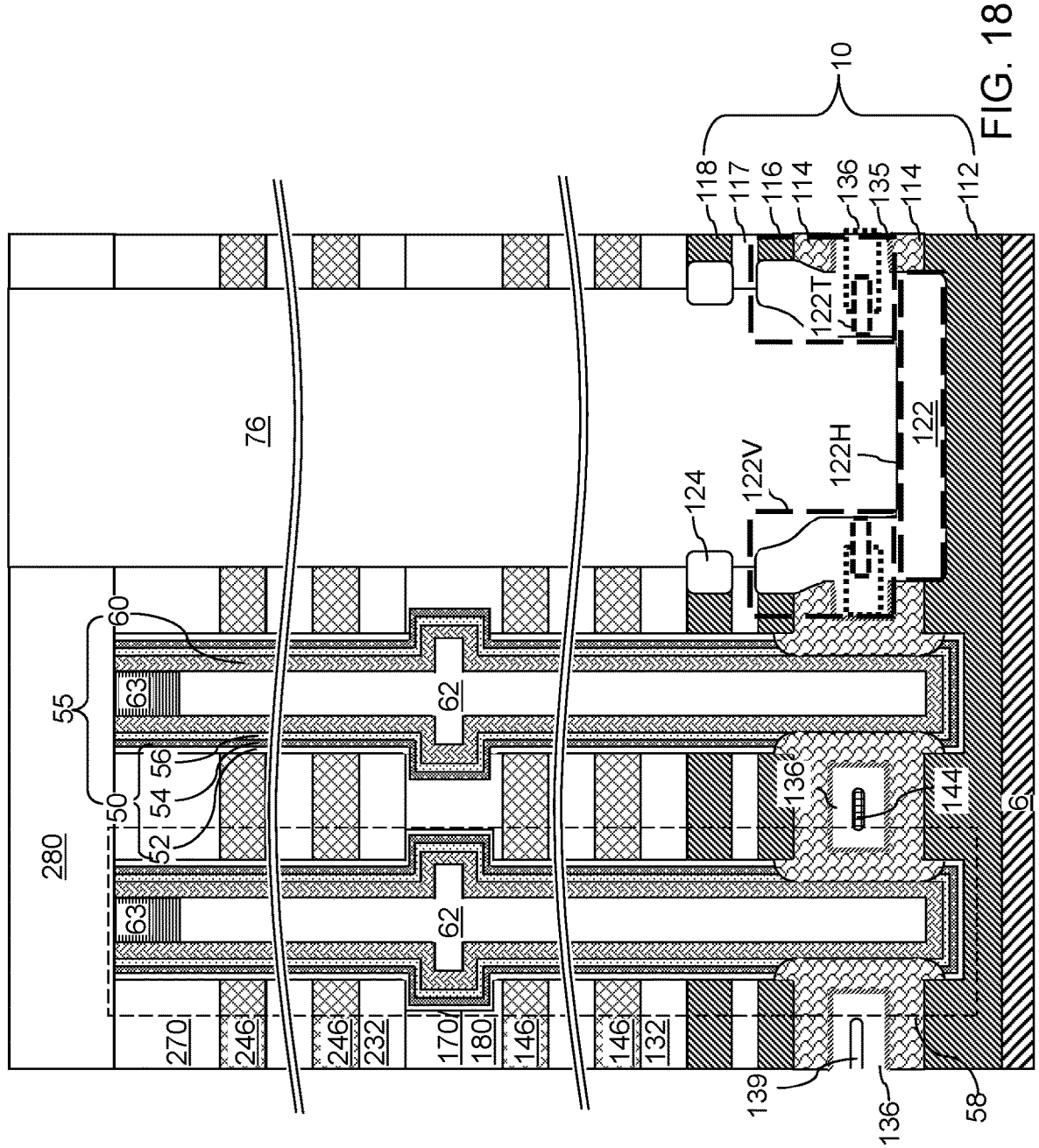
FIG. 18D is a vertical cross-sectional view of a region of the first exemplary structure along the vertical plane D-D' of FIG. 18B.

As shown in FIGS. 18D and 24, each of the first and second exemplary structures can include a three-dimensional memory device. The three-dimensional memory device can comprise: source-level material layers 10 located over a substrate (8 and/or 768) and comprising a source contact layer 114 including a doped semiconductor material; an alternating stack of insulating layers (132, 232) and electrically conductive layers (146, 246) located over the source-level material layers 10; and a memory stack structure 55 extending through the alternating stack (132, 146, 232, 246) and comprising a memory film 50 and a vertical semiconductor channel 60. A sidewall of the vertical semiconductor channel 60 contacts a respective surface of the source contact layer 114. The source contact layer 114 includes at least one cavity 109' that is filled at least partly with an insulating core (135, 136).

In one embodiment, the insulating core (135, 136) comprises a silicon nitride liner 135 that contacts an inner surface of the source contact layer 114 and a portion 136 of the semiconductor oxide (e.g., silicon oxide) structure 122.

In one embodiment, the source-level material layers 10 comprise a lower source-level material layer 112 including an additional doped semiconductor material, having a same type of doping as the source contact layer 114, and contacting a bottom surface of the source contact layer 114. In one embodiment, the semiconductor oxide structure 122 contacts a horizontal surface of the lower source-level material layer 112 and sidewalls of the source contact layer 114.

In one embodiment, the three-dimensional memory device comprises a dielectric wall structure 76 laterally extending along a first horizontal direction hd1 and vertically extending through each layer within the alternating stack (132, 146, 232, 246) and contacting the semiconductor oxide structure 122.

In one embodiment, the semiconductor oxide structure 122 comprises a horizontal semiconductor oxide portion 122H underlying a bottom surface of the dielectric wall structure 76 and consisting essentially of thermal semiconductor oxide and contacting a top surface of the lower source-level material layer 112; and a pair of vertical semiconductor oxide portions 122V vertically protruding upward from edges of the horizontal semiconductor oxide portion, contacting bottom portions of lengthwise sidewalls of the dielectric wall structure 76, and comprising a thermal semiconductor oxide material portion 122T and a semiconductor oxide portion 136 including at least 10 parts per million of hydrogen atoms and at least 3 parts per million of carbon atoms (e.g., comprising the silicon oxide fill material portions 136).

In one embodiment, a laterally extending silicon oxide fill material portion 136 (e.g., comprising the silicon oxide fill material portions 136) of the semiconductor oxide structure 122 laterally encircles a bottom portion of each memory stack structure 55. In one embodiment, the pair of vertical semiconductor oxide portions 122V has a greater lateral thickness than the horizontal semiconductor oxide portion 122H due to incorporation of the silicon oxide fill material portions 136 during formation of the semiconductor oxide structure 122. In one embodiment, the source-level material layers 10 comprise an upper source-level material layer 116, wherein the pair of vertical semiconductor oxide portions 122V has a lesser lateral thickness on a sidewall of the upper source-level material layer 116 than on a sidewall of the source contact layer 114.

In one embodiment, one of the at least one cavity 109' is filled with a polycrystalline semiconductor fill material portion 144 that is embedded within the semiconductor oxide structure 122. In one embodiment, the vertical semiconductor channel 60 extends below a horizontal plane including an interface between the source contact layer 114 and the lower source-level material layer 112. The vertical semiconductor channel 60 contacts a dielectric material stack (i.e., a remaining portion of a memory film 50 formed by the isotropic etch process of FIG. 14C) embedded within a combination of the vertical semiconductor channel 60, the lower source-level material layer 112, and the source contact layer 114, and comprising a same dielectric material stack as the memory film 50.

In one embodiment, the silicon nitride liner 135 comprises a cylindrical portion that encircles the memory stack structure 55 and is laterally spaced from an outer cylindrical sidewall of the vertical semiconductor channel 60 by a uniform lateral distance, which is the lateral thickness of a cylindrical portion of the source contact layer 114.

In one embodiment, the semiconductor oxide structure 122 directly contacts the source contact layer 114 above a first horizontal plane including a top surface of the silicon nitride liner 135 and below a second horizontal plane including a bottom surface of the silicon nitride liner 135, and is laterally spaced from the source contact layer 114 by the silicon nitride liner 135 between the first horizontal plane and the second horizontal plane.

In one embodiment, one of the at least one cavity 109' can comprise a void 139 that is free of a solid state material and is filled with vacuum or a gas phase material.

In one embodiment, the three-dimensional memory device comprises a monolithic three-dimensional NAND memory device; the electrically conductive layers (146, 246)

comprise, or are electrically connected to, a respective word line of the monolithic three-dimensional NAND memory device; the substrate 8 comprises a silicon substrate; the monolithic three-dimensional NAND memory device comprises an array of monolithic three-dimensional NAND strings over the silicon substrate; and at least one memory cell in a first device level of the array of monolithic three-dimensional NAND strings is located over another memory cell in a second device level of the array of monolithic three-dimensional NAND strings. The silicon substrate contains an integrated circuit comprising a driver circuit for the memory device located thereon; the electrically conductive layers (146, 246) comprise a plurality of control gate electrodes having a strip shape extending substantially parallel to the top surface of the substrate 8; and the array of monolithic three-dimensional NAND strings comprises the vertical semiconductor channels 60 and a plurality of charge storage elements (comprise portions of the charge storage layers 54 that are located at levels of the electrically conductive layers (146, 246)), each charge storage element located adjacent to a respective one of the vertical semiconductor channels 60.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of or the word" consists of replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
    source-level material layers located over a substrate and comprising a source contact layer including a doped semiconductor material;
    an alternating stack of insulating layers and electrically conductive layers located over the source-level material layers; and
    a memory stack structure extending through the alternating stack and comprising a memory film and a vertical semiconductor channel,
    wherein:
    a sidewall of the vertical semiconductor channel contacts a respective surface of the source contact layer;
    the source contact layer includes at least one cavity that is filled at least partly with an insulating core;
    the insulating core comprises a silicon nitride liner that contacts an inner surface of the source contact layer and a portion of a semiconductor oxide structure;
    the source-level material layers comprise a lower source-level material layer including an additional doped semiconductor material, having a same type of doping as the source contact layer, and contacting a bottom surface of the source contact layer;
    the semiconductor oxide structure comprises a silicon oxide structure; and
    the semiconductor oxide structure contacts a horizontal surface of the lower source-level material layer and sidewalls of the source contact layer.

2. The three-dimensional memory device of claim 1, further comprising a dielectric wall structure laterally extending along a first horizontal direction and vertically extending through each layer within the alternating stack and contacting the semiconductor oxide structure.

3. The three-dimensional memory device of claim 2, wherein the semiconductor oxide structure comprises:
    a horizontal semiconductor oxide portion underlying a bottom surface of the dielectric wall structure and consisting essentially of thermal semiconductor oxide; and
    a pair of vertical semiconductor oxide portions vertically protruding upward from edges of the horizontal semiconductor oxide portion, contacting bottom portions of lengthwise sidewalls of the dielectric wall structure, and comprising a thermal semiconductor oxide material portion and a semiconductor oxide portion including at least 10 parts per million of hydrogen atoms and at least 3 parts per million of carbon atoms.

4. The three-dimensional memory device of claim 3, wherein a laterally extending silicon oxide fill material portion of the semiconductor oxide structure laterally encircles a bottom portion of the memory stack structure.

5. The three-dimensional memory device of claim 3, wherein:
    the pair of vertical semiconductor oxide portions have a greater lateral thickness than the horizontal semiconductor oxide portion; and
    the source-level material layers comprise an upper source-level material layer, wherein the pair of vertical semiconductor oxide portions has a lesser lateral thickness on a sidewall of the upper source-level material layer than on a sidewall of the source contact layer.

6. The three-dimensional memory device of claim 1, wherein a portion of the cavity is filled with a polycrystalline semiconductor fill material portion that is embedded within the semiconductor oxide structure.

7. The three-dimensional memory device of claim 1, wherein:
    the vertical semiconductor channel extends below a horizontal plane including an interface between the source contact layer and the lower source-level material layer;
    the vertical semiconductor channel contacts a dielectric material stack; and
    the dielectric material stack is embedded within a combination of the vertical semiconductor channel, the lower source-level material layer, and the source contact layer, and comprises a same dielectric material stack as the memory film.

8. The three-dimensional memory device of claim 1, wherein the silicon nitride liner comprises a cylindrical portion that encircles the memory stack structure and is laterally spaced from an outer cylindrical sidewall of the vertical semiconductor channel by a uniform lateral distance.

9. The three-dimensional memory device of claim 1, wherein the semiconductor oxide structure directly contacts the source contact layer above a first horizontal plane including a top surface of the silicon nitride liner and below a second horizontal plane including a bottom surface of the silicon nitride liner, and is laterally spaced from the source contact layer by the silicon nitride liner between the first horizontal plane and the second horizontal plane.

10. The three-dimensional memory device of claim 1, wherein the at least one cavity comprises a void that is free of a solid state material and is filled with vacuum or a gas phase material.

\* \* \* \* \*